US011837459B2

(12) United States Patent
Yeh et al.

(10) Patent No.: US 11,837,459 B2
(45) Date of Patent: Dec. 5, 2023

(54) METHOD AND STRUCTURE FOR DIODES WITH BACKSIDE CONTACTS

(71) Applicant: Taiwan Semiconductor Manufacturing Company, Ltd., Hsinchu (TW)

(72) Inventors: Chih Chieh Yeh, Taipei (TW); Ming-Shuan Li, Hsinchu County (TW); Chih-Hung Wang, Hsinchu (TW); Zi-Ang Su, Taoyuan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/462,799

(22) Filed: Aug. 31, 2021

(65) Prior Publication Data
US 2023/0069501 A1 Mar. 2, 2023

(51) Int. Cl.
*H01L 29/66* (2006.01)
*H01L 29/861* (2006.01)
(Continued)

(52) U.S. Cl.
CPC .... *H01L 29/66136* (2013.01); *H01L 21/2652* (2013.01); *H01L 21/823418* (2013.01);
(Continued)

(58) Field of Classification Search
CPC ........... H01L 29/7851; H01L 29/66439; H01L 29/78696; H01L 29/7818; H01L 29/0673
See application file for complete search history.

(56) References Cited

U.S. PATENT DOCUMENTS 11,158,634 B1 * 10/2021 Huang .............. H01L 29/41791
11,289,591 B1 * 3/2022 Su ....................... H01L 29/1008
(Continued)

OTHER PUBLICATIONS

Jing-Huei Huang et al., "Method for Reducing Line-End Space in Integrated Circuit Patterning", U.S. Appl. No. 16/901,505, filed Jun. 15, 2020, 28 pages specification, 17 pages drawings.
(Continued)

*Primary Examiner* — Jesse Y Miyoshi
(74) *Attorney, Agent, or Firm* — HAYNES AND BOONE, LLP

(57) ABSTRACT

A method includes providing a first semiconductor layer at a frontside of a structure; implanting first dopants of a first conductivity-type into the first semiconductor layer, resulting in a doped layer in the first semiconductor layer; forming a stack of semiconductor layers over the first semiconductor layer; patterning the stack of semiconductor layers and the first semiconductor layer into fins; forming an isolation structure adjacent to a lower portion of the fins; etching the stack of semiconductor layers to form a source/drain trench over the first semiconductor layer; forming a source/drain feature in the source/drain trench, wherein the source/drain feature is doped with second dopants of a second conductivity-type opposite to the first conductivity-type; forming a contact hole at a backside of the structure, wherein the contact hole exposes the doped layer in the first semiconductor layer; and forming a first contact structure in the contact hole.

20 Claims, 38 Drawing Sheets

(51) Int. Cl.
    *H01L 29/417*     (2006.01)
    *H01L 21/8234*     (2006.01)
    *H01L 21/265*     (2006.01)
    *H01L 27/06*     (2006.01)
    *H01L 21/266*     (2006.01)

(52) U.S. Cl.
    CPC ........... *H01L 21/823475* (2013.01); *H01L 21/823493* (2013.01); *H01L 27/0629* (2013.01); *H01L 29/417* (2013.01); *H01L 29/8613* (2013.01); *H01L 21/266* (2013.01); *H01L 21/823431* (2013.01)

(56) References Cited

U.S. PATENT DOCUMENTS

2018/0102359 A1     4/2018   Cheng et al.
2019/0371891 A1*  12/2019  Goktepeli ......... H01L 21/76898

OTHER PUBLICATIONS

Huan-Chieh Su et al., "Method and Structure for Reducing Source/Drain Contact Resistance at Water Backside", U.S. Appl. No. 17/236,675, filed Apr. 21, 2021, Assignee: Taiwan Semiconductor Manufacturing Co., Ltd., 35 pages specification, 17 pages drawings.

Chun-Yuan Chen, et al. "Anchor-Shaped Backside Via and Method Thereof", U.S. Appl. No. 16/926,447, filed Jul. 10, 2020, Assignee: Taiwan Semiconductor Manufacturing Co., Ltd., 32 pages specification, 16 pages drawings.

Jhon Jhy Liaw, "Fin End Isolation Structure for Semiconductor Devices", U.S. Appl. No. 16/944,381, filed Jul. 31, 2020, Assignee: Taiwan Semiconductor Manufacturing Co., Ltd., 38 pages specification, 34 pages drawings.

Jhon Jhy Liaw, "Leakage Reduction in Gate-All-Around Devices", U.S. Appl. No. 16/994,274, filed Aug. 14, 2020, Assignee: Taiwan Semiconductor Manufacturing Co., Ltd., 38 pages specification, 21 pages drawings.

* cited by examiner

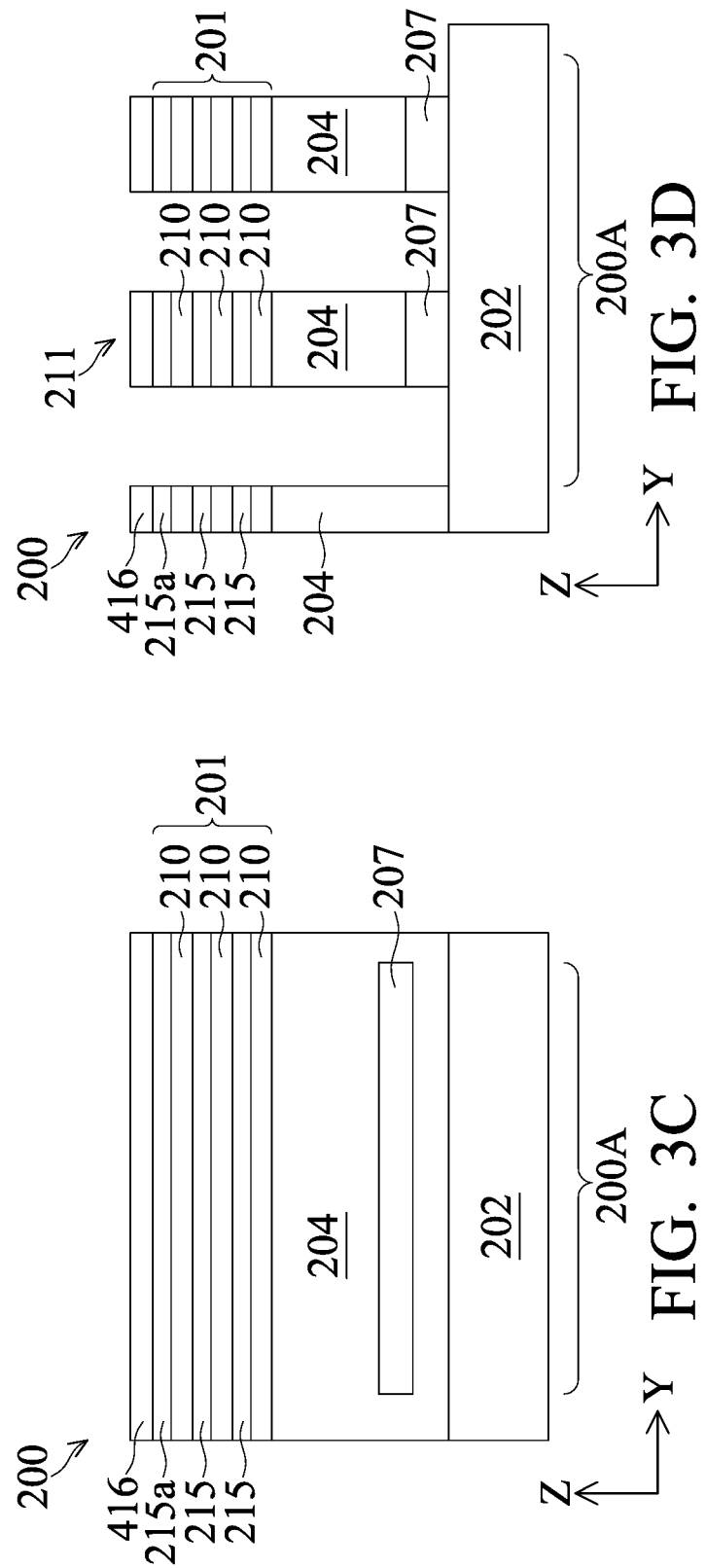

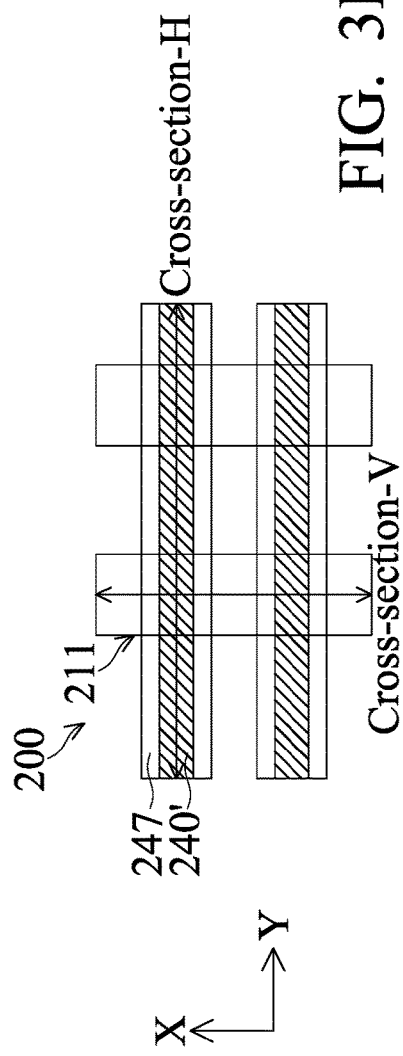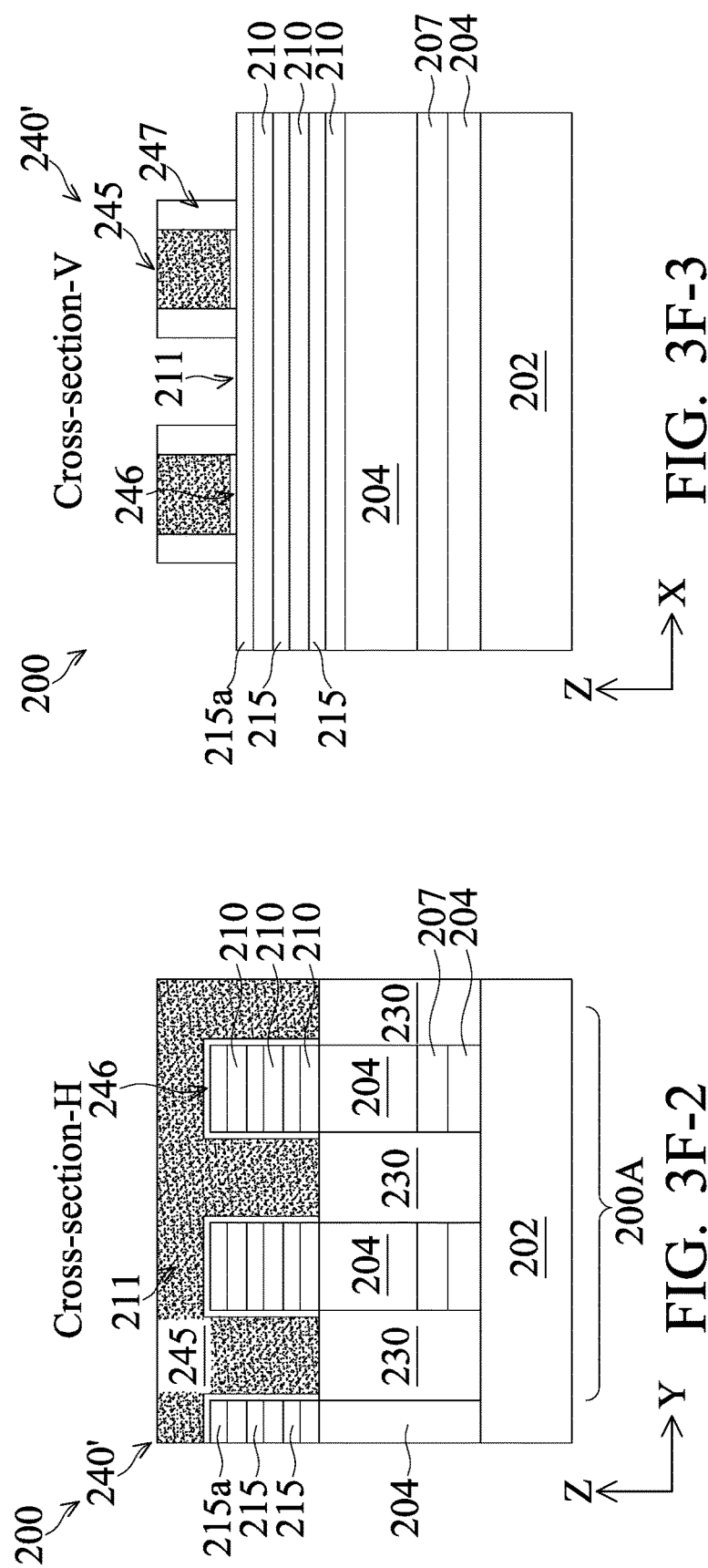

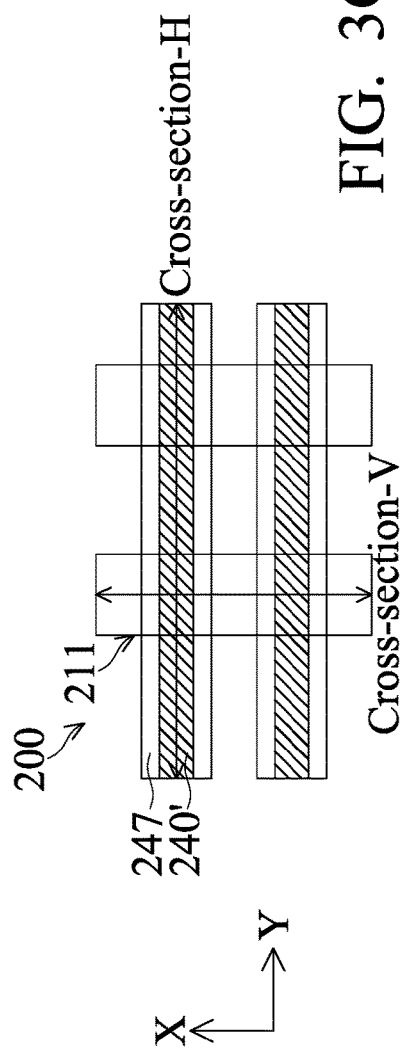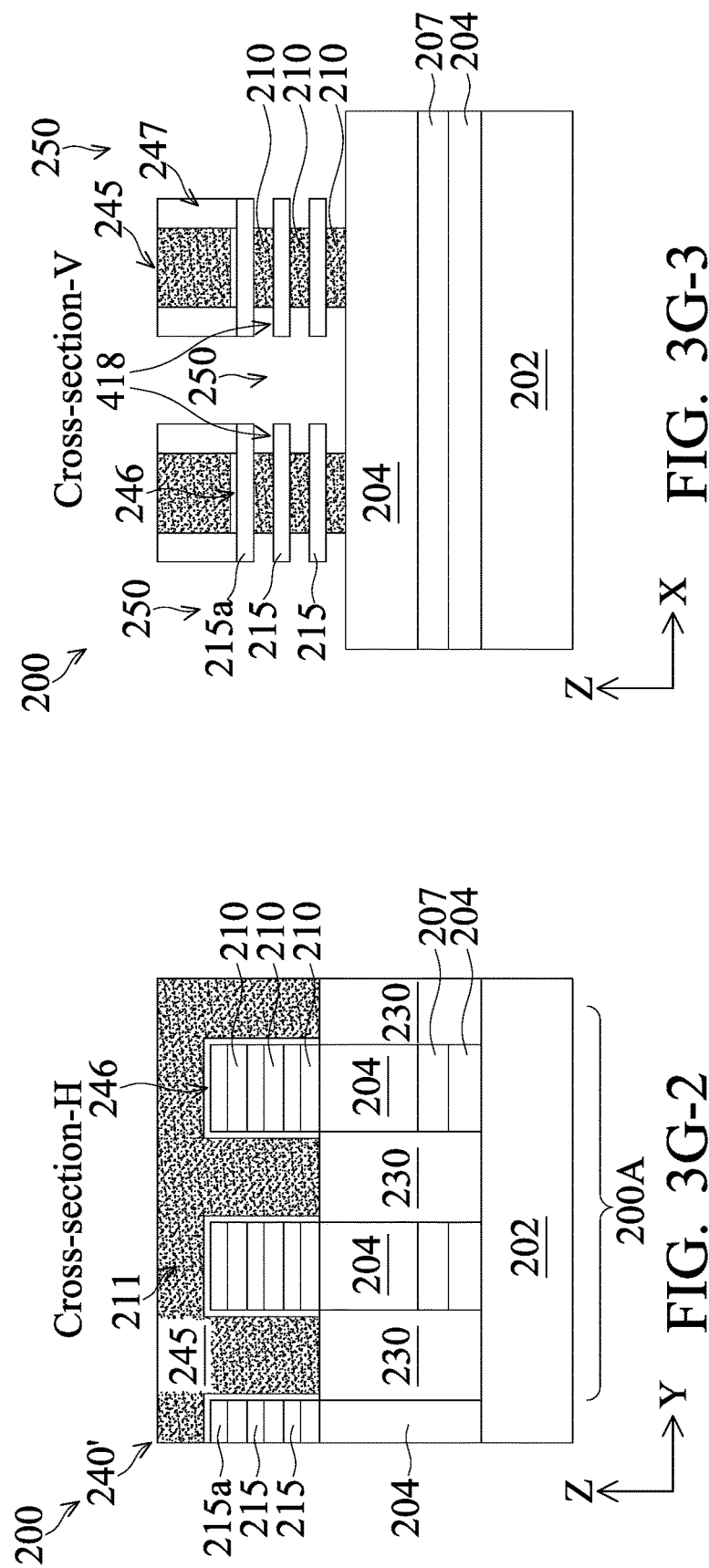
FIG. 3G-1
FIG. 3G-2
FIG. 3G-3

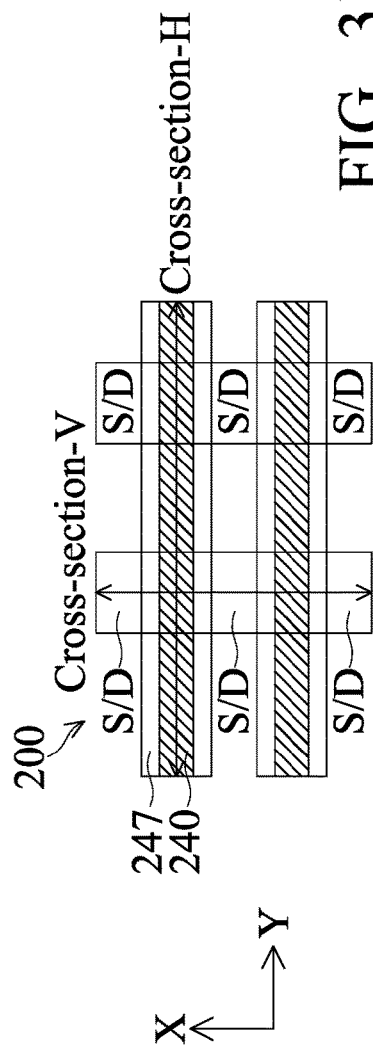
FIG. 3J-1
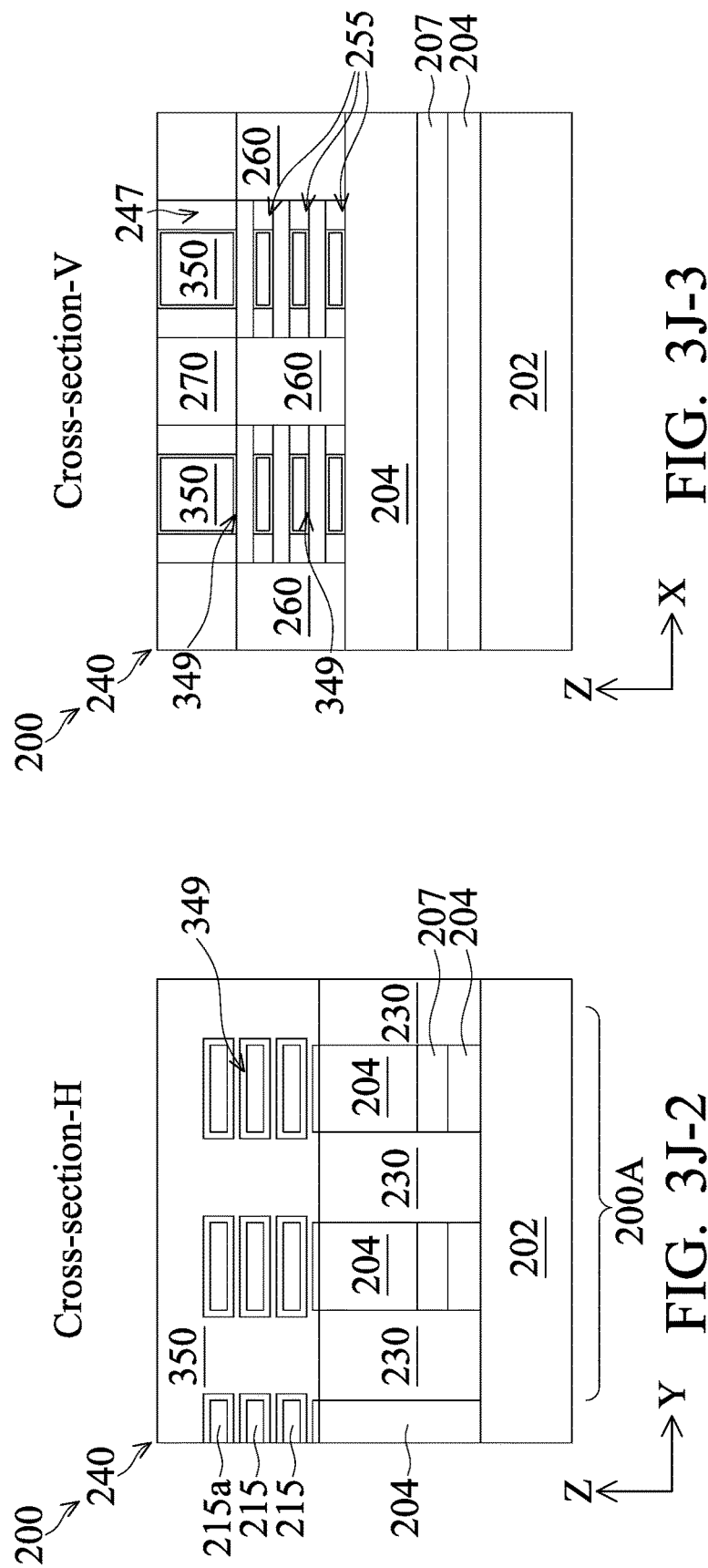
FIG. 3J-3
FIG. 3J-2

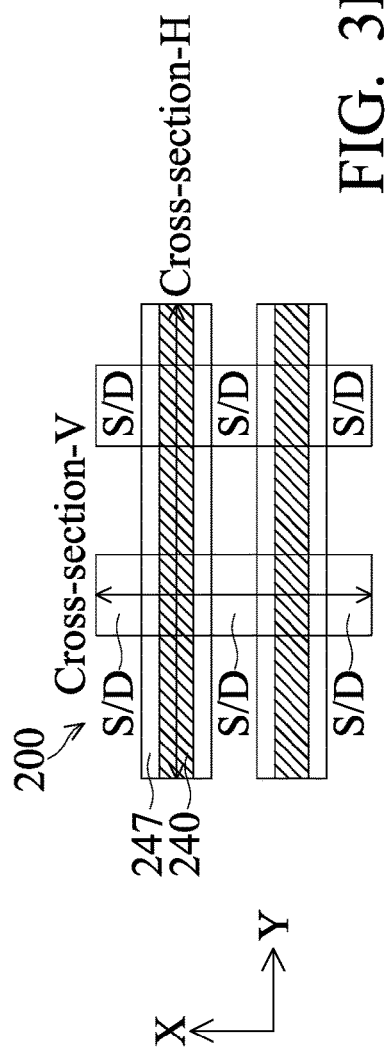
FIG. 3K-1
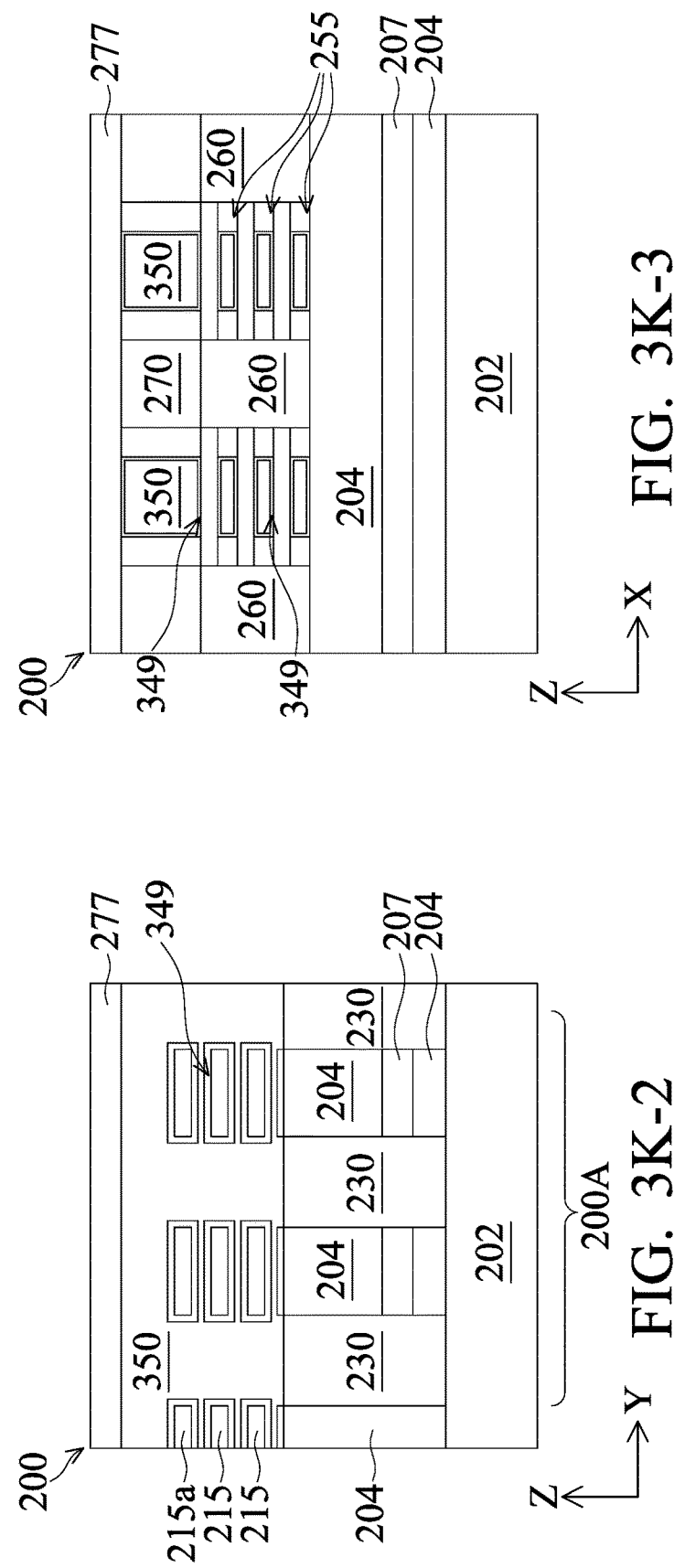
FIG. 3K-2
FIG. 3K-3

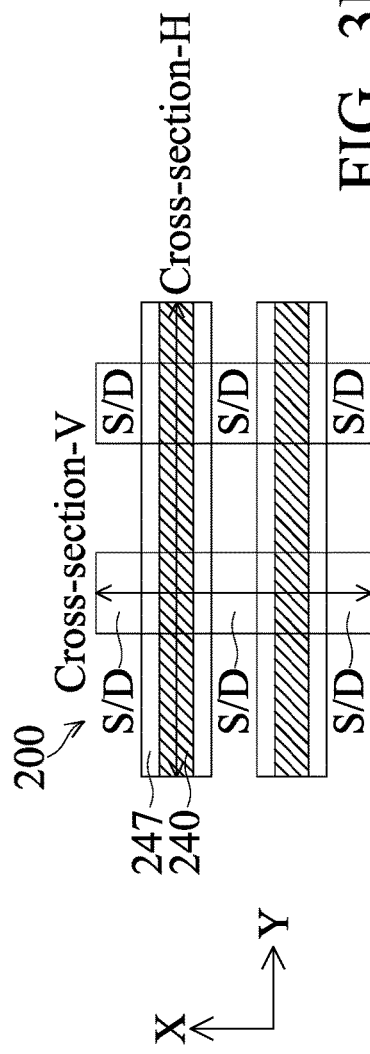
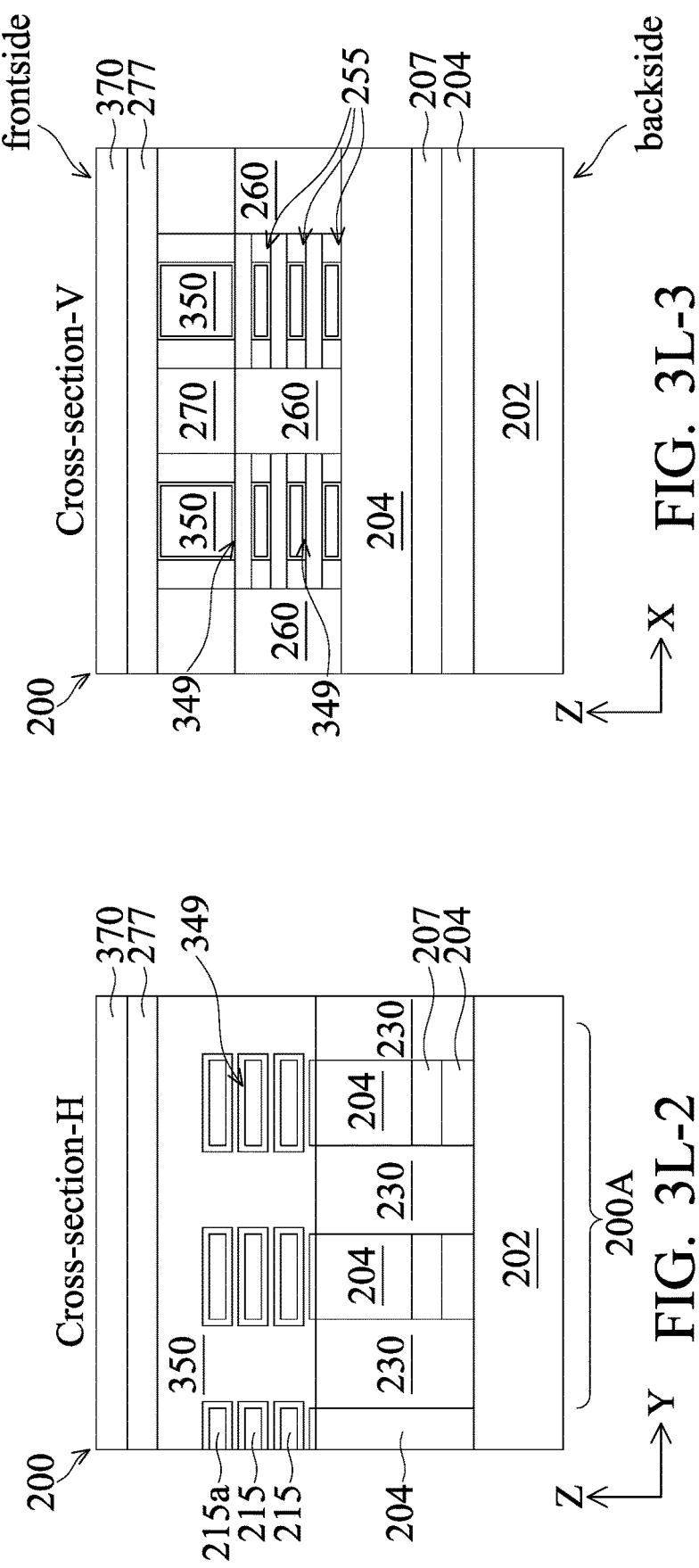
FIG. 3L-1
FIG. 3L-2
FIG. 3L-3

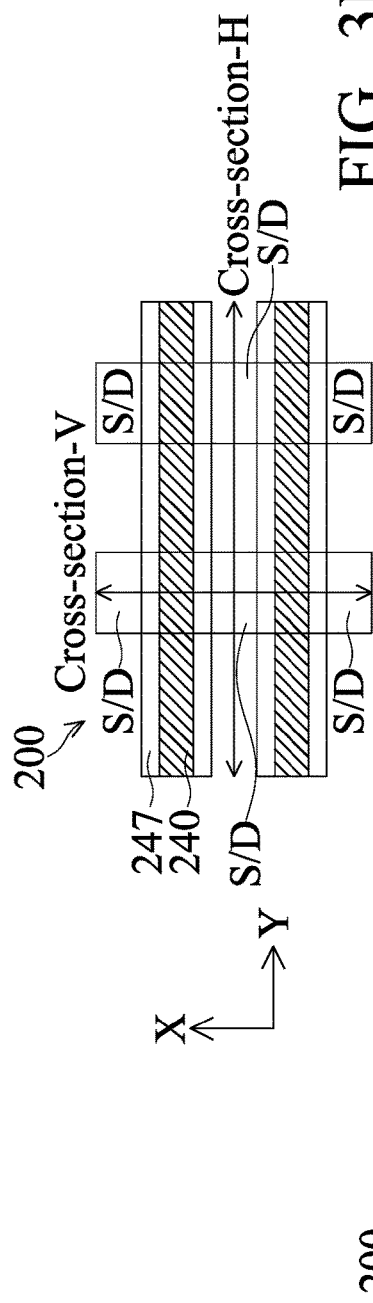
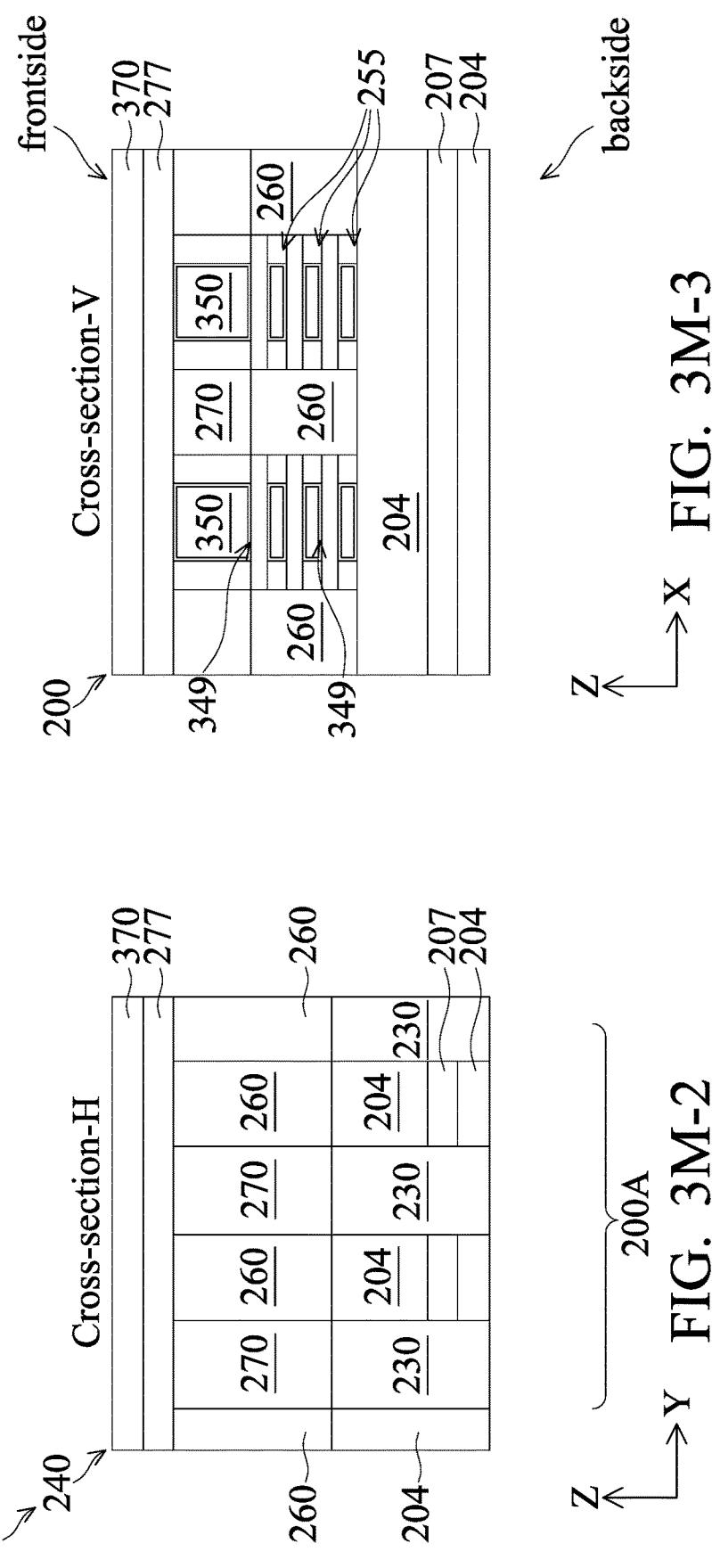
FIG. 3M-1
FIG. 3M-2
FIG. 3M-3

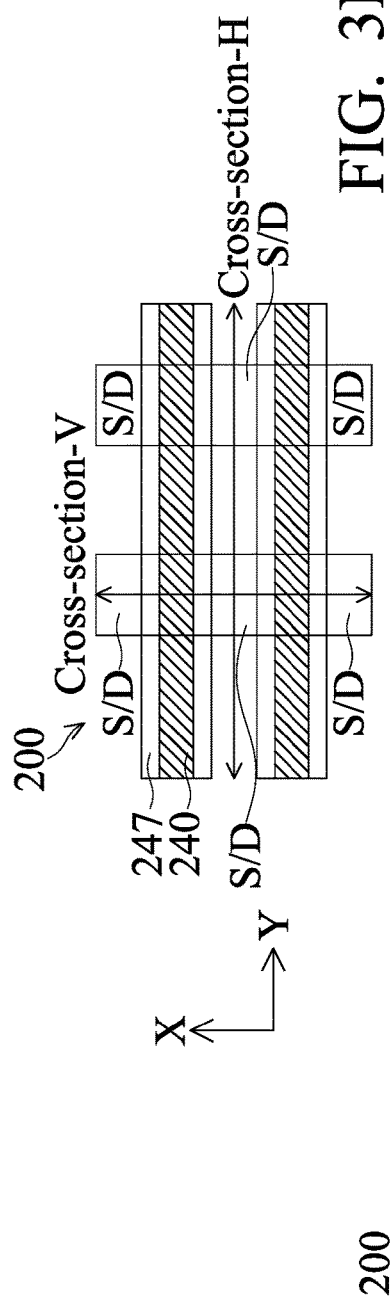
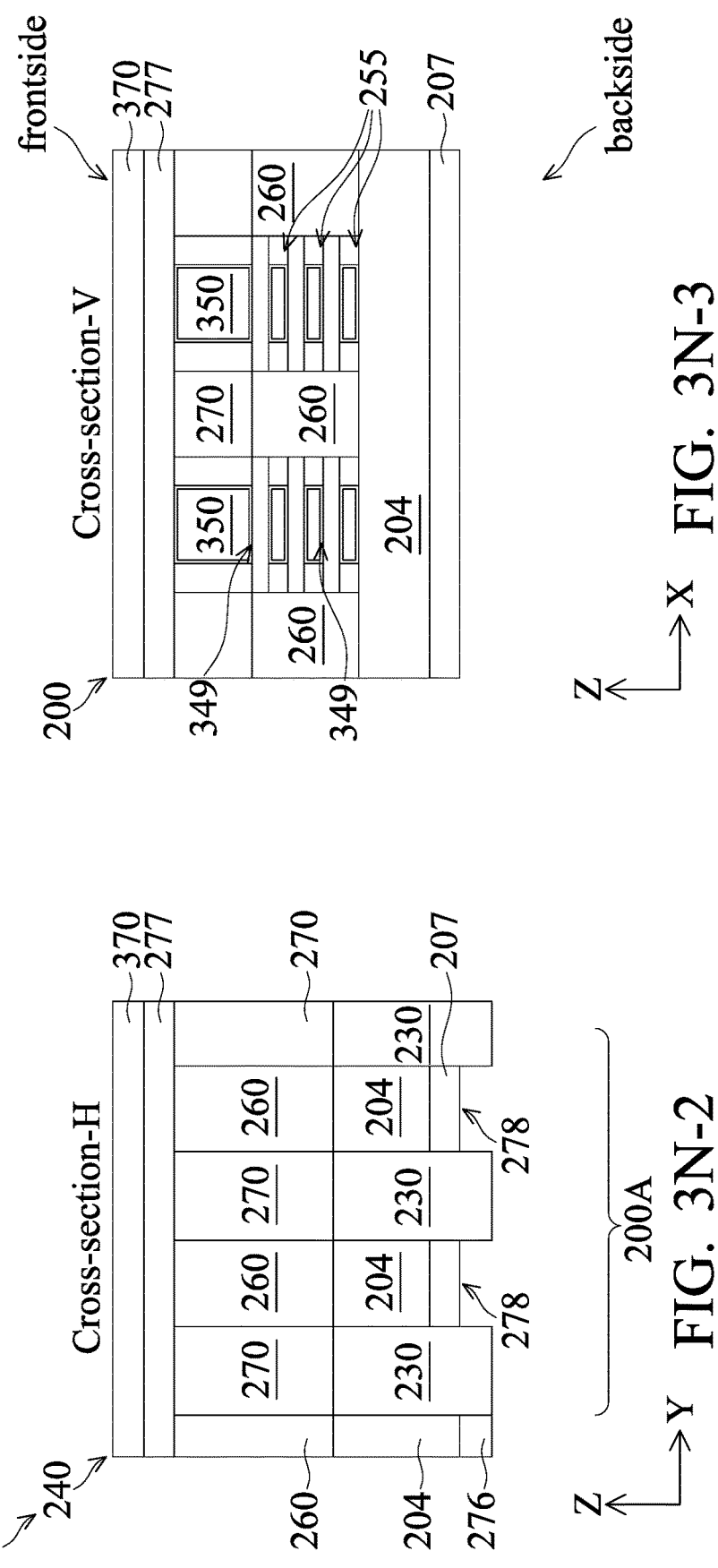
FIG. 3N-1
FIG. 3N-2
FIG. 3N-3

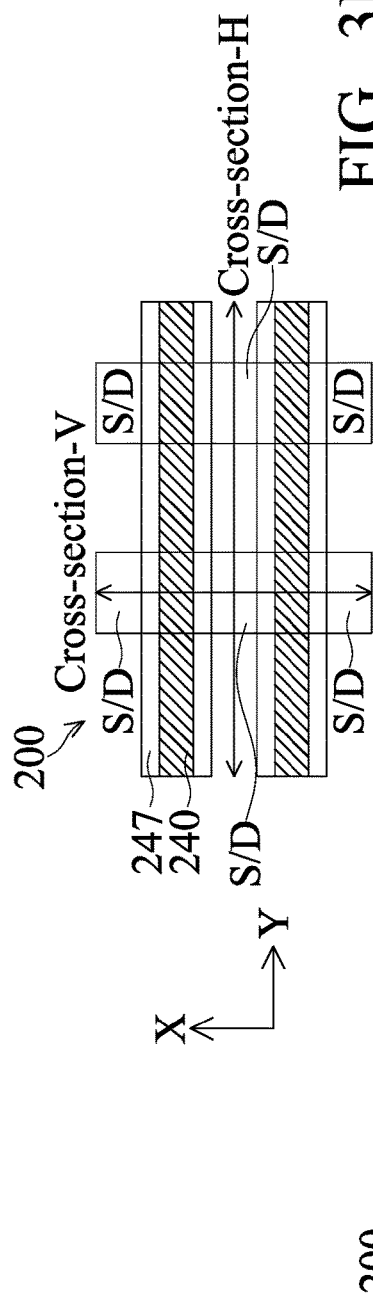
FIG. 3P-1
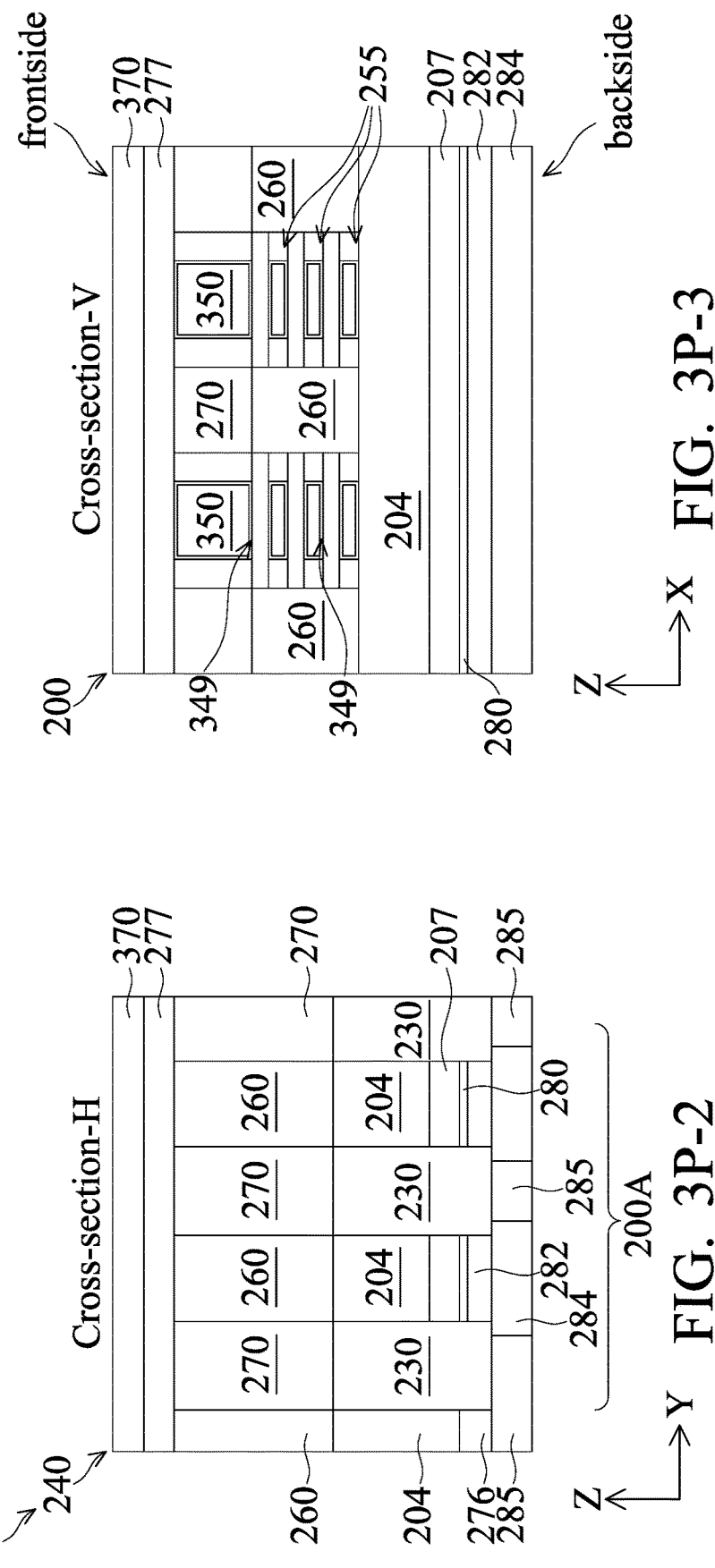
FIG. 3P-2
FIG. 3P-3

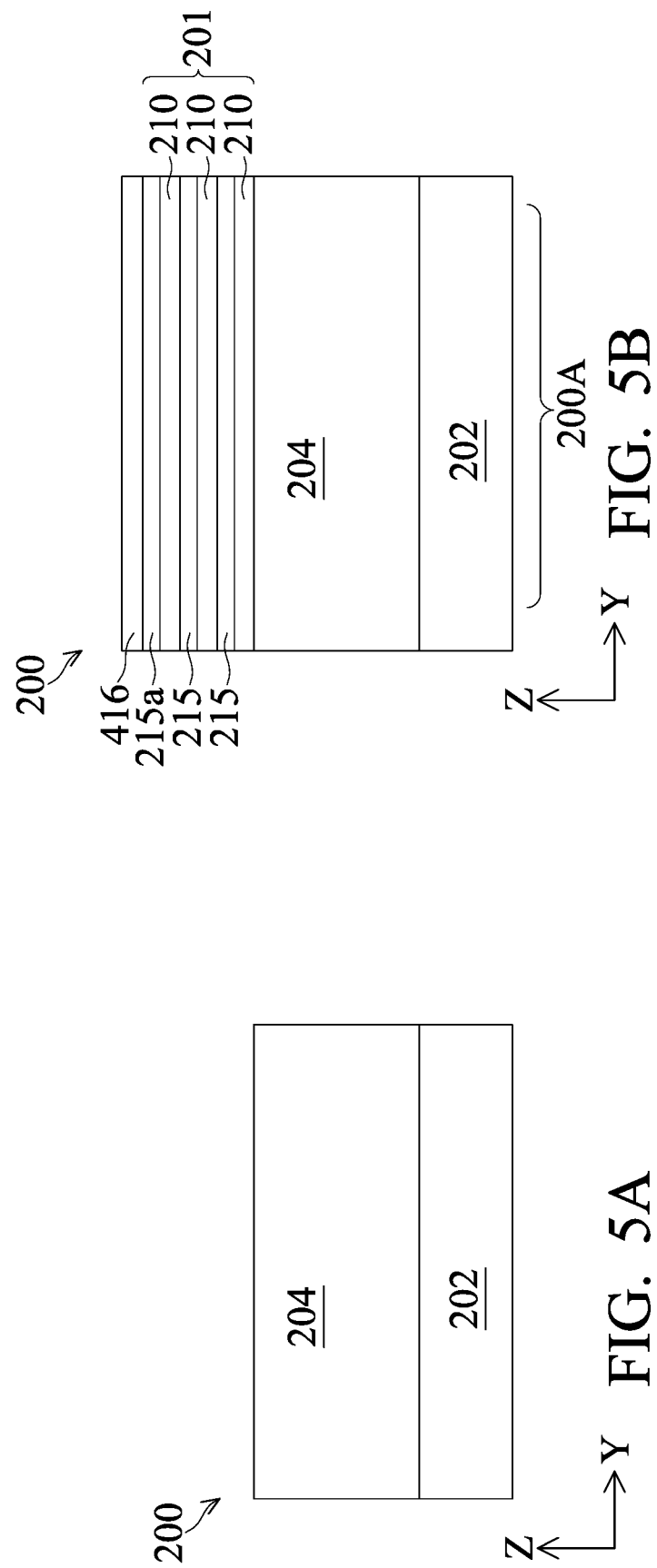

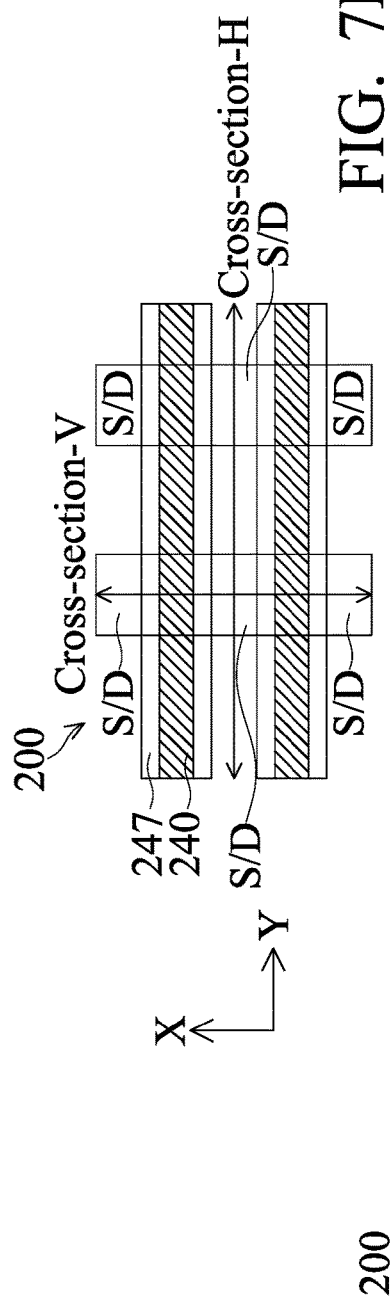
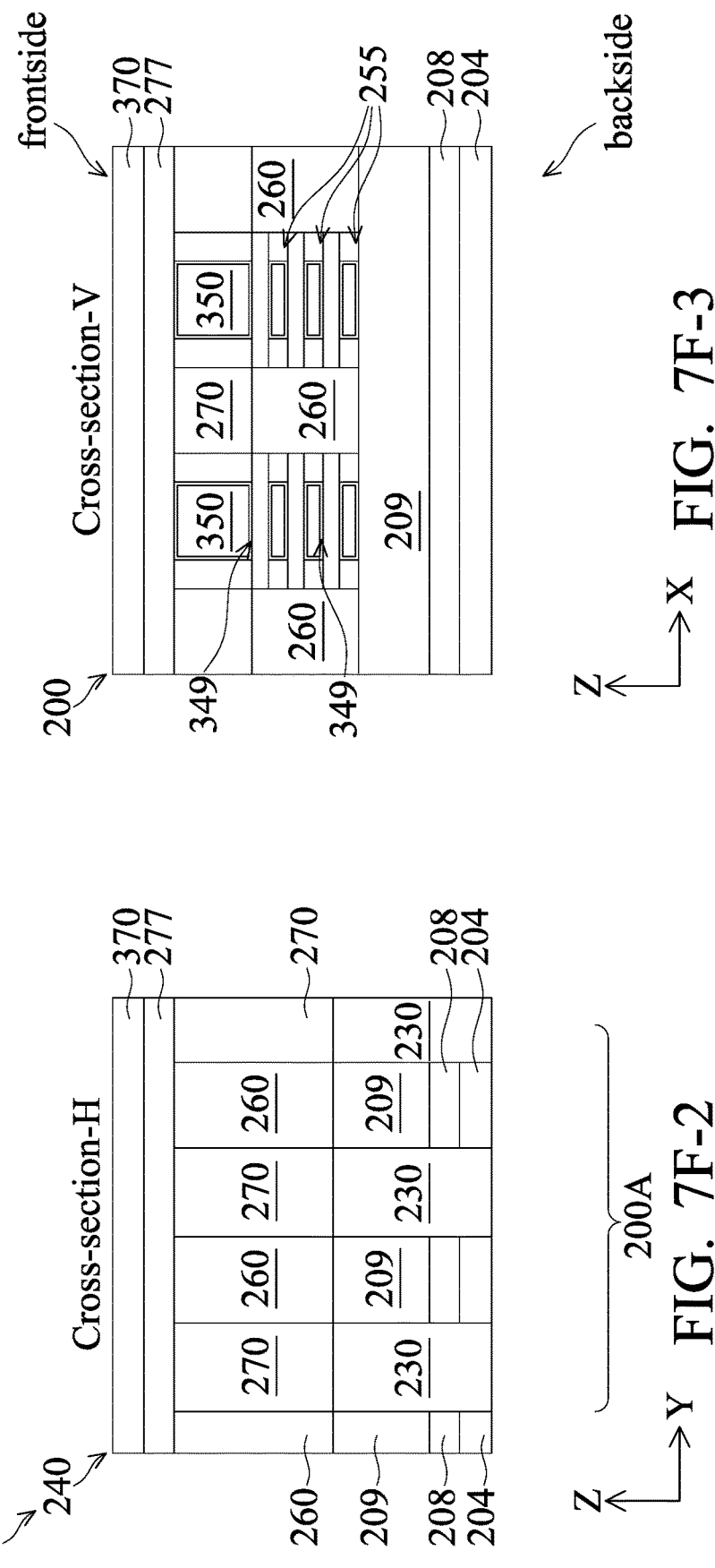
FIG. 7F-1
FIG. 7F-2
FIG. 7F-3

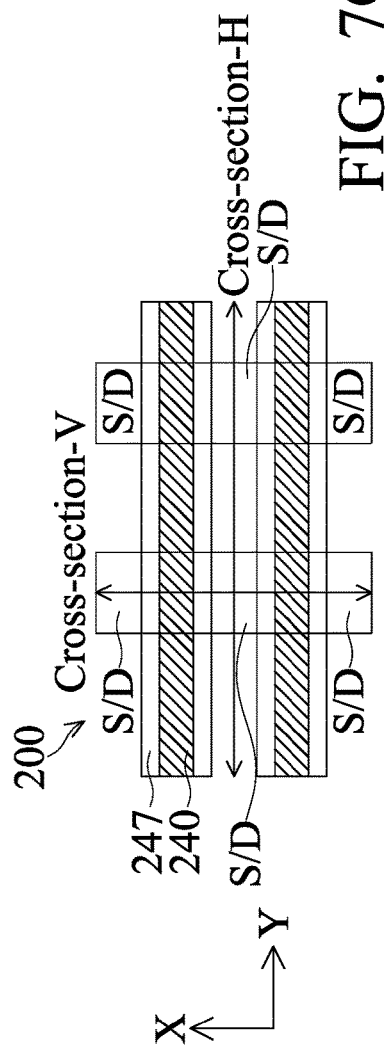
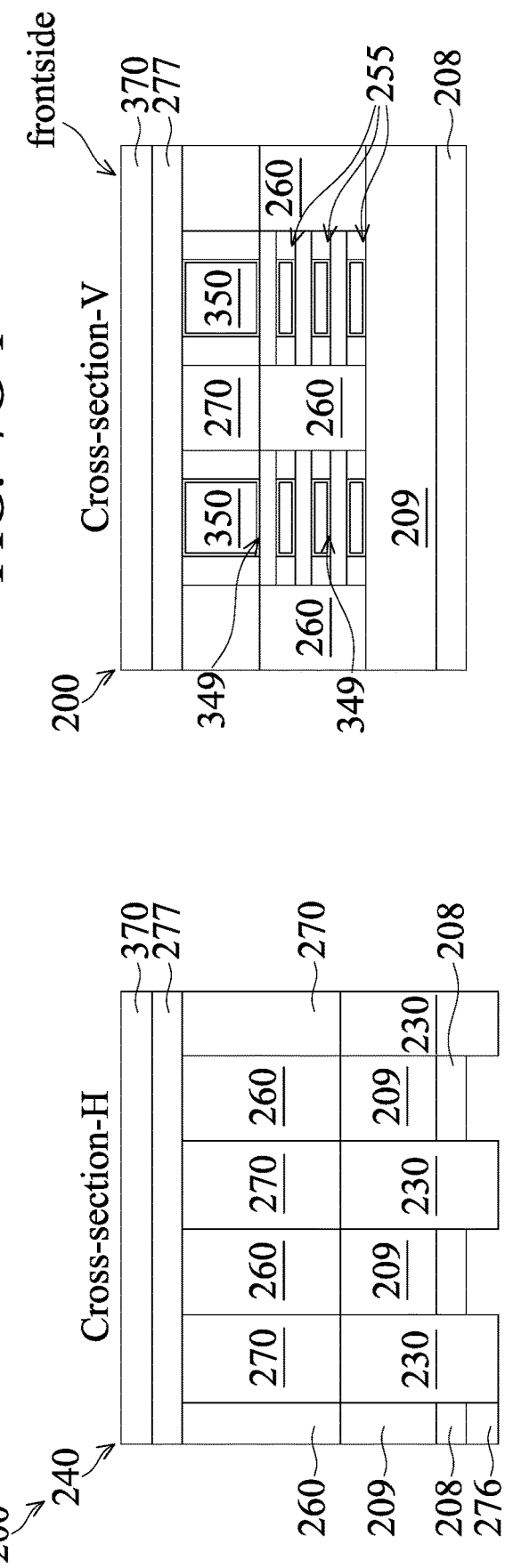
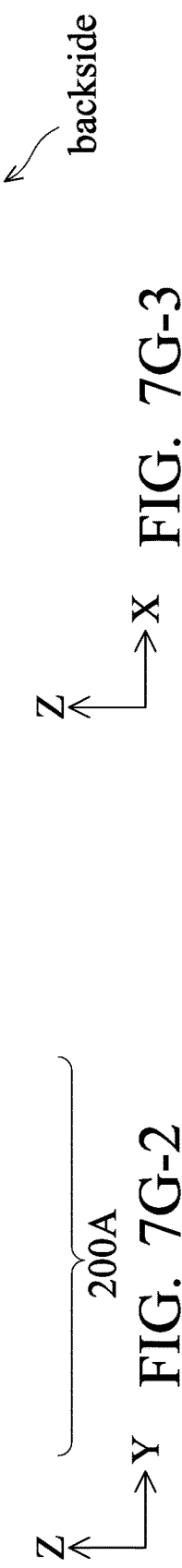
FIG. 7G-1
FIG. 7G-2
FIG. 7G-3

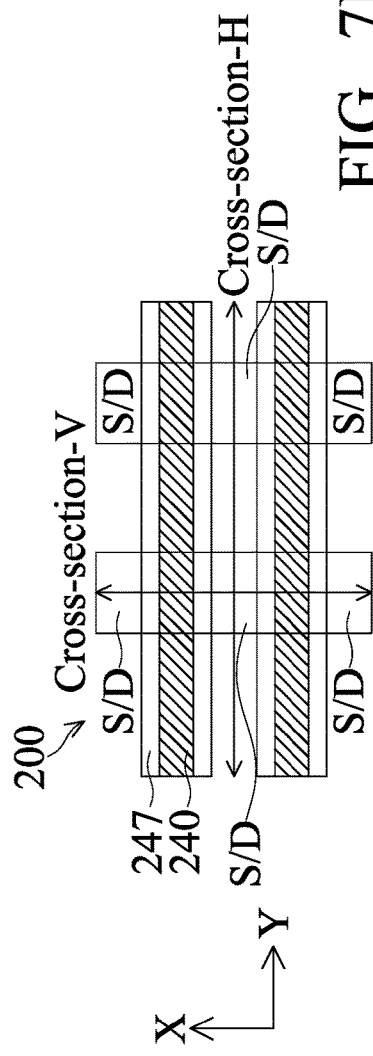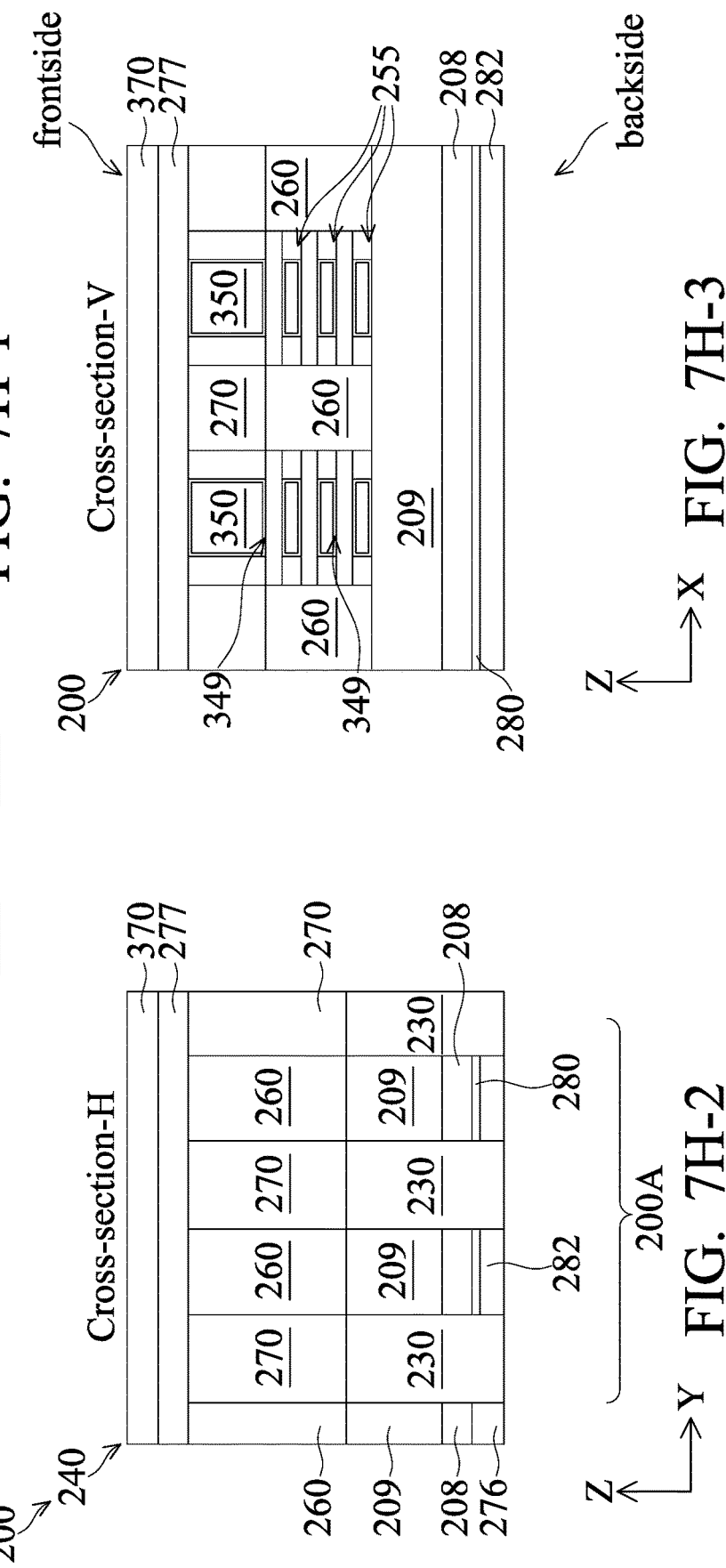
FIG. 7H-1
FIG. 7H-2
FIG. 7H-3

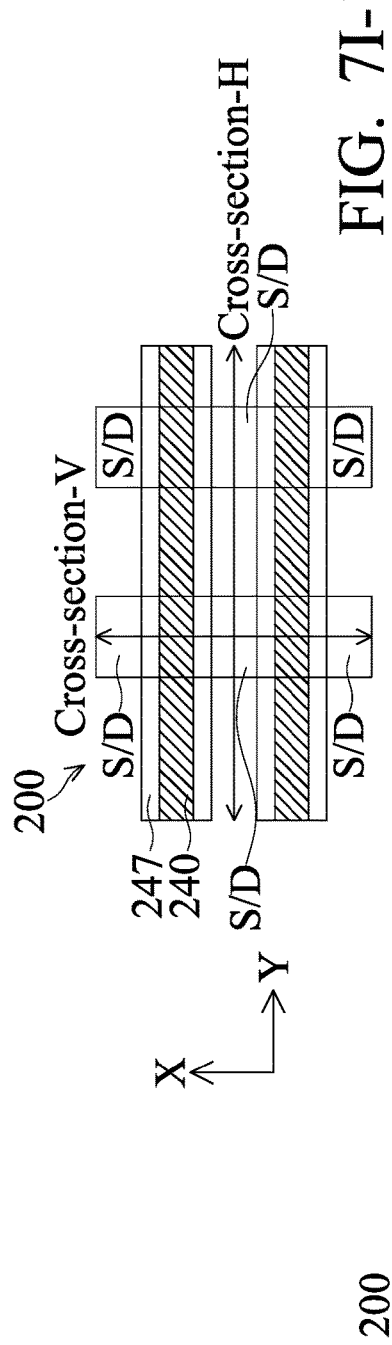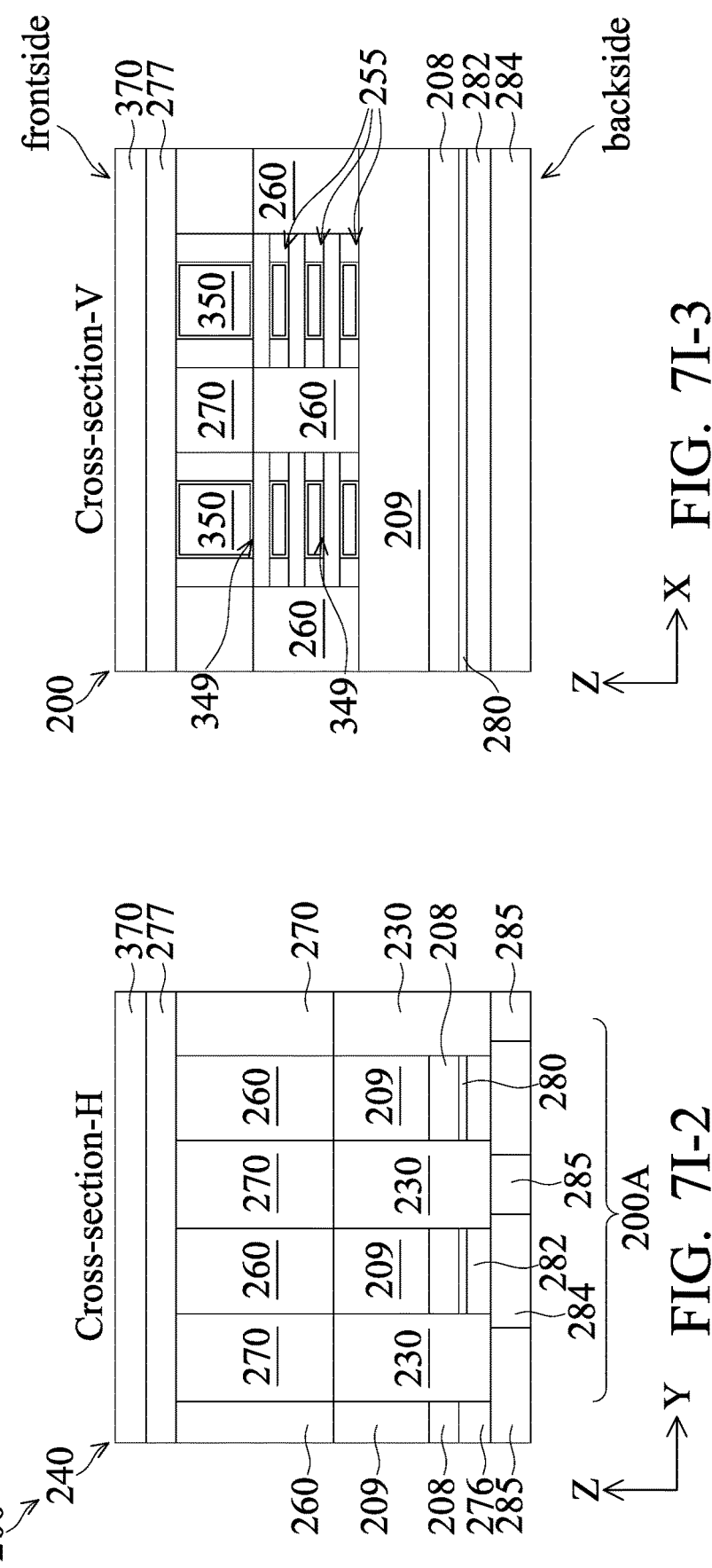
FIG. 7I-1
FIG. 7I-2
FIG. 7I-3

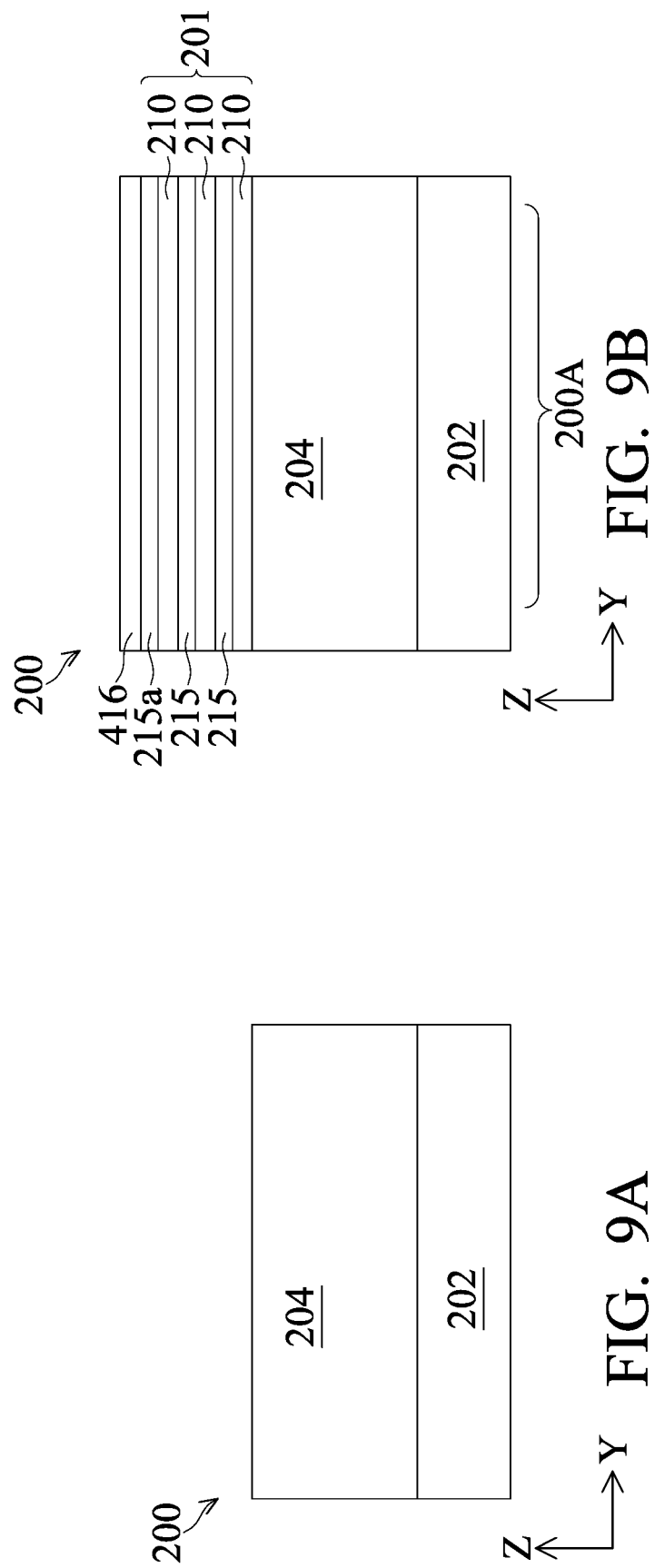

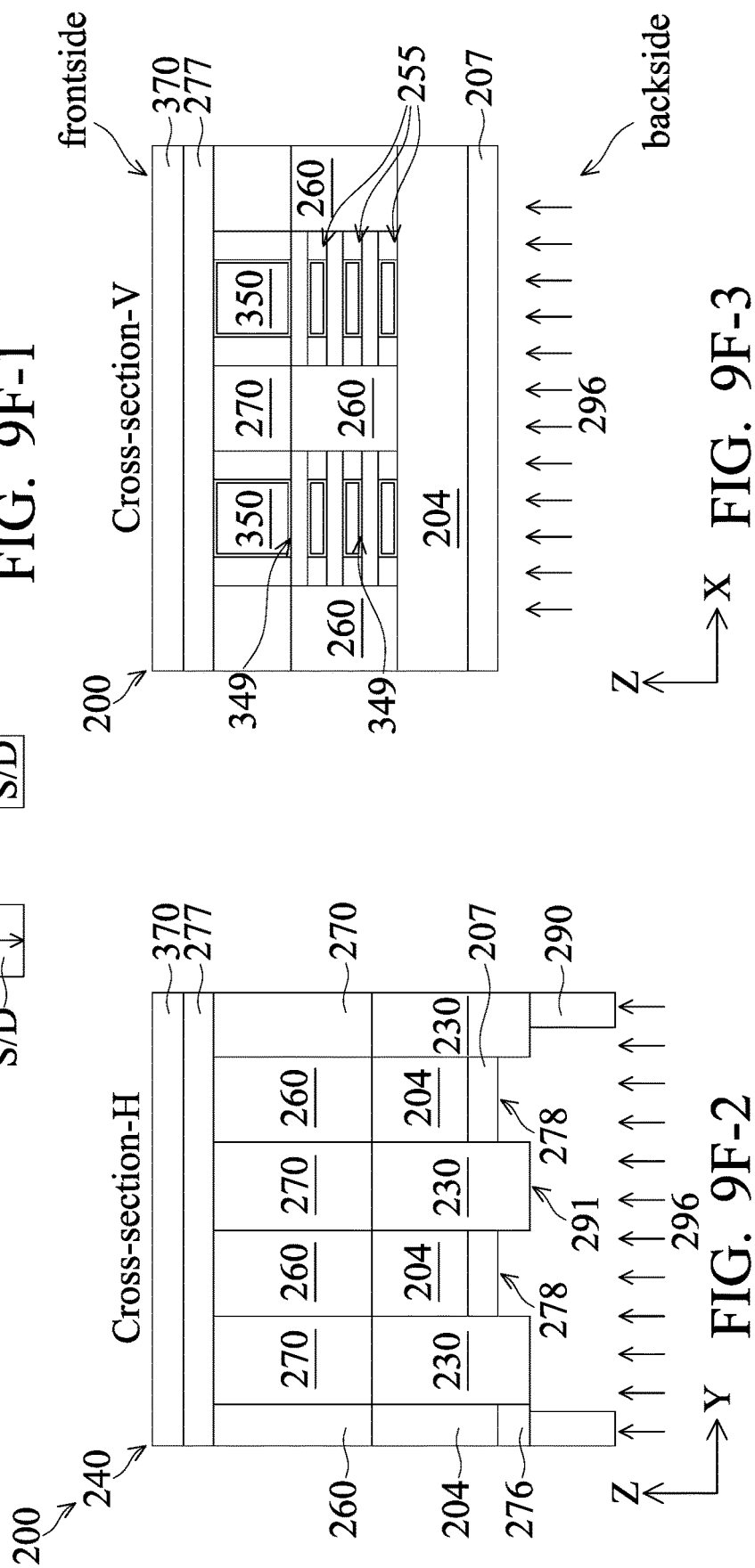

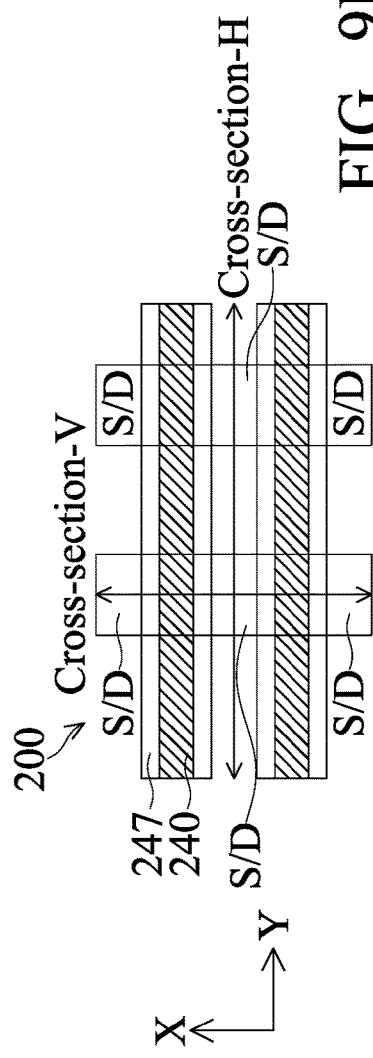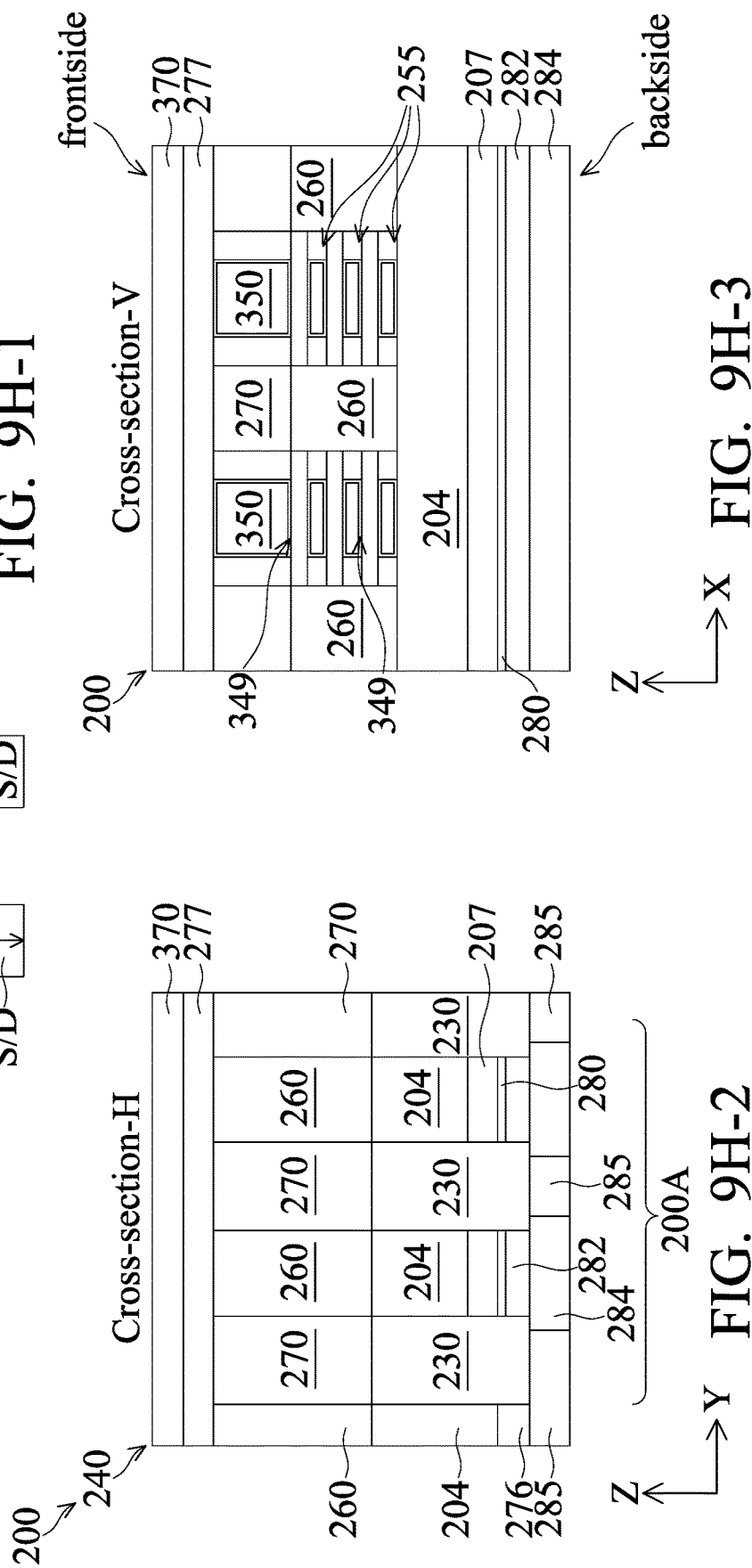

METHOD AND STRUCTURE FOR DIODES WITH BACKSIDE CONTACTS

BACKGROUND

Conventionally, integrated circuits (IC) are built in a stacked-up fashion, having transistors at the lowest level and interconnect (vias and wires) on top of the transistors to provide connectivity to the transistors. Power rails (such as metal lines for voltage sources and ground planes) are also above the transistors and may be part of the interconnect. As the ICs continue to scale down, it is desirable to move some of the power rails to the backside of the ICs to reduce voltage drop across the power rails and to reduce overall power consumption of the ICs. However, this also creates a problem for traditional two-port diodes that have both ports on the frontside and connected through a deep well because the deep well might be removed during the process of forming backside power rails. Therefore, although existing approaches in semiconductor fabrication have been generally adequate for their intended purposes, they have not been entirely satisfactory in all respects. One area of interest is how to form diodes that are compatible with backside power rails and have reduced contact resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E, 3F-2, 3F-3, 3G-2, 3G-3, 3H-2, 3H-3, 3I-2, 3I-3, 3J-2, 3J-3, 3K-2, 3K-3, 3L-2, 3L-3, 3M-2, 3M-3, 3N-2, 3N-3, 3O-2, 3O-3, 3P-2, and 3P-3, illustrate cross-sectional views of a portion of the semiconductor device during various stages of fabrication according to the method in FIGS. 2A-2B, according to some embodiments.

FIGS. 3F-1, 3G-1, 3H-1, 3I-1, 3J-1, 3K-1, 3L-1, 3M-1, 3N-1, 3O-1, and 3P-1 illustrate top views of a portion of a semiconductor device during various stages of fabrication according to the method in FIGS. 2A-2B, according to some embodiments.

FIGS. 5A, 5B, 5C, 5D, and 5E illustrate cross-sectional views of a portion of the semiconductor device during various stages of fabrication according to the method in FIG. 4, according to some embodiments.

FIGS. 7A, 7B, 7C, 7D, 7E, 7F-2, 7F-3, 7G-2, 7G-3, 7H-2, 7H-3, 7I-2, and 7I-3, illustrate cross-sectional views of a portion of the semiconductor device during various stages of fabrication according to the method in FIGS. 6A-6B, according to some embodiments.

FIGS. 7F-1, 7G-1, 7H-1, and 7I-1 illustrate top views of a portion of a semiconductor device during various stages of fabrication according to the method in FIGS. 6A-6B, according to some embodiments.

FIGS. 9A, 9B, 9C, 9D, 9E-2, 9E-3, 9F-2, 9F-3, 9G-2, 9G-3, 9H-2, and 9H-3 illustrate cross-sectional views of a portion of the semiconductor device during various stages of fabrication according to the method in FIG. 8, according to some embodiments.

FIGS. 9E-1, 9F-1, 9G-1, and 9H-1 illustrate top views of a portion of a semiconductor device during various stages of fabrication according to the method in FIG. 8, according to some embodiments.

DETAILED DESCRIPTION

Figure 1A:
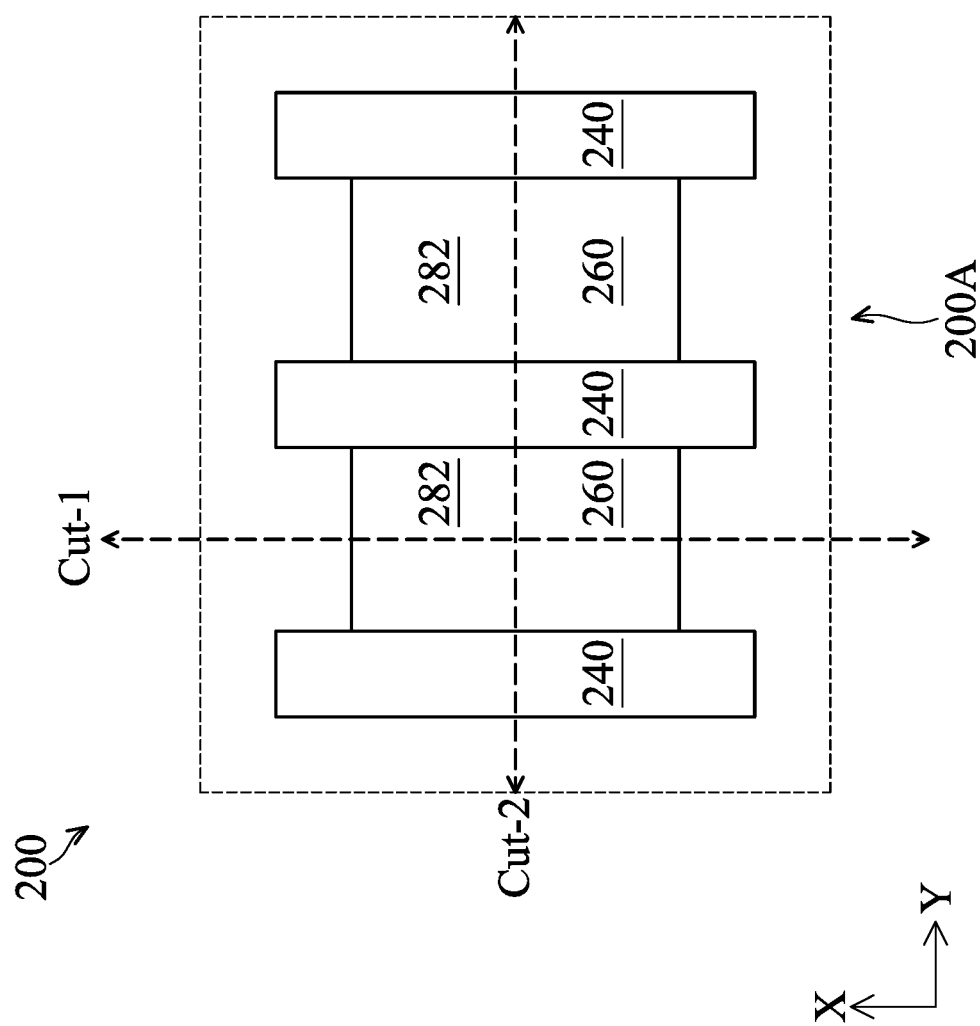
FIGS. 1A, 1B, and 1C show top and cross-sectional views of a portion of a semiconductor device, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to semiconductor devices with backside power rails and contacts (vias), and two-port diodes that are compatible with the backside power rails and contacts. More particularly, a two-port diode according to the present disclosure has one port (frontside port) formed at the frontside of an IC, and another port (backside port) formed at the backside of the IC. The frontside port may be accessed through a frontside metal layer which is connected through a frontside contact down to a heavily doped source/drain epitaxial feature. The backside port may be accessed through a backside metal layer which is connected through a backside contact to a well that is disposed over the backside contact. The interface between the well and the backside contact is a heavily doped semiconductor layer, for reducing the sheet resistance of the interface. The heavily doped source/drain epitaxial feature is formed over the well. The heavily doped source/drain epitaxial feature, the well, and the heavily doped semiconductor layer form a PN (or NP) junction acting as a diode. In some embodiments, the well is undoped or lightly doped, for reducing the capacitance thereof.

In addition to having the disclosed diodes and backside power rails and contacts, the ICs may include gate-all-around (GAA) transistors and/or FinFET transistors at the frontside, as well as an interconnect structure (which may include power rails as well) on the frontside. Having backside power rails and contacts increases the number of metal tracks available in the ICs for directly connecting to source/drain contacts and vias. It also increases the gate density for greater device integration than existing devices without the backside power rails. The backside power rails may have wider dimension than the first level metal (M0) tracks on the frontside of the IC, which beneficially reduces the power rail resistance. The details of the structure and fabrication methods of the present disclosure are described below in conjunction with the accompanied drawings, which illustrate processes of making one or more diodes compatible with GAA transistors in the same IC, according to some embodiments. A GAA transistor refers to a transistor having vertically-stacked horizontally-oriented multi-channels, such as nanowire transistors and nanosheet transistors. GAA transistors are promising candidates to take CMOS to the next stage of the roadmap due to their better gate control ability, lower leakage current, and fully FinFET device layout compatibility. The present disclosure can also be utilized to make diodes along with FinFETs and backside power rails and contacts. Those of ordinary skill in the art should appreciate that they may readily use the present disclosure as a basis for designing or modifying other processes and structures for carrying out the same purposes and/or achieving the same advantages of the embodiments introduced herein.

FIG. 1A shows a top view of a semiconductor device (or a semiconductor structure) 200 that includes a region 200A configured for diodes such as passive diodes. The semiconductor device 200 includes other regions not illustrated in FIG. 1A, such as regions configured for GAA transistors or other type of devices. In some embodiments, the device 200 is a portion of an IC chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof.

Figure 1C:
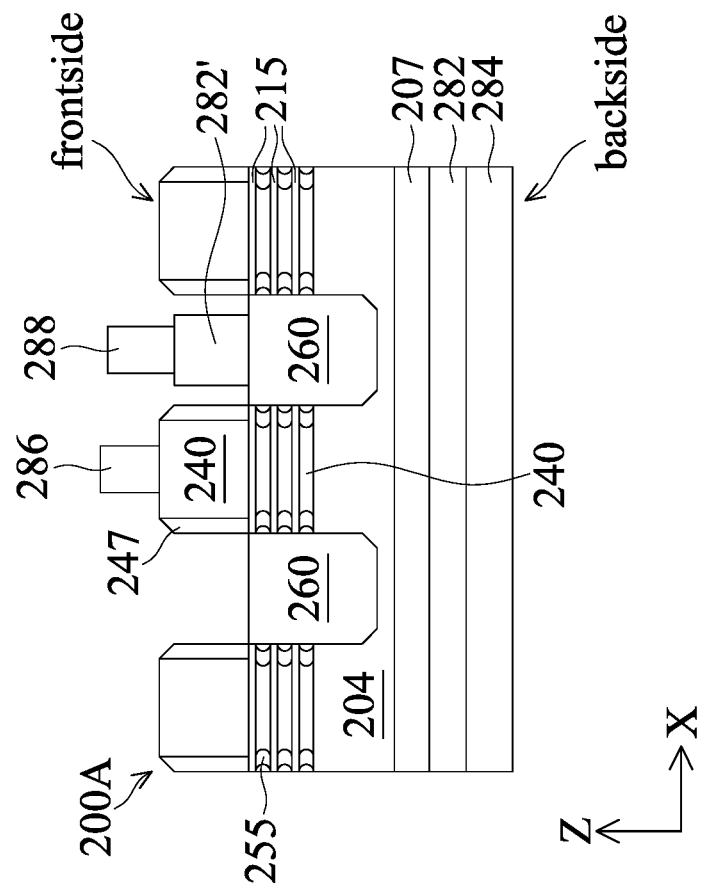
Figure 1B:
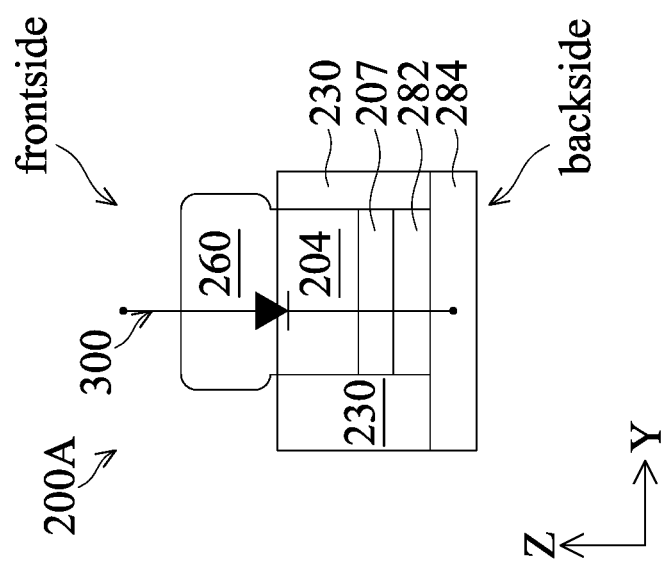

As shown in FIG. 1A, the region 200A includes gate stacks 240 oriented lengthwise along the "y" direction, heavily doped source/drain (S/D) features 260 between the gate stacks 240, and backside vias (or contacts) 282. FIGS. 1B and 1C illustrate cross-sectional views of the region 200A, in portion, along the "Cut-1" and "Cut-2" lines in FIG. 1A respectively, according to an embodiment. Referring to FIGS. 1B and 1C, the gate stacks 240 and the S/D features 260 are disposed at the frontside of the region 200A, while the via 282 is disposed on the backside of the region 200A. The region 200A further includes a well 204, which is a undoped or lightly doped semiconductor layer in some embodiment. The S/D features 260 are disposed over the well 204. The region 200A further includes a heavily doped semiconductor layer 207 between the well 204 and the backside via 282. Although not shown in FIGS. 1B and 1C, the region 200A further includes a silicide feature between the heavily doped semiconductor layer 207 and the backside via 282 in some embodiments. The heavily doped semiconductor layer 207 may be formed using ion implantation in some embodiments or using epitaxy with in-situ or ex-situ doping, which will be discussed in detail later. The S/D feature 260 and the semiconductor layer 207 are doped with opposite types of dopants (i.e., one with p-type and the other with n-type). As a result, the heavily doped S/D feature 260, the well 204, and the heavily doped semiconductor layer 207 form a diode 300. The region 200A further includes semiconductor layers 215 connecting adjacent S/D features 260, gate spacers 247 on sidewalls of the gate stacks 240, inner spacers 255 between the S/D features 260 and the gate stacks 240, an isolation structure 230 adjacent to the well 204, the semiconductor layer 207, and the backside via 282, and one or more metal tracks 284 at the backside of the region 200A and connecting to the backside via 282. As shown in FIGS. 1B-1C, the region 200A further includes frontside S/D contact 282' on the S/D features 260, and frontside metallic vias 286 and 288 disposed on the gate stacks 240 and the S/D contact 282' respectively. Even though not shown, the region 200A may further include a silicide feature between the S/D feature 260 and the frontside S/D contact 282' and another silicide feature between the semiconductor layer 207 and the backside via 282. Even though not shown, the region 200A may further include interconnect layers disposed over the frontside vias 286 and 288 for connecting various elements of the semiconductor device 200. For example, through the interconnect layer, the diodes 300 in the region 200A may be connected to other parts (such as GAA transistors or FinFETs) of the semiconductor device 200. Also, in some embodiments, some of the S/D features 260 and the gate stacks 240 in the region 200A are tied together to form a frontside port of a passive diode 300. For example, the frontside vias 286 and 288 may be tied together in some embodiments. In an embodiment, the frontside contact 282' may be formed in the same way or substantially same way as the backside contact 282 and the two may include the same or substantially same material(s).

In the embodiments shown in FIGS. 1B-1C, the diode 300 is a two-port diode. It has one port (frontside port) formed at the frontside of the region 200A (which is also the frontside of the semiconductor device 200), and another port (backside port) formed at the backside of the region 200A (which is also the backside of the semiconductor device 200). The frontside port of the diode 300 may be accessed through a frontside metal layer which is connected through a frontside contact to the heavily doped S/D feature 260. The backside port may be accessed through the backside metal layer 284 and the backside via (or contact) 282. The heavily doped semiconductor layer 207 reduces the sheet resistance between the via 282 and the well 204. The material and composition of the various components of the device 200 as well as the formation thereof will be discussed below.

Figure 2A:
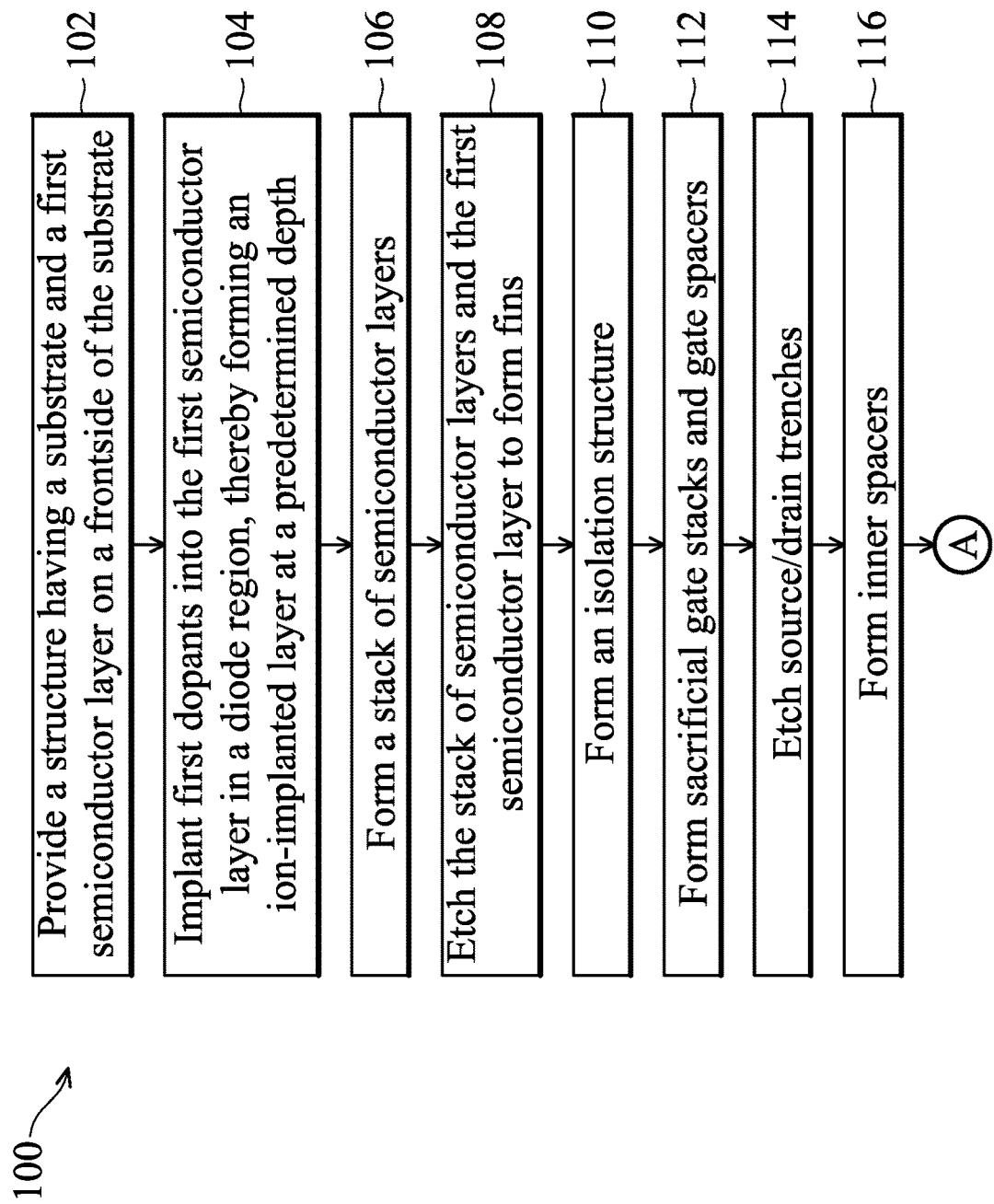
FIGS. 2A and 2B show a flow chart of a method of fabricating a semiconductor device, according to various aspects of the present disclosure.
Figure 2B:
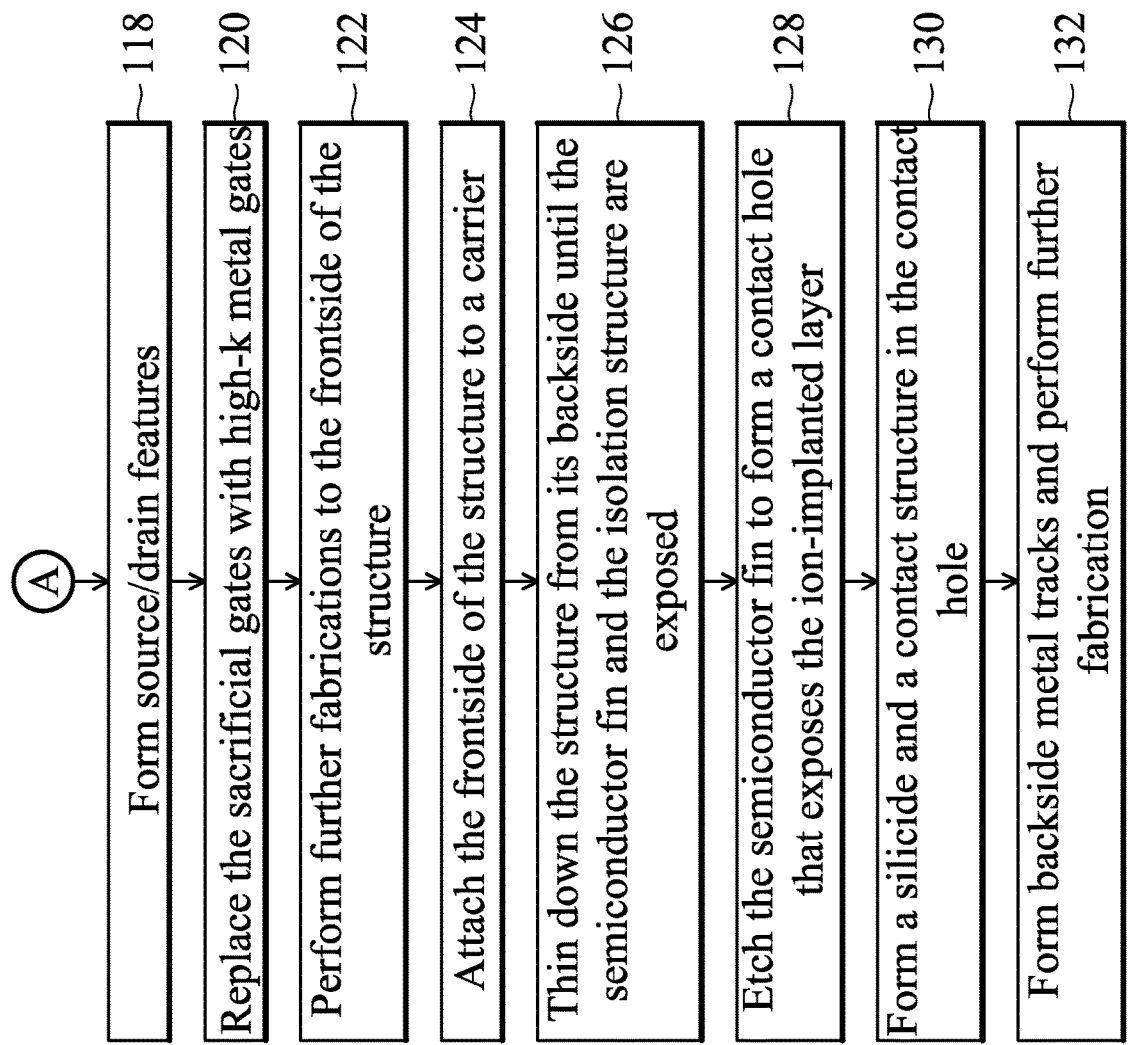

FIGS. 2A and 2B are a flow chart of a method 100 for fabricating a semiconductor device having an embodiment of the diodes 300, according to various aspects of the present disclosure. Additional processing is contemplated by the present disclosure. Additional operations can be provided before, during, and after method 100, and some of the operations described can be moved, replaced, or eliminated for additional embodiments of method 100.

Method 100 is described below in conjunction with FIG. 3A through FIG. 3P-3 that illustrate various top, cross-sectional, and perspective views of the semiconductor device 200 at various steps of fabrication according to the method 100, in accordance with some embodiments. FIGS. 3A through 3P-3 have been simplified for the sake of clarity to better understand the inventive concepts of the present disclosure. Additional features can be added in the device 200, and some of the features described below can be replaced, modified, or eliminated in other embodiments of the device 200.

At operation 102, the method 100 (FIG. 2A) provides a semiconductor device 200 having a substrate 202 and a semiconductor layer 204 on a frontside of the substrate 202, such as shown in FIG. 3A. In an embodiment, substrate 202 includes silicon, such as a silicon wafer. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In the present embodiment, the semiconductor layer 204 include the same semiconductor material(s) as the substrate 202 and may be considered part of the substrate 202. The semiconductor layer 204 is undoped in an embodiment. Alternatively, the semiconductor layer 204 may be lightly doped. For example, the semiconductor layer 204 may be doped with p-type dopants, such as boron, indium, other p-type dopant, or combinations thereof, configured for n-type GAA transistors, or may be doped with n-type dopants, such as phosphorus, arsenic, other n-type dopant, or combinations thereof, configured for p-type GAA transistors. In some implementations, the semiconductor layer 204 is doped with a combination of p-type dopants and n-type dopants but with a net effect of being n-type doped. In some implementations, the semiconductor layer 204 is doped with a combination of p-type dopants and n-type dopants but with a net effect of being p-type doped. In some embodiments, the doped semiconductor layer 204 can be formed directly on and/or in substrate 202, by an ion implantation process, a diffusion process, and/or other suitable doping process. In the following discussion, the semiconductor layer 204, regardless of being doped or not, is referred to as a well 204. The dopant concentration in the well 204 may be in a range of about $1E16$ atom/$cm^3$ to about $1E19$ atom/$cm^3$ in some embodiments, such as in a range of about $1E18$ atom/$cm^3$ to about $1E19$ atom/$cm^3$, depending on well resistance requirements.

Figure 3B:
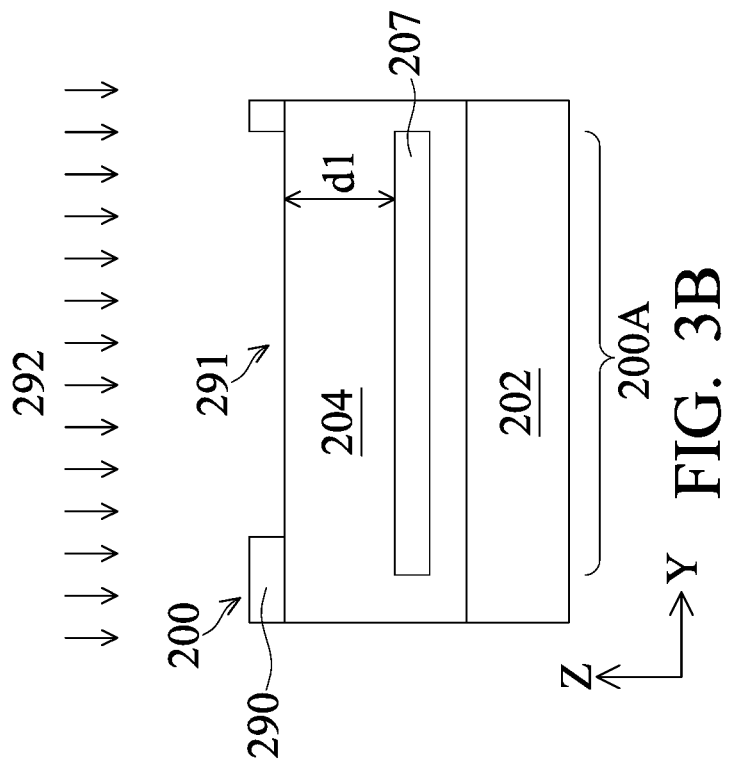
Figure 3A:
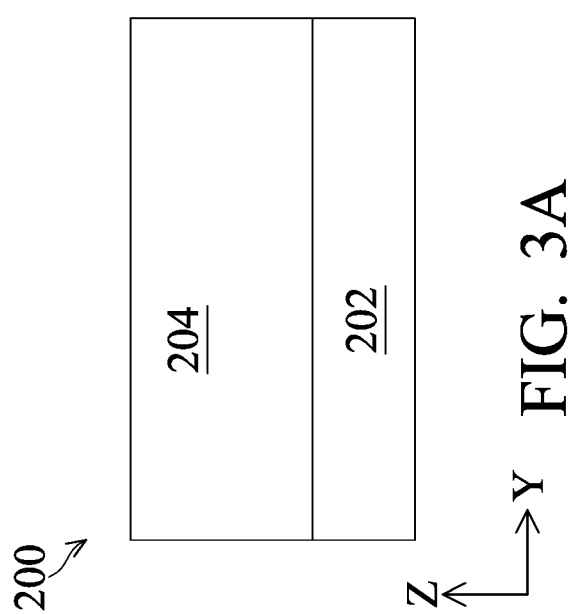

At operation 104, the method 100 (FIG. 2A) implants ions into the well 204 in a region 200A of the semiconductor device 200, such as shown in FIG. 3B. The region 200A is configured for diodes. The ion implantation in the operation 104 is in addition to any ion implantation of forming the well 204. The operation 104 includes multiple steps. First, the operation 104 forms a mask 290 having opening(s) 291. The opening(s) 291 exposes the device 200 in the region 200A and covers the rest of the device 200, such as those areas configured for GAA transistors. Then, the operation 104 performs an ion implantation process 292 that implants ions into the semiconductor layer 204 at a predetermined depth, thereby forming an ion-implanted layer 207. The ion-implanted layer 207 is more heavily doped than the rest of the well 204. The various steps of the operation 104 are further described below.

In an embodiment, the mask 290 includes a patterned resist. In some embodiments, the mask 290 further includes an anti-reflective coating (ARC) layer or other layer(s) under the patterned resist. In some embodiments, operation 104 performs a photolithography process that includes forming a resist layer over the device 200 (e.g., by spin coating), performing a pre-exposure baking process, performing an exposure process using a photomask, performing a post-exposure baking process, and performing a developing process. During the exposure process, the resist layer is exposed to radiation energy (e.g., UV light, DUV light, or EUV light), where the photomask blocks, transmits, and/or reflects radiation to the resist layer depending on a mask pattern of the photomask and/or the type of the photomask (e.g., binary photomask, phase shift photomask, or EUV photomask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the resist layer is patterned into a resist pattern that corresponds with the photomask. Alternatively, the exposure process can be implemented or replaced by other methods, such as maskless lithography, e-beam writing, ion-beam writing, or combinations thereof.

In the present embodiment, the ion-implanted layer 207 is below the top surface of the well 204 by a depth dl, as measured from the top surface of the well 204 to a vertical center of the ion-implanted layer 207. The depth dl is also the projected range (Rp) of the ions in the ion implantation process 292. As will be discussed, some fabrication processes will be applied from the backside of the device 200 (backside processes) to remove the substrate 202 and to etch a contact hole into the semiconductor layers 204 and 207. The contact hole will expose a portion of the ion-implanted layer 207. Thus, the depth dl is designed by taking into account those backside processes and the thickness of the well 204 and to ensure that the ion-implanted layer 207 will be properly exposed by the backside contact hole. In some embodiments, the depth dl is designed based on a remaining thickness of the well 204 after the substrate 202 is removed and the backside contact hole is etched. For example, the depth dl may be designed to be within +/−15 nm of the remaining thickness of the well 204. For example, if the remaining thickness of the well 204 is 55 nm, the depth dl may be provided in a range of about 40 nm to about 70 nm. For example, if the remaining thickness of the well 204 is 25 nm, the depth dl may be provided in a range of about 10 nm to about 40 nm. The thickness of the ion-implanted layer 207 depends on the types of ions and the material of the well 204, such as the amount of straggle during the ion implantation. In some embodiments, the thickness of the ion-implanted layer 207 may be in a range of 10 nm to 30 nm. If the thickness of the ion-implanted layer 207 is too small (such as less than 10 nm), it might not provide sufficient interface with the backside via (for example, it might be substantially removed during the backside via hole etching). If the thickness of the ion-implanted layer 207 is too large (such as more than 30 nm), it might unnecessarily increase the total capacitance of the well 204 and reduce the operating speed of the devices formed thereon.

In an embodiment, the ions implanted into the layer 207 are n-type ions (such as phosphorus, arsenic, other n-type dopant, or combinations thereof) for forming a PN diode 300 where the S/D feature 260 (FIG. 1B) is doped with p-type ions. In another embodiment, the ions implanted into the layer 207 are p-type ions (such as boron, indium, other p-type dopant, or combinations thereof) for forming an NP diode 300 where the S/D feature 260 (FIG. 1B) is doped with n-type ions. The implant energy is designed based on the ion species and the intended depth dl, and the ion dose is designed to provide a heavily doped layer 207 for reducing sheet resistance when contacted by a backside via.

For example, the process 292 may implant phosphorus ions into the well 204 having silicon, with implant energy in a range of 35 keV to 40 keV and ion dose in a range of about $5E14$ ions/cm$^2$ to about $5E15$ ions/cm$^2$. This results in a depth dl in a range of about 40 nm to about 70 nm, a thickness of the layer 207 in a range of about 10 nm to about 30 nm, and a dopant concentration in the layer 207 in a range of about $1E19$ atoms/cm$^3$ to about $1E20$ atoms/cm$^3$. For example, the process 292 may implant boron ions into the well 204 having silicon, with implant energy in a range of 10 keV to 15 keV and ion dose in a range of about $5E14$ ions/cm$^2$ to about $5E15$ ions/cm$^2$. This results in a depth dl in a range of about 40 nm to about 70 nm, a thickness of the layer 207 in a range of about 10 nm to about 30 nm, and a dopant concentration in the layer 207 in a range of about $1E19$ atoms/cm$^3$ to about $1E20$ atoms/cm$^3$. After the ion implantation process 292 finishes, the operation 104 removes the mask 290, for example, using resist stripping and/or other appropriate processes.

At operation 106, the method 100 (FIG. 2A) forms a semiconductor layer stack 201 having semiconductor layers 210 and semiconductor layers 215 stacked vertically in an alternating or interleaving configuration from the top surface of the well 204. The resultant structure is shown in FIG. 3C in an embodiment. The topmost semiconductor layer 215 is labeled as 215a for convenience of discussion. In some embodiments, semiconductor layers 210 and semiconductor layers 215 are epitaxially grown in the depicted interleaving and alternating configuration. For example, a first one of semiconductor layers 210 is epitaxially grown on the well 204, a first one of semiconductor layers 215 is epitaxially grown on the first one of semiconductor layers 215, a second one of semiconductor layers 210 is epitaxially grown on the first one of semiconductor layers 215, and so on until semiconductor layers stack 201 has a desired number of semiconductor layers 210 and semiconductor layers 215. FIG. 3C shows the semiconductor layer stack 201 having three pairs of semiconductor layers 210 and 215 for illustration purposes. In various embodiments, the semiconductor layer stack 201 may include 2 to 10 pairs of semiconductor layers 210 and 215. In some embodiments, epitaxial growth of semiconductor layers 210 and semiconductor layers 215 is achieved by a molecular beam epitaxy (MBE) process, a chemical vapor deposition (CVD) process, a metalorganic chemical vapor deposition (MOCVD) process, other suitable epitaxial growth process, or combinations thereof.

A composition of semiconductor layers 210 is different than a composition of semiconductor layers 215 to achieve etching selectivity and/or different oxidation rates during subsequent processing. In some embodiments, semiconductor layers 210 have a first etch rate to an etchant and semiconductor layers 215 have a second etch rate to the etchant, where the second etch rate is less than the first etch rate. In the depicted embodiment, semiconductor layers 210 and semiconductor layers 215 include different materials, constituent atomic percentages, constituent weight percentages, thicknesses, and/or characteristics to achieve desired etching selectivity during an etching process, such as an etching process implemented to form suspended channel layers in channel regions of the device 200. For example, where semiconductor layers 210 include silicon germanium and semiconductor layers 215 include silicon, a silicon etch rate of semiconductor layers 215 is less than a silicon germanium etch rate of semiconductor layers 210. In some embodiments, semiconductor layers 210 and semiconductor layers 215 can include the same material but with different constituent atomic percentages to achieve the etching selectivity and/or different oxidation rates. For example, semiconductor layers 210 and semiconductor layers 215 can include silicon germanium, where semiconductor layers 210 have a first silicon atomic percent and/or a first germanium atomic percent and semiconductor layers 215 have a second, different silicon atomic percent and/or a second, different germanium atomic percent. The present disclosure contemplates that semiconductor layers 210 and semiconductor layers 215 include any combination of semiconductor materials that can provide desired etching selectivity, desired oxidation rate differences, and/or desired performance characteristics (e.g., materials that maximize current flow), including any of the semiconductor materials disclosed herein. FIG. 3C further shows a hard mask layer 416 over the semiconductor layer stack 201 for protecting the semiconductor layer stack 201 during subsequent patterning process(es).

At operation 108, the method 100 (FIG. 2A) patterns the semiconductor layer stack 201 and the well 204 (including the layer 207) into fins 211, such as shown in FIG. 3D. The fins 211 may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the semiconductor layer stack 201 and is patterned using a photolithography process. Spacers are formed alongside the patterned sacrificial layer using a self-aligned process. The sacrificial layer is then removed, and the remaining spacers, or mandrels, may then be used as a masking element for patterning the fins. For example, the masking element may be used for etching recesses into the semiconductor layer stack 201 and the well 204, resulting in the fins 211. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $C_{12}$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid (HNO₃), and/or acetic acid (CH₃COOH); or other suitable wet etchant. Numerous other embodiments of methods to form the fins may be suitable.

Figure 3E:
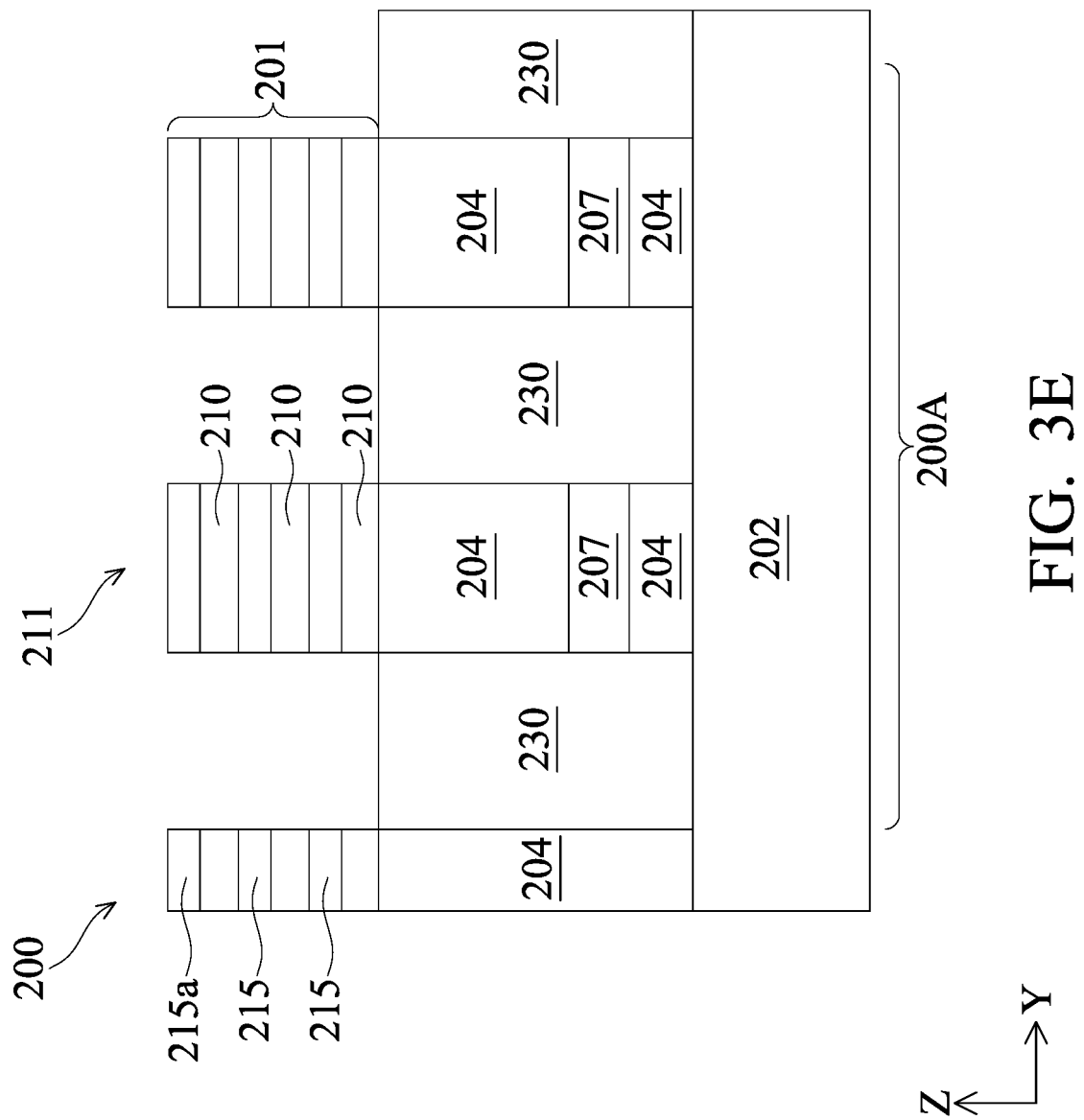
Figures 1, 2, 3, 3H:
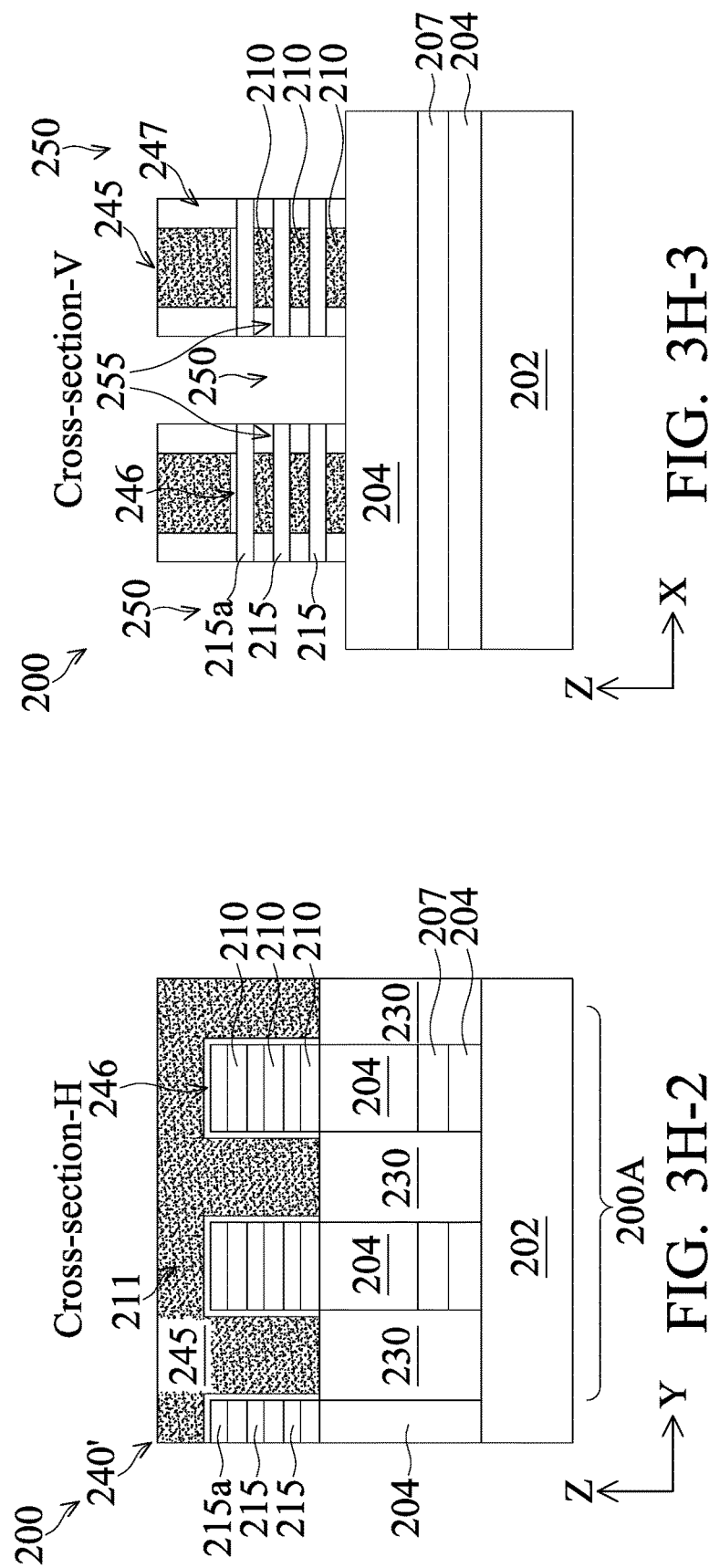

At operation 110, the method 100 (FIG. 2A) forms an isolation structure (or isolation features) 230, such as shown in FIG. 3E. The isolation features 230 can be formed by filling the trenches between the fins 211 with an insulator material, for example, by using a CVD process or a spin-on glass process. A chemical mechanical polishing (CMP) process may be performed to remove excessive insulator material and/or planarize a top surface of isolation features 230. Then an etching back process is performed to recess the isolation features 230 to a desired thickness, such as surrounding a lower portion of the fins 211 and leaving an upper portion of the fins 211 protruding above the isolation features 230. In an embodiment, the hard mask layer 416 is removed during the CMP process or the etching back process.

At operation 112, the method 100 (FIG. 2A) forms sacrificial gate stacks 240' and top gate spacers 247. A resultant structure is shown in FIGS. 3F-1, 3F-2, and 3F-3, according to an embodiment. FIG. 3F-1 is a top view of the device 200, in portion, and FIGS. 3F-2 and 3F-3 are cross-sectional views of the device 200, in portion, along the "Cross-section-H" line and the "Cross-section-V" line of the FIG. 3F-1, respectively. The sacrificial gate stack 240' are oriented lengthwise along the "y" direction, while the fins 211 are oriented lengthwise along the "x" direction. The sacrificial gate stack 240' includes a sacrificial gate dielectric layer 246 and a sacrificial gate electrode layer 245. The sacrificial gate dielectric layer 246 is formed on top and sidewalls of the fins 211 and the sacrificial gate electrode layer 245 is formed on the sacrificial gate dielectric layer 246. In embodiments, the sacrificial gate dielectric layer 246 may include a dielectric material, such as silicon oxide, silicon oxynitride, a high-k dielectric material, other suitable dielectric material, or combinations thereof; and the sacrificial gate electrode layer 245 includes a suitable dummy gate material, such as polysilicon layer. The operation 112 may deposit the sacrificial gate electrode layer 245 and the sacrificial gate dielectric layer 246 using CVD, PVD, ALD, HDPCVD, MOCVD, RPCVD, PECVD, LPCVD, ALCVD, APCVD, other suitable methods, or combinations thereof. Then, the operation 112 may perform lithography patterning and etching process to pattern the sacrificial gate electrode layer 245 and the sacrificial gate dielectric layer 246. Then, the operation 112 forms the gate spacers 247 on the sidewalls of the sacrificial gate stacks 240' by deposition and etching processes. The gate spacers 247 may include a material selected from a group consisting of SiO₂, Si₃N₄, carbon doped oxide, nitrogen doped oxide, porous oxide, air gap, or a combination thereof.

At operation 114, the method 100 (FIG. 2A) etches the fins 211 adjacent the gate spacers 247 to form S/D trenches (or recesses) 250, such as shown in FIGS. 3G-1, 3G-2, and 3G-3. FIG. 3G-1 is a top view of the device 200, in portion, and FIGS. 3G-2 and 3G-3 are cross-sectional views of the device 200, in portion, along the "Cross-section-H" line and the "Cross-section-V" line of the FIG. 3G-1, respectively. In the depicted embodiment, an etching process completely removes semiconductor layer stack 201 in source/drain regions of fins 211 and further extends into the well 204 in the source/drain regions. The etching process can include a dry etching process, a wet etching process, other suitable etching process, or combinations thereof. In some embodiments, the etching process is a multi-step etch process. For example, the etching process may alternate etchants to separately and alternately remove semiconductor layers 210 and semiconductor layers 215. In some embodiments, parameters of the etching process are configured to selectively etch semiconductor layer stack with minimal (to no) etching of the gate stacks 240', the gate spacers 247, and the isolation features 230. The operation 114 also forms gaps 418 between the semiconductor layers 215. For example, an etching process is performed that selectively etches semiconductor layers 210 exposed by source/drain trenches 250 with minimal (to no) etching of semiconductor layers 215, such that gaps 418 are formed between semiconductor layers 215 and between semiconductor layers 215 and the well 204 under the gate spacers 247. The etching process may be a dry etching process, a wet etching process, other suitable etching process, or combinations thereof.

At operation 116, the method 100 (FIG. 2A) forms inner spacers 255 in the gaps 418, such as shown in FIGS. 3H-1, 3H-2, and 3H-3. FIG. 3H-1 is a top view of the device 200, in portion, and FIGS. 3H-2 and 3H-3 are cross-sectional views of the device 200, in portion, along the "Cross-section-H" line and the "Cross-section-V" line of the FIG. 3H-1, respectively. For example, a deposition process forms a spacer layer over gate structures 240' and over features defining source/drain trenches 250. The deposition process may be CVD, PVD, ALD, HDPCVD, MOCVD, RPCVD, PECVD, LPCVD, ALCVD, APCVD, other suitable methods, or combinations thereof. The spacer layer partially (and, in some embodiments, completely) fills the source/drain trenches 250. The deposition process is configured to ensure that the spacer layer fills the gaps 418. An etching process is then performed that selectively etches the spacer layer to form inner spacers 255 as depicted in FIG. 3H-3 with minimal (to no) etching of semiconductor layers 215, sacrificial gate stacks 240', and gate spacers 247. The spacer layer (and thus inner spacers 255) includes a material that is different than a material of semiconductor layers 215 and a material of gate spacers 247 to achieve desired etching selectivity during the second etching process. The inner spacers 255 may include a material selected from a group consisting of SiO₂, Si₃N₄, SiON, SiOC, SiOCN, nitride base dielectric material, air gap, or a combination thereof.

Figures 1, 3I:
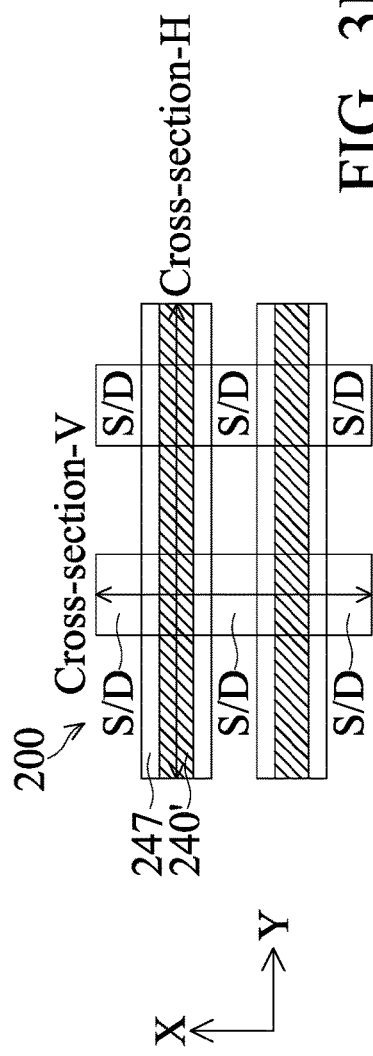
Figures 3, 3I:
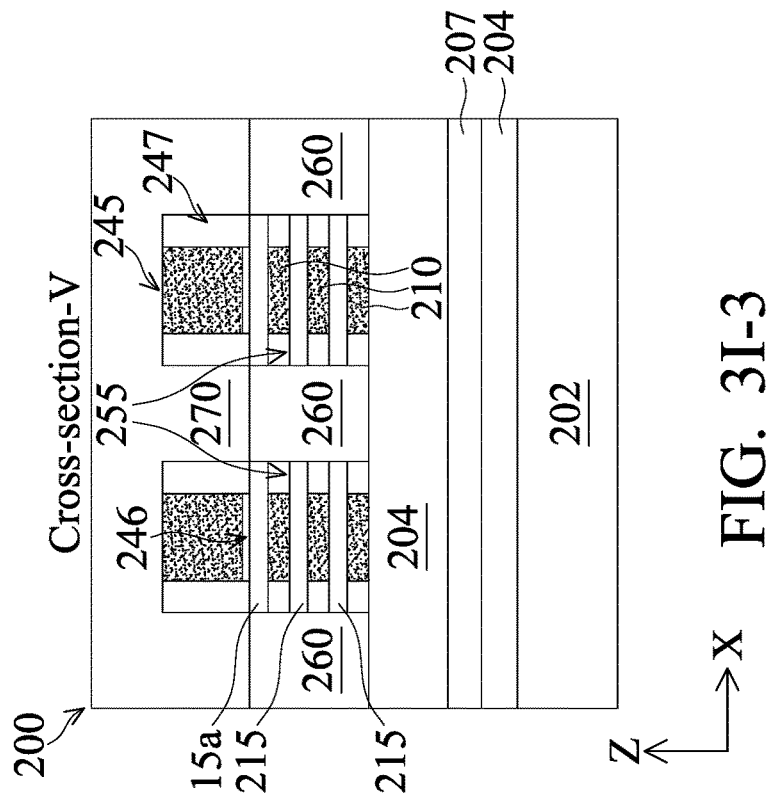
Figures 2, 3I:
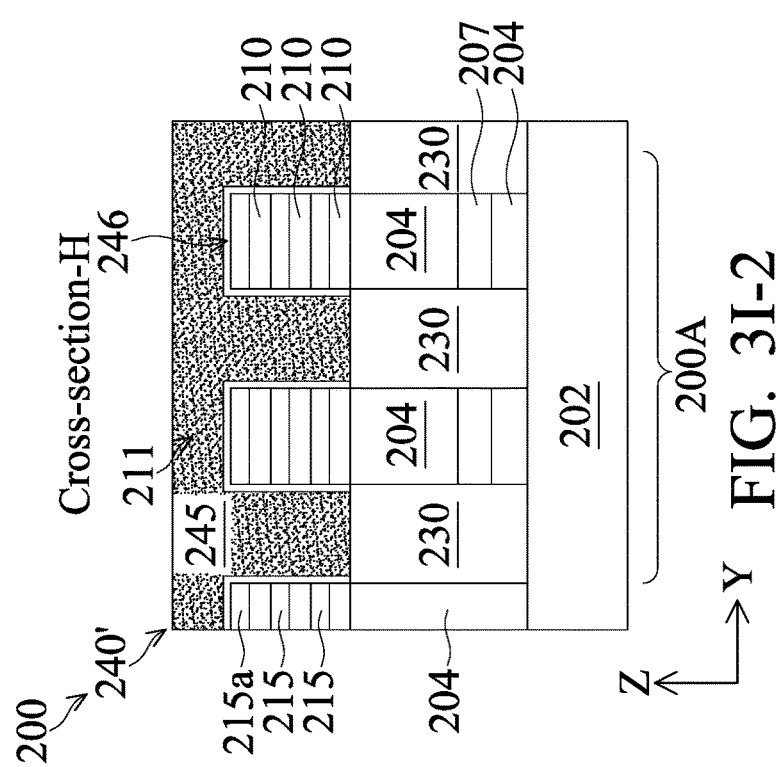

At operation 118, the method 100 (FIG. 2B) epitaxially grows the S/D features 260 and forms ILD layer 270, such as shown in FIGS. 3I-1, 3I-2, and 3I-3. FIG. 3I-1 is a top view of the device 200, in portion, and FIGS. 3I-2 and 3I-3 are cross-sectional views of the device 200, in portion, along the "Cross-section-H" line and the "Cross-section-V" line of the FIG. 3I-1, respectively. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the well 204 and the semiconductor layers 215. In some embodiments, the epitaxial source/drain features 260 may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). In some embodiments, the epitaxial source/drain features 260 may include silicon germanium or germanium and may be doped with boron, other p-type dopant, or combinations thereof (for example, forming Si:Ge:B epitaxial source/drain features). In some embodiments, epitaxial source/drain features 260 include more than one epitaxial semiconductor layer, where the epitaxial semiconductor layers can include the same or different materials and/or dopant concentrations. The dopants in the source/drain features 260 and the ion-implanted layer 207 have opposite conductivity types. In an embodiment, the source/drain features 260 include p-type dopants and the ion-implanted layer 207 include n-type dopants thereby forming PN diode 300 (FIG. 1B). In another embodiment, the source/drain features 260 include n-type dopants and the ion-implanted layer 207 include p-type dopants thereby forming NP diode 300 (FIG. 1B). In some embodiments, epitaxial source/drain features 260 are doped during deposition by adding impurities to a source material of the epitaxy process (i.e., in-situ). In some embodiments, epitaxial source/drain features 260 are doped by an ion implantation process subsequent to a deposition process. In some embodiments, annealing processes (e.g., rapid thermal annealing (RTA) and/or laser annealing) are performed to activate dopants in epitaxial source/drain features 260 and the ion-implanted layer 207. In some embodiments, n-type and p-type epitaxial source/drain features 260 are formed in separate processing sequences that include, for example, masking PMOS GAA transistor regions and PN diode regions when forming n-type epitaxial source/drain features 260 in NMOS GAA transistor regions and in NP diode regions, and masking NMOS GAA transistor regions and NP diode regions when forming epitaxial source/drain features 260 in PMOS GAA transistor regions and PN diode regions. After the S/D features 260 are epitaxially grown, the operation 118 forms a CESL (not shown) over the S/D features 260 and the gate structures 240' and form the ILD layer 270 over the CESL. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods. The ILD layer 270 may comprise tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or combinations thereof. The ILD 270 may be formed by PECVD (plasma enhanced CVD), FCVD (flowable CVD), or other suitable methods.

At operation 120, the method 100 (FIG. 2B) replaces the sacrificial gate stacks 240' with high-k metal gates 240, such as shown in FIGS. 3J-1, 3J-2, and 3J-3. FIG. 3J-1 is a top view of the device 200, in portion, and FIGS. 3J-2 and 3J-3 are cross-sectional views of the device 200, in portion, along the "Cross-section-H" line and the "Cross-section-V" line of the FIG. 3J-1, respectively. Operation 120 involves multiple steps including removing the sacrificial gate stacks 240' to form gate trenches, selectively removing the semiconductor layers 210 from the gate trenches to result in the semiconductor layers 215 suspended between the S/D features 260 (this is also referred to as a channel release process), and depositing the high-k metal gates 240 in the gate trenches and wrapping around each of the semiconductor layers 215. Each gate stack 240 includes a gate dielectric layer 349 and a gate electrode 350. The gate dielectric layer 349 may include a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide ($k \approx 3.9$). The gate dielectric layer 349 may be formed by chemical oxidation, thermal oxidation, atomic layer deposition (ALD), chemical vapor deposition (CVD), and/or other suitable methods. In some embodiments, the gate stacks 240 further include an interfacial layer between the gate dielectric layer 349 and the channel layers 215. The interfacial layer may include silicon dioxide, silicon oxynitride, or other suitable materials. The gate electrode 350 may include a work function metal layer and a low resistance metal fill layer in various embodiments. The work function metal layer may include an n-type work function layer or a p-type work function layer. For example, an n-type work function layer may comprise titanium, aluminum, tantalum carbide, tantalum carbide nitride, tantalum silicon nitride, or combinations thereof. For example, a p-type work function layer may comprise titanium nitride, tantalum nitride, ruthenium, molybdenum, tungsten, platinum, or combinations thereof. The low resistance metal fill layer may include tungsten, ruthenium, copper, and/or other suitable materials; and may be formed by CVD, PVD, plating, and/or other suitable processes. In a passive two-port diode, the gate stack 240 and the source/drain features 260 may be tied together to act as one port, while the ion-implanted layer 207 and the backside via 282 (FIG. 1B) act as another port.

At operation 122, the method 100 (FIG. 2B) performs further fabrications to the frontside of the device 200. In an example, the operation 122 forms silicide features on the S/D features 260, form S/D contacts 282' (see FIG. 1C) on the silicide features, form gate vias 286 (see FIG. 1C) on the gate stacks 240, form S/D contact vias 288 (see FIG. 1C) on the S/D contacts 282', form one or more interconnect layers (e.g., having metal lines) disposed on the ILD layer 270, form a passivation layer over the interconnect layers, and so on. Further, the method 100 may form GAA transistors and/or other types of transistors in various regions of the device 200 while forming the features for the diodes 300. In other words, the diodes 300 are integrated with GAA transistors or other types of transistors in the device 200, where the diodes 300 and the transistors share the same substrate 202, isolation features 230, ILD layer 270, and many other dielectric and/or conductive layers. In the present embodiments, the various layers over the gate stacks 240, the ILD 270, and the S/D features 260 are collectively denoted with a layer 277 as shown in FIGS. 3K-1, 3K-2, and 3K-3. FIG. 3K-1 is a top view of the device 200, in portion, and FIGS. 3K-2 and 3K-3 are cross-sectional views of the device 200, in portion, along the "Cross-section-H" line and the "Cross-section-V" line of the FIG. 3K-1, respectively.

At operation 124, the method 100 (FIG. 2B) attaches the frontside of the device 200 to a carrier 370, such as shown in in FIGS. 3L-1, 3L-2, and 3L-3. FIG. 3L-1 is a top view of the device 200, in portion, and FIGS. 3L-2 and 3L-3 are cross-sectional views of the device 200, in portion, along the "Cross-section-H" line and the "Cross-section-V" line of the FIG. 3L-1, respectively. This makes the device 200 accessible from its backside for further processing. The operation 124 may use any suitable attaching processes, such as direct bonding, hybrid bonding, using adhesive, or other bonding methods. The operation 124 may further include alignment, annealing, and/or other processes. The carrier 370 may be a silicon wafer in some embodiment.

At operation 126, the method 100 (FIG. 2B) thins down the device 200 from its backside until the wells 204 (being part of the fins 211, see FIG. 3D) and the isolation features 230 are exposed from the backside of the device 200. The resultant structure is shown in FIGS. 3M-1, 3M-2, and 3M-3 according to an embodiment. FIG. 3M-1 is a top view of the device 200, in portion, and FIGS. 3M-2 and 3M-3 are cross-sectional views of the device 200, in portion, along the "Cross-section-H" line and the "Cross-section-V" line of the FIG. 3M-1, respectively. The thinning process may include a mechanical grinding process and/or a chemical thinning process. A substantial amount of substrate material may be first removed from the substrate 202 during a mechanical grinding process. Afterwards, a chemical thinning process may apply an etching chemical to the backside of the substrate 202 to further thin down the substrate 202.

At operation 128, the method 100 (FIG. 2B) etches the wells 204 to form contact holes 278 from the backside of the device 200. The resultant structure is shown in FIGS. 3N-1, 3N-2, and 3N-3 according to an embodiment. FIG. 3N-1 is a top view of the device 200, in portion, and FIGS. 3N-2 and 3N-3 are cross-sectional views of the device 200, in portion, along the "Cross-section-H" line and the "Cross-section-V" line of the FIG. 3N-1, respectively. In an embodiment, the contact holes 278 may have a rectangular shape, like the shape of the contact 282 in FIG. 1A. In alternative embodiments, the contact holes 278 may be circular or in other shapes. In the present embodiment, the etching process in the operation 128 is controlled such that the contact holes 278 expose the ion-implanted layer 207 in the well 204. The etching process may etch and remove part of the ion-implanted layer 207, but at least a portion of the ion-implanted layer 207 remains in the well 204. The operation 128 may involve a variety of process such as photolithography and etching processes, as will be discussed below.

In an embodiment, the operation 128 forms an etch mask over the backside of the device 200. The etch mask covers the area under the S/D features 260 that the contact holes 278 are to be etched (i.e., the diode region 200A) and exposes other areas (such as areas outside the diode region 200A). The etch mask includes a material that is different than a material of the wells 204 to achieve etching selectivity. In an embodiment, the etch mask includes a patterned resist over a patterned hard mask (such as a patterned mask having silicon nitride) and is formed by deposition, photolithography, and etching processes. Subsequently, the operation 128 selectively etches the wells 204 through the etch mask to form trenches. The etch mask may be partially or completely consumed during the etching process. Then, the operation 128 forms one or more dielectric layers 276 filling the trenches, such as depicted in FIG. 3N-2 according to an embodiment. Afterwards, the operation 128 etches the wells 204, resulting in the contact holes (or via holes) 278. The etching process(es) can be dry etching, wet etching, reactive ion etching, or other etching methods and are tuned to selective etch the materials of the well 204 and with no (or minimal) etching to the isolation features 230 and the dielectric layer(s) 276.

Figures 1, 3O:
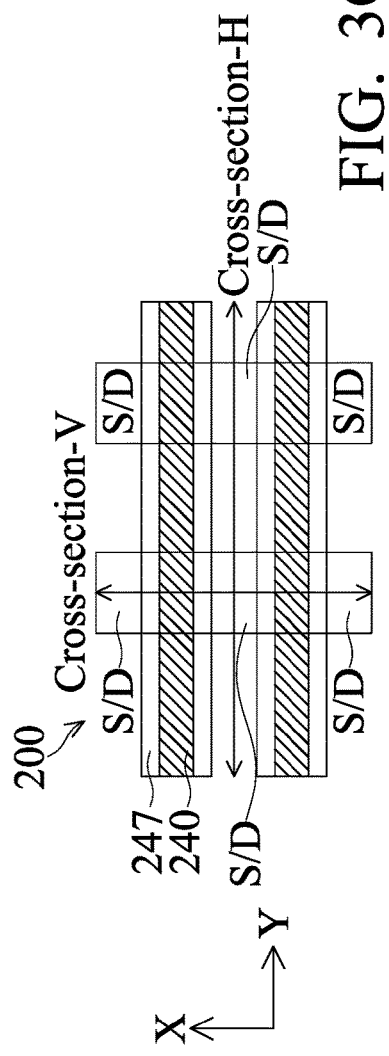
Figures 3, 3O:
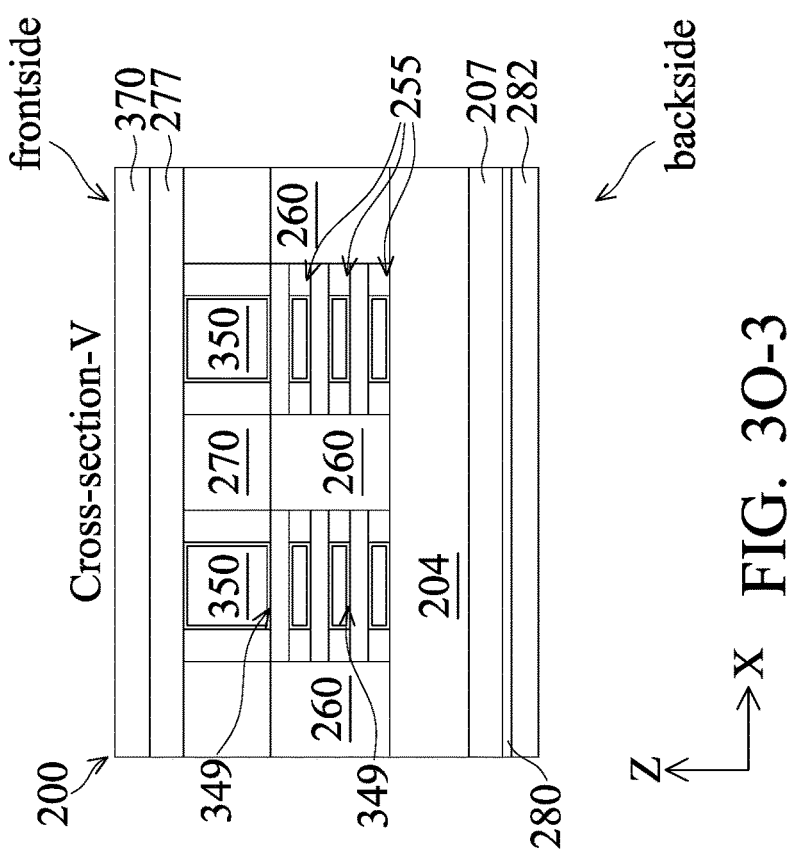
Figures 2, 3O:
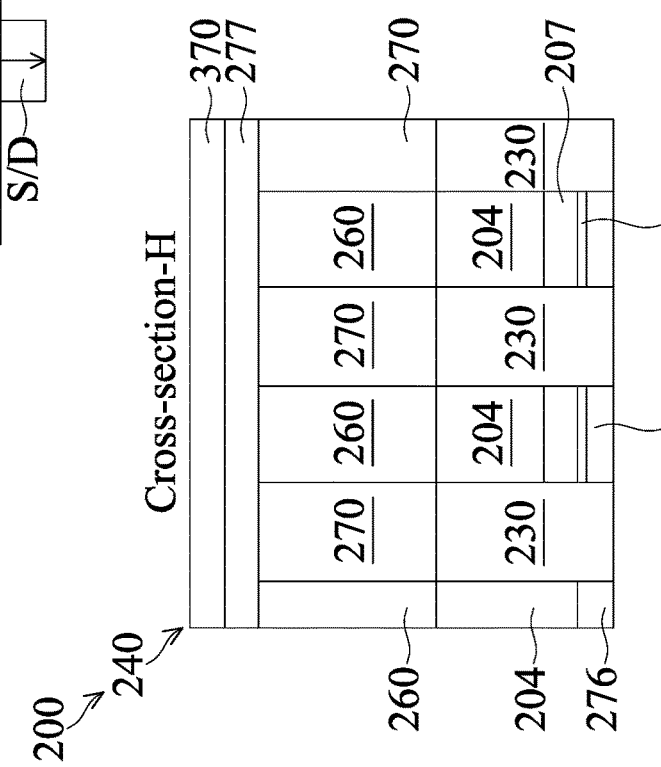

At operation 130, the method 100 (FIG. 2B) forms a silicide feature 280 and a backside contact (or backside via) 282 in the contact hole 278, such as shown in FIGS. 3O-1, 3O-2, and 3O-3 according to an embodiment. FIG. 3O-1 is a top view of the device 200, in portion, and FIGS. 3O-2 and 3O-3 are cross-sectional views of the device 200, in portion, along the "Cross-section-H" line and the "Cross-section-V" line of the FIG. 3O-1, respectively. The silicide feature 280 is in direct contact with the ion-implanted layer 207 to reduce the sheet resistance of the backside contacts 282. In an embodiment, the operation 130 includes depositing one or more metals into the contact hole 278, performing an annealing process to the device 200 to cause reaction between the one or more metals and the ion-implanted layer 207 to produce the silicide feature 280, and removing un-reacted portions of the one or more metals, leaving the silicide feature 280 in the contact hole 278. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD, PVD, ALD, or other suitable methods. The silicide feature 280 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

After forming the silicide feature 280, the operation 130 forms the backside contact (or backside via) 282 over the silicide feature 280. In an embodiment, the contact 282 may include tungsten (W), cobalt (Co), molybdenum (Mo), ruthenium (Ru), copper (Cu), nickel (Ni), titanium (Ti), tantalum (Ta), aluminum (Al), titanium nitride (TiN), tantalum nitride (TaN), or other metals, and may be formed by CVD, PVD, ALD, plating, or other suitable processes. The contact 282 may include more than one layers of materials in some embodiments. For example, the contact 282 may include a barrier layer on the surfaces of the contact hole 278 and one or more low-resistance metals on the barrier layer. The barrier layer may include titanium (Ti), tantalum (Ta), titanium nitride (TiN), tantalum nitride (TaN), tungsten (W), cobalt (Co), ruthenium (Ru), or other suitable material, and the low-resistance metals may include tungsten (W), cobalt (Co), molybdenum (Mo), ruthenium (Ru), aluminum (Al), or other metals. The operation 130 may perform a CMP process to remove excessive materials of the via 282.

At operation 132, the method 100 (FIG. 2B) forms one or more backside metal tracks 284. The metal tracks 284 may function as backside power rails in some embodiments. The resultant structure is shown in FIGS. 3P-1, 3P-2, and 3P-3 according to an embodiment. FIG. 3P-1 is a top view of the device 200, in portion, and FIGS. 3P-2 and 3P-3 are cross-sectional views of the device 200, in portion, along the "Cross-section-H" line and the "Cross-section-V" line of the FIG. 3P-1, respectively. As illustrated in FIGS. 3P-2 and 3P-3, the backside contacts 282 are electrically connected to the backside metal tracks 284. In an embodiment, the backside metal tracks 284 may be formed using a damascene process, a dual-damascene process, a metal patterning process, or other suitable processes. The backside metal tracks 284 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. As shown in FIGS. 3P-1, 3P-2, and 3P-3, the backside metal tracks 284 are embedded in one or more dielectric layers 285. Having backside metal tracks 284 beneficially increases the number of metal tracks available in the device 200 for directly connecting to source/drain contacts and vias. It also increases the gate density for greater device integration than other structures without the backside metal tracks 284. The backside metal tracks 284 may have wider dimension than the first level metal (M0) tracks on the frontside of the device 200, which beneficially reduces the backside metal tracks resistance.

The method 100 (FIG. 2B) may perform further fabrication processes to the device 200. For example, it may form one or more interconnect layers on the backside of the structure 200, form passivation layers on the backside of the device 200, perform other BEOL processes, and remove the carrier 370.

Figure 4:
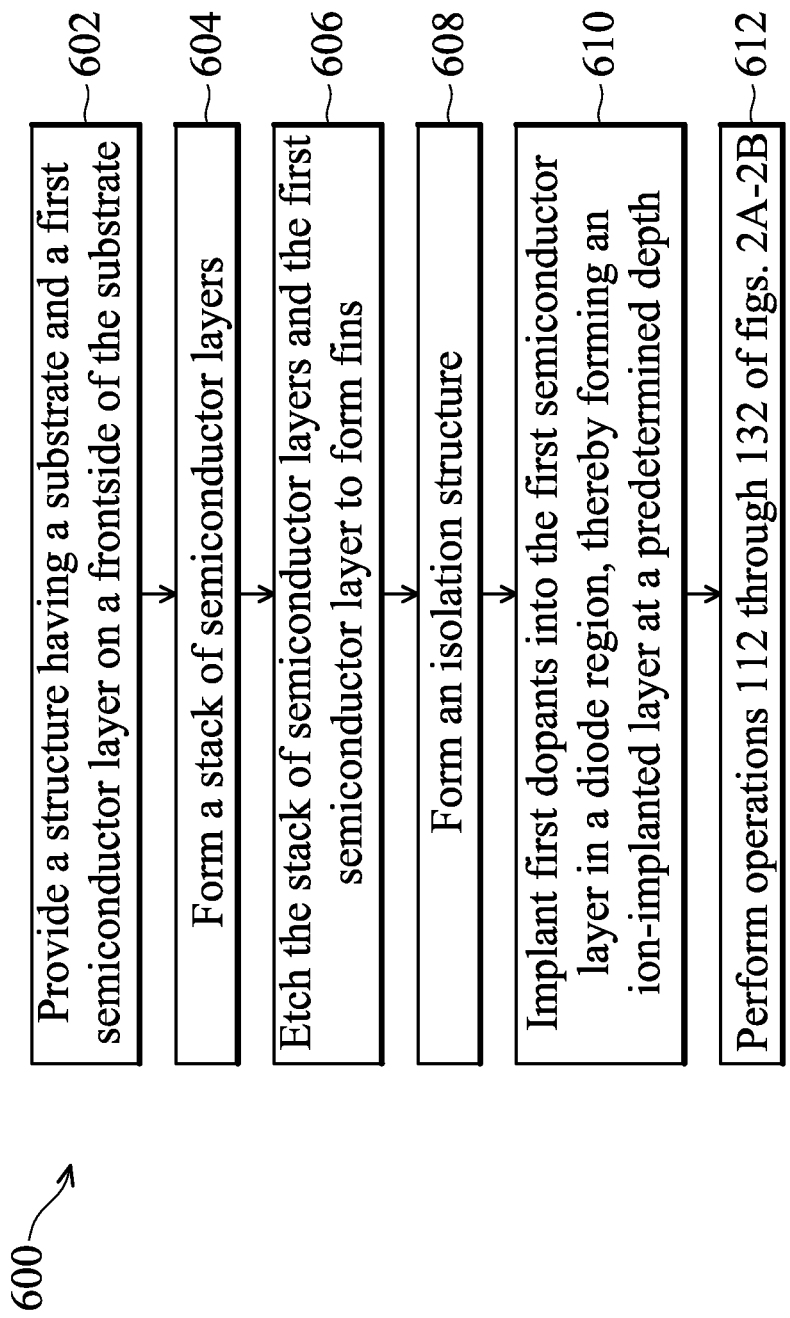
FIG. 4 shows a flow chart of a method of fabricating a semiconductor device, according to various aspects of the present disclosure.

FIG. 4 is a flow chart of a method 600 for fabricating a semiconductor device having an embodiment of the diodes 300, according to various aspects of the present disclosure. Additional processing is contemplated by the present disclosure. Additional operations can be provided before, during, and after method 600, and some of the operations described can be moved, replaced, or eliminated for additional embodiments of method 600. Many aspects of the method 600 are the same as or similar to those of the method 100, with like reference numerals denoting like features. The methods 100 and 600 may be considered two variants of a common method. The method 600 is briefly described below.

Figure 5D:
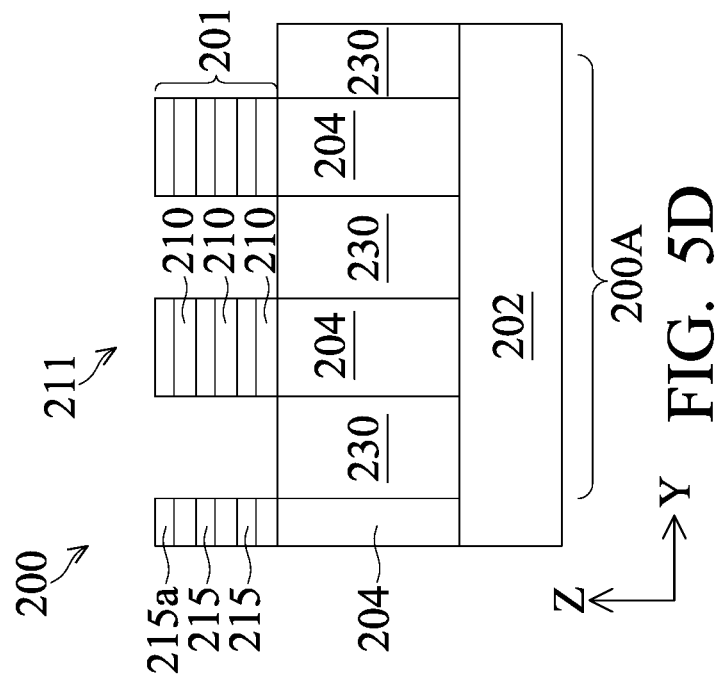
Figure 5C:
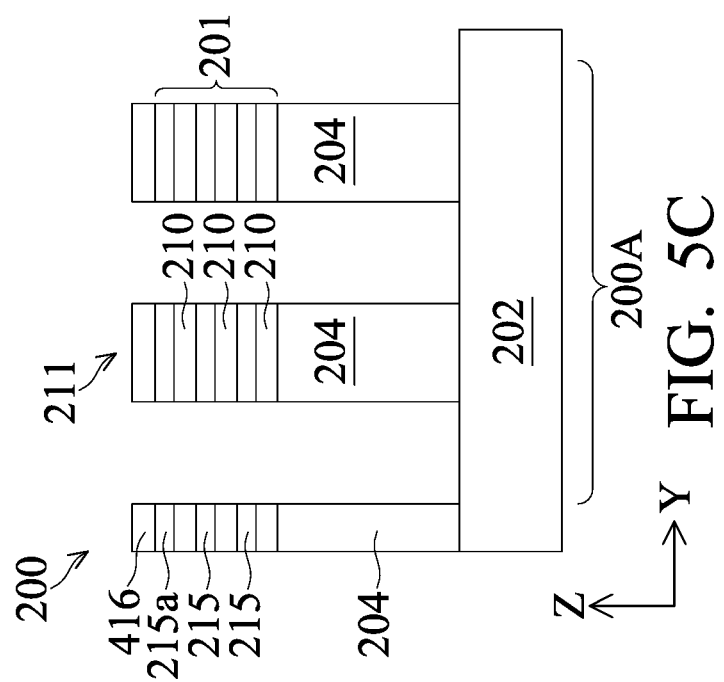

At operation 602, the method 600 (FIG. 4) provides a semiconductor device 200 having a substrate 202 and a semiconductor layer 204 on a frontside of the substrate 202, such as shown in FIG. 5A. At operation 604, the method 600 forms a semiconductor layer stack 201 having semiconductor layers 210 and semiconductor layers 215, such as shown in FIG. 5B. At operation 606, the method 600 patterns the semiconductor layer stack 201 and the well 204 into fins 211, such as shown in FIG. 5C. Then, at operation 608, the method 600 forms an isolation structure (or isolation features) 230, such as shown in FIG. 5D. The operations 602, 604, 606, and 608 are the same as the operations 102, 106, 108, and 110 of the method 100, respectively, with the exception that the ion-implanted layer 207 is not formed during the operations 602 through 608. It is noted that the operation 104 in the method 100 is skipped in the method 600 and is replaced with an operation 610.

Figure 5E:
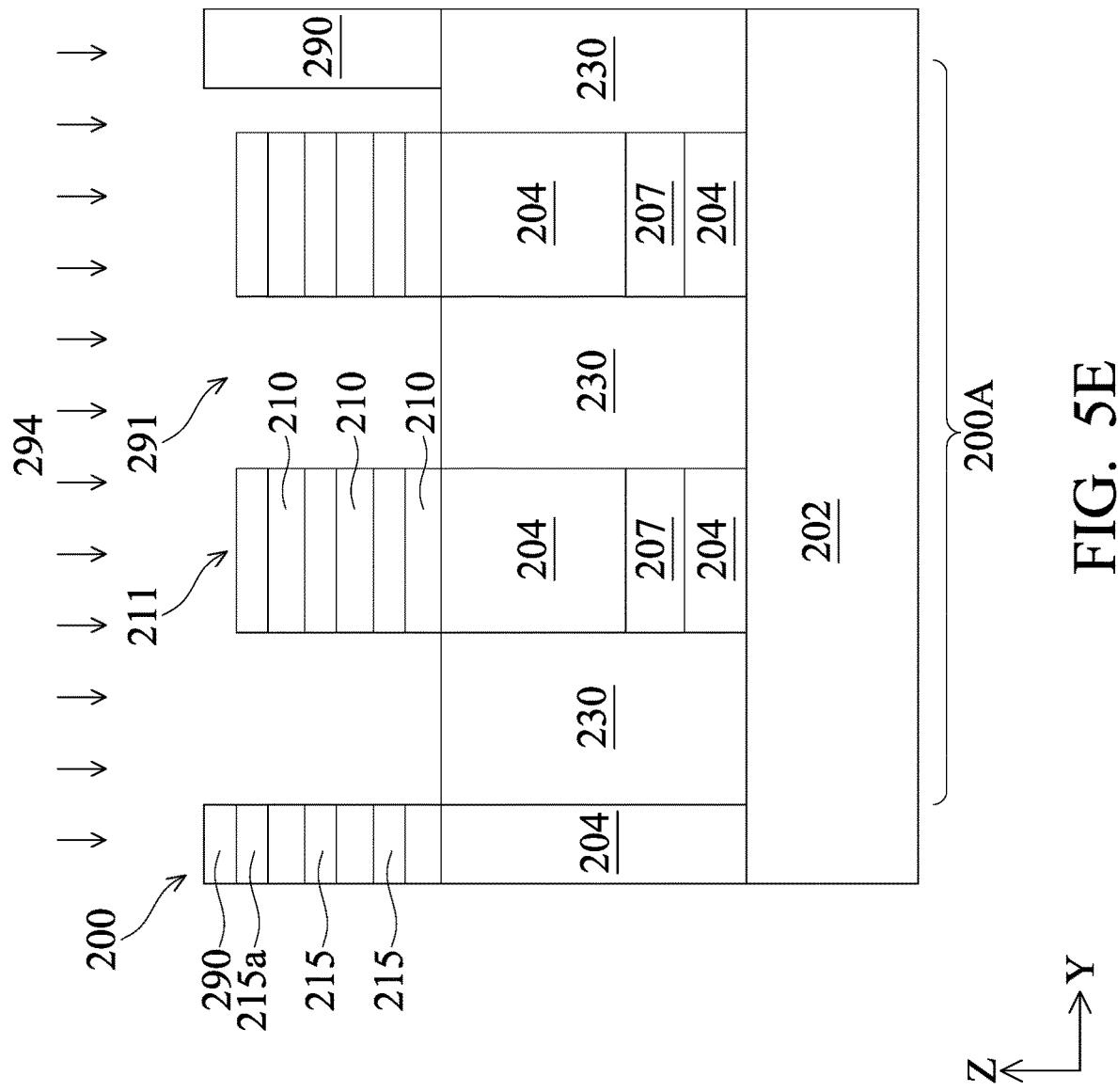

At operation 610, the method 600 (FIG. 4) implants ions into the well 204 in a region 200A of the semiconductor device 200, such as shown in FIG. 5E. The region 200A is configured for diodes. The ion implantation in the operation 610 is similar to the operation 104 with some differences noted below. First, the operation 610 forms a mask 290 having opening(s) 291. The opening(s) 291 exposes the device 200 in the region 200A and covers the rest of the device 200, such as those areas configured for GAA transistors. This aspect is the same as in the operation 104. Then, the operation 610 performs an ion implantation process 294 that implants ions into the semiconductor layer 204 at a predetermined depth, thereby forming an ion-implanted layer 207. The ion-implanted layer 207 is more heavily doped than the rest of the well 204.

In the present embodiment, the ion-implanted layer 207 is below the top surface of the isolation structure 230 by a depth dl, as measured from the top surface of the isolation structure 230 to a vertical center of the ion-implanted layer 207. In an embodiment, the top surface of the isolation structure 230 is substantially coplanar with the top surface of the well 204. The depth dl is also the projected range (Rp) of the ions in the ion implantation process 294. The design of the depth dl has been discussed earlier. In some embodiments, the thickness of the ion-implanted layer 207 may be in a range of 10 nm to 30 nm.

In an embodiment, the ions implanted into the layer 207 are n-type ions (such as phosphorus, arsenic, other n-type dopant, or combinations thereof) for forming a PN diode 300 where the S/D feature 260 (FIG. 1B) is doped with p-type ions. In another embodiment, the ions implanted into the layer 207 are p-type ions (such as boron, indium, other p-type dopant, or combinations thereof) for forming an NP diode 300 where the S/D feature 260 (FIG. 1B) is doped with n-type ions. The implant energy is designed based on the ion species and the intended depth dl, and the ion dose is designed to provide a heavily doped layer 207 for reducing sheet resistance when contacted by a backside via.

For example, the process 294 may implant phosphorus ions into the well 204 having silicon, with implant energy in a range of 60 keV to 65 keV and ion dose in a range of about $1E15$ ions/cm$^2$ to about $8E15$ ions/cm$^2$. This results in a depth dl in a range of about 40 nm to about 70 nm, a thickness of the layer 207 in a range of about 10 nm to about 30 nm, and a dopant concentration in the layer 207 in a range of about $1E19$ atoms/cm$^3$ to about $1E20$ atoms/cm$^3$. For example, the process 292 may implant boron ions into the well 204 having silicon, with implant energy in a range of 20 keV to 25 keV and ion dose in a range of about $1E15$ ions/cm$^2$ to about $8E15$ ions/cm$^2$. This results in a depth dl in a range of about 40 nm to about 70 nm, a thickness of the layer 207 in a range of about 10 nm to about 30 nm, and a dopant concentration in the layer 207 in a range of about $1E19$ atoms/cm$^3$ to about $1E20$ atoms/cm$^3$. It is noted that to achieve the same depth dl and the same dopant concentration in the layer 207 as in the operation 104, the operation 610 applies higher doping energy and higher ion dose because the ions need to go through the semiconductor layer stack 201 in the operation 610 but not in the operation 104. After the ion implantation process 294 finishes, the operation 610 removes the mask 290, for example, using resist stripping and/or other appropriate processes.

At operation 612, the method 600 (FIG. 4) proceeds to further fabrication steps that are the same as the operations 112 through 132 of the method 100. For simplicity, the discussion of the operation 612 is omitted.

Figure 6A:
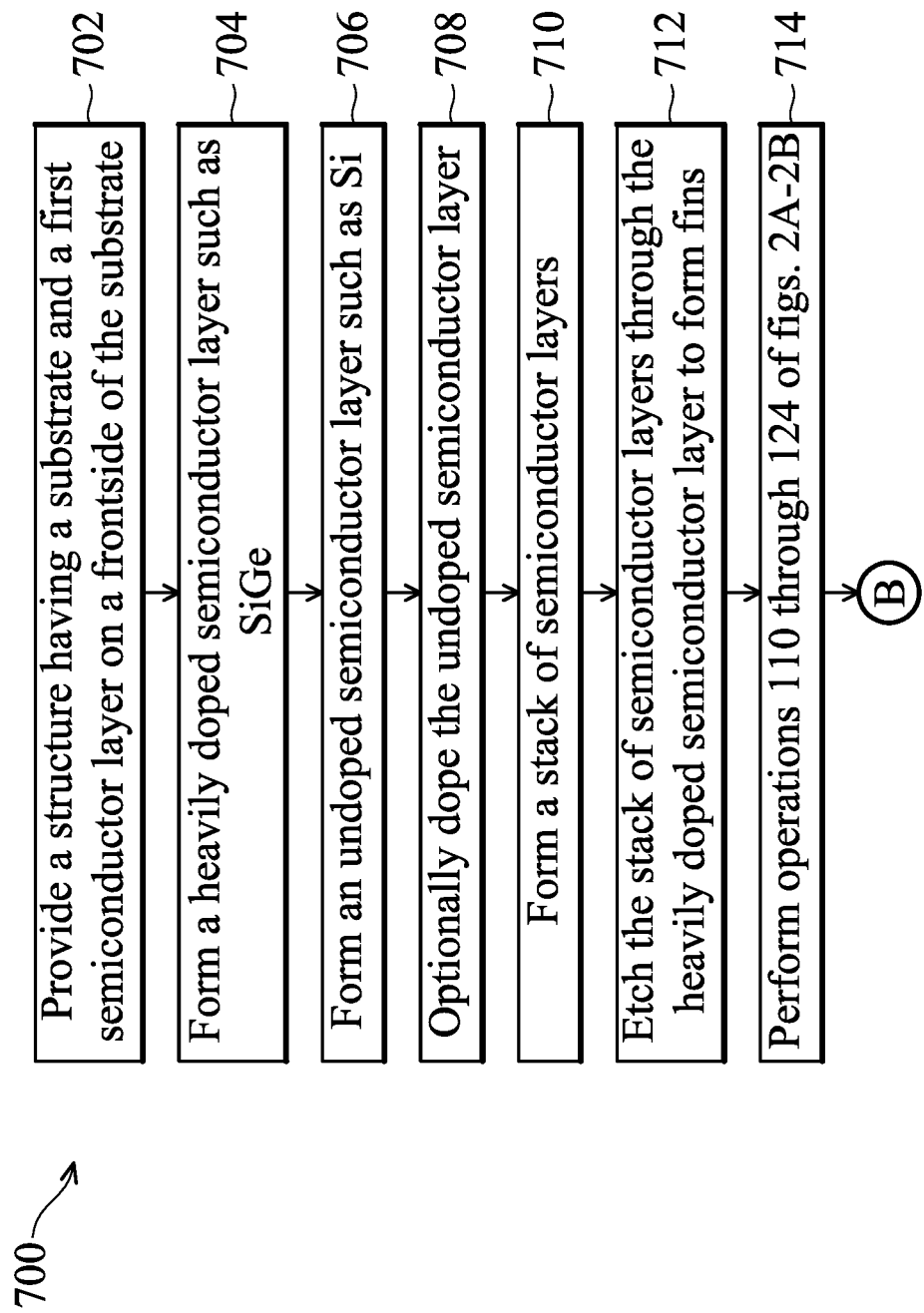
FIGS. 6A and 6B show a flow chart of a method of fabricating a semiconductor device, according to various aspects of the present disclosure.
Figure 6B:
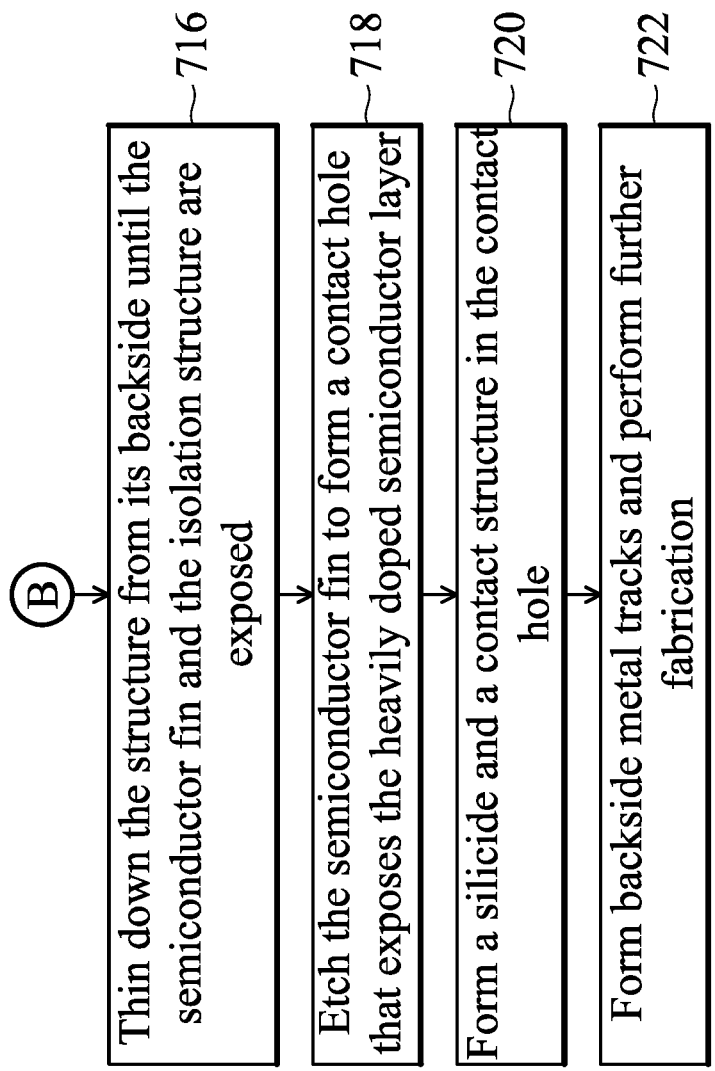

FIGS. 6A and 6B show a flow chart of a method 700 for fabricating a semiconductor device having an embodiment of the diode 300, according to various aspects of the present disclosure. Additional processing is contemplated by the present disclosure. Additional operations can be provided before, during, and after method 700, and some of the operations described can be moved, replaced, or eliminated for additional embodiments of method 700. Many aspects of the method 700 are the same as or similar to those of the method 100, with like reference numerals denoting like features. The methods 100 and 700 may be considered two variants of a common method. The method 700 is briefly described below.

Figure 7B:
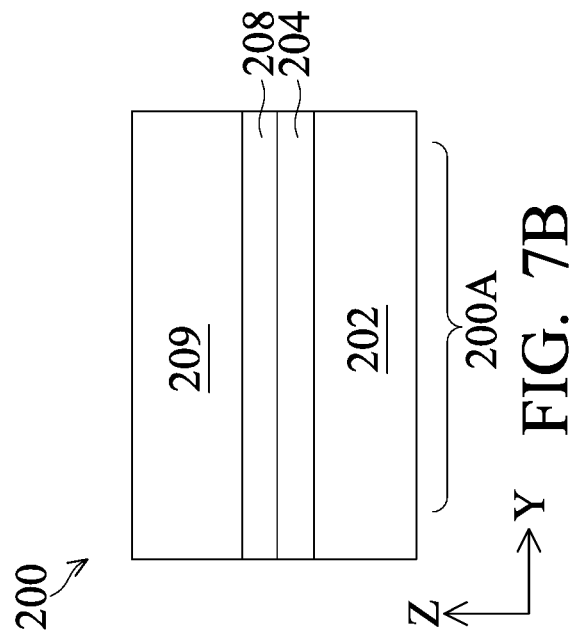
Figure 7A:
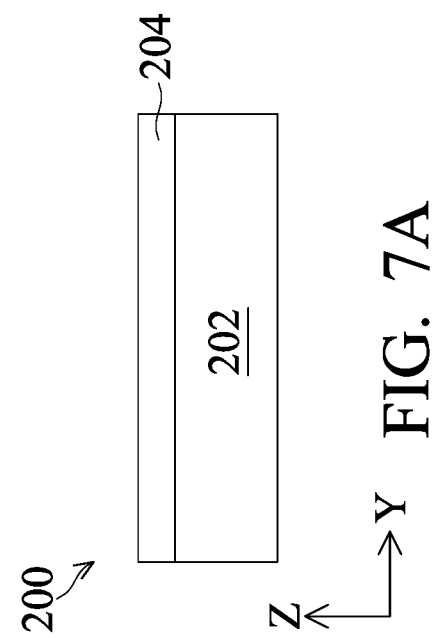

At operation 702, the method 700 (FIG. 6A) provides a semiconductor device 200 having a substrate 202 and a semiconductor layer 204 on a frontside of the substrate 202, such as shown in FIG. 7A. The operation 702 is the same as or substantially similar to the operation 102. At operation 704, the method 700 (FIG. 6A) forms a heavily doped layer 208 over the semiconductor layer 204, such as shown in FIG. 7B. In an embodiment, the heavily doped layer 208 is formed by epitaxially growing a semiconductor layer 208 over the semiconductor layer 204 and doping the semiconductor layer 208 with one or more dopants in-situ or ex-situ. An epitaxy process can use CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of the well 204. In the present embodiment, the semiconductor layer 208 includes silicon germanium or germanium and is doped with boron, other p-type dopant, or combinations thereof (for example, forming Si:Ge:B epitaxial source/drain features). In an embodiment, the semiconductor layer 208 includes silicon germanium with germanium content at about 15 atomic percent to about 35 atomic percent, and is doped with boron at a dopant concentration about 1E20 atoms/cm$^3$ to about 1E21 atoms/cm$^3$. Further, the semiconductor layer 208 may be formed to have a thickness in a range of about 10 nm to about 20 nm in some embodiments.

At operation 706, the method 700 (FIG. 6A) forms a semiconductor layer 209 over the heavily doped layer 208, such as shown in FIG. 7B. In an embodiment, the semiconductor layer 209 is formed by an epitaxy process that uses gaseous and/or liquid precursors interacting with the composition of the semiconductor layer 208. In the present embodiment, the semiconductor layer 209 includes silicon and is undoped. The semiconductor layer 209 may be formed to have a thickness in a range of about 40 nm to about 50 nm in some embodiments. In an embodiment, the semiconductor layers 208 and 209 are formed in the same process chamber. For example, the semiconductor layer 208 is epitaxially grown with a first set of precursors to form a silicon germanium layer and is in-situ doped, and then the semiconductor layer 209 is epitaxially grown with different precursors to form a silicon layer.

At operation 708, the method 700 (FIG. 6A) may optionally dope the semiconductor layer 209, for example, with one or more dopants that have the same conductivity type as the dopants in the heavily doped layer 208. The dopant concentration in the semiconductor layer 209 is lower than that in the heavily doped layer 208. In an embodiment, the semiconductor layer 208 includes silicon germanium and is doped with boron at a dopant concentration about 1E20 atoms/cm$^3$ to about 1E21 atoms/cm$^3$, and the semiconductor layer 209 is either undoped or lightly doped with boron at a dopant concentration about 1E16 atom/cm$^3$ to about 1E19 atom/cm$^3$. The operation 708 is optional and may be skipped in some embodiments of the method 700. When the operation 708 is skipped, the semiconductor layer 209 remains undoped.

Figure 7C:
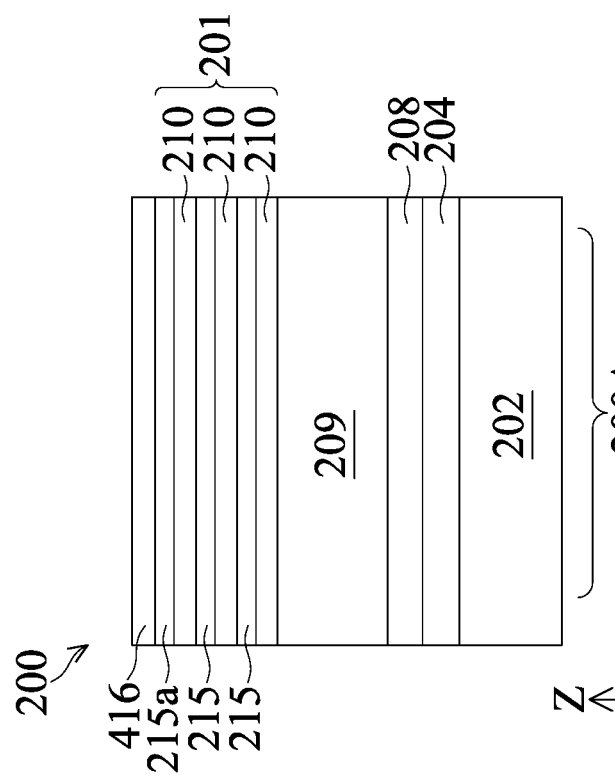
Figure 7D:
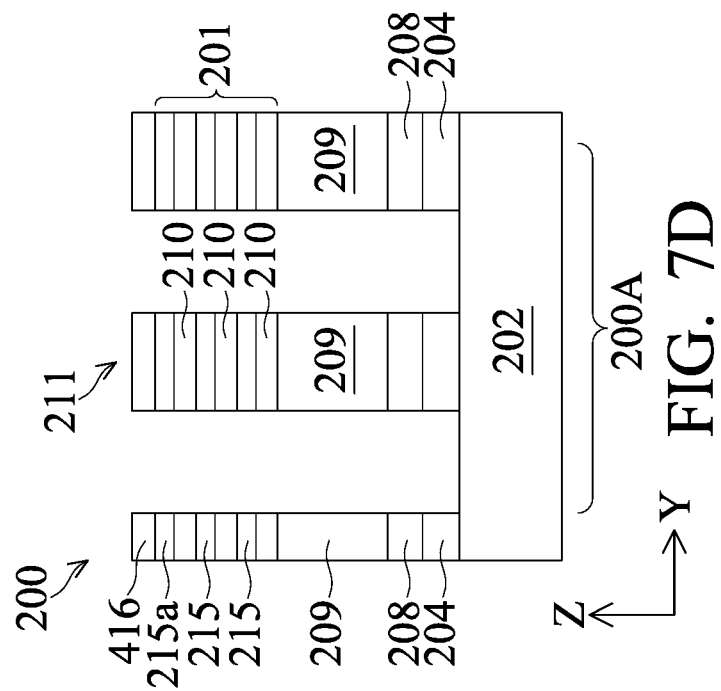
Figure 7E:
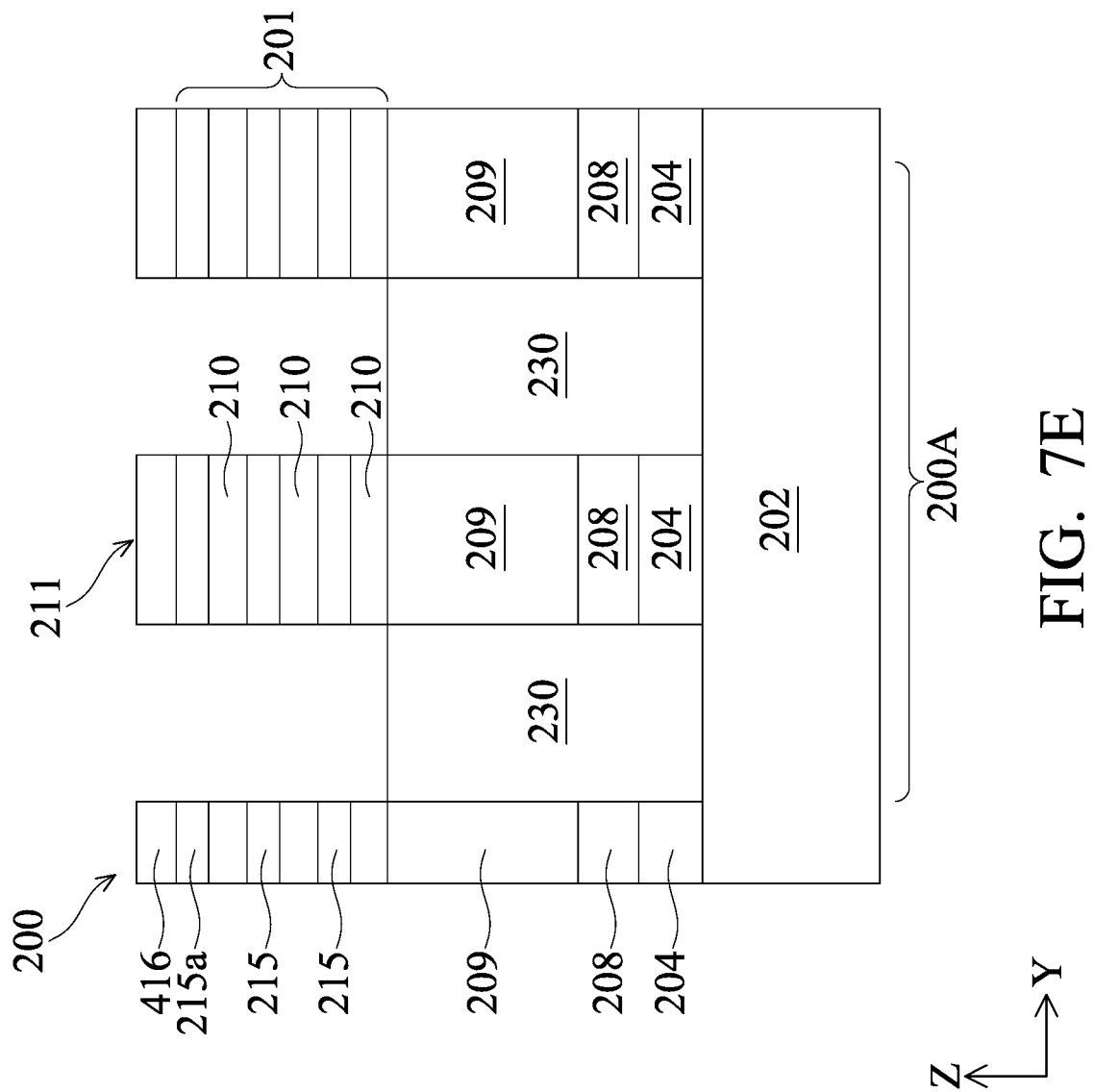

At operation 710, the method 700 (FIG. 6A) forms a semiconductor layer stack 201 having semiconductor layers 210 and semiconductor layers 215 over the semiconductor layer 209, such as shown in FIG. 7C. At operation 712, the method 700 (FIG. 6A) patterns the semiconductor layer stack 201 and the semiconductor layers 209, 208, and 204 into fins 211, such as shown in FIG. 7D. The operations 710 and 712 are the same as the operations 106 and 108 of the method 100, respectively. Essentially, the semiconductor layers 209, 208, and 204 in the method 700 correspond to the semiconductor layers 204 and 207 in the method 100. Then, at operation 714, the method 700 (FIG. 6A) performs the operation 110 through 124 of the method 100, including forming an isolation structure (or isolation features) 230, such as shown in FIG. 7E, forming the S/D features 260, the gate stacks 240, and various features at the frontside of the device 200. Further, the operation 714 attaches the frontside of the device 200 to a carrier 370 and makes the device 200 accessible from its backside (see FIGS. 7F-2 and 7F-3). In the present embodiment, the S/D features 260 include a dopant that has opposite conductivity type as the dopants in the heavily doped layer 208. In an embodiment, the semiconductor layer 208 includes silicon germanium and is doped with boron at a dopant concentration about 1E20 atoms/cm$^3$ to about 1E21 atoms/cm$^3$, and the S/D features 260 are doped with phosphorus at a dopant concentration about 1E20 atom/cm$^3$ to about 1E21 atom/cm$^3$. Further, the semiconductor layer 209 is either undoped or lightly doped with boron. In such embodiment, the S/D features 260 and the semiconductor layers 209 and 208 form an NP diode 300.

At operation 716, the method 700 (FIG. 6B) thins down the device 200 from its backside until the semiconductor layer 204 and the isolation features 230 are exposed from the backside of the device 200. The resultant structure is shown in FIGS. 7F-1, 7F-2, and 7F-3 according to an embodiment. FIG. 7F-1 is a top view of the device 200, in portion, and FIGS. 7F-2 and 7F-3 are cross-sectional views of the device 200, in portion, along the "Cross-section-H" line and the "Cross-section-V" line of the FIG. 7F-1, respectively. The operation 716 is the same as or similar to the operation 126.

At operation 718, the method 700 (FIG. 6B) etches the semiconductor layer 204 to form contact holes 278 from the backside of the device 200. In the present embodiment, the etching process in the operation 718 is controlled such that the contact holes 278 expose the heavily doped layer 208. The etching process may etch and remove part of the heavily doped layer 208, but at least a portion of the heavily doped layer 208 remains in the contact hole 278. The resultant structure is shown in FIGS. 7G-1, 7G-2, and 7G-3 according to an embodiment. FIG. 7G-1 is a top view of the device 200, in portion, and FIGS. 7G-2 and 7G-3 are cross-sectional views of the device 200, in portion, along the "Cross-section-H" line and the "Cross-section-V" line of the FIG. 7G-1, respectively. The operation 718 is the same as or similar to the operation 128.

At operation 720, the method 700 (FIG. 6B) forms a silicide feature 280 and a backside contact (or backside via) 282 in the contact hole 278, such as shown in FIGS. 7H-1, 7H-2, and 7H-3 according to an embodiment. FIG. 7H-1 is a top view of the device 200, in portion, and FIGS. 7H-2 and 7H-3 are cross-sectional views of the device 200, in portion, along the "Cross-section-H" line and the "Cross-section-V" line of the FIG. 7H-1, respectively. The operation 720 is the same as or similar to the operation 130. The silicide feature 280 is in direct contact with the heavily doped layer 208 to reduce the sheet resistance of the backside contacts 282.

At operation 722, the method 700 (FIG. 6B) forms one or more backside metal tracks 284. The resultant structure is shown in FIGS. 7I-1, 7I-2, and 7I-3 according to an embodiment. FIG. 7I-1 is a top view of the device 200, in portion, and FIGS. 7I-2 and 7I-3 are cross-sectional views of the device 200, in portion, along the "Cross-section-H" line and the "Cross-section-V" line of the FIG. 7I-1, respectively. Operation 722 may perform further fabrication. The operation 722 is the same as or similar to the operation 132.

Figure 8:
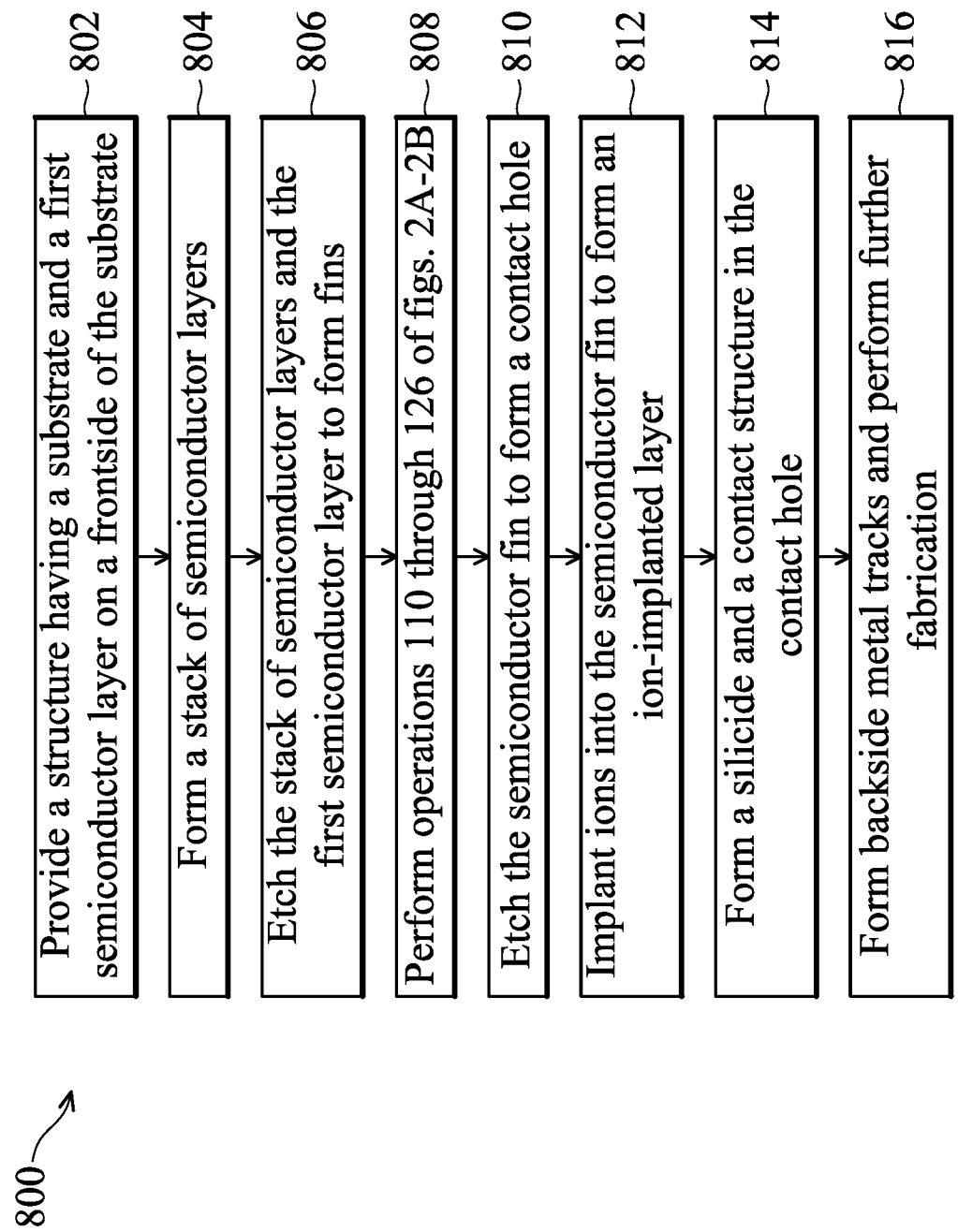
FIG. 8 shows a flow chart of a method of fabricating a semiconductor device, according to various aspects of the present disclosure.

FIG. 8 shows a flow chart of a method 800 for fabricating a semiconductor device having an embodiment of the diodes 300, according to various aspects of the present disclosure. Additional processing is contemplated by the present disclosure. Additional operations can be provided before, during, and after method 800, and some of the operations described can be moved, replaced, or eliminated for additional embodiments of method 800. Many aspects of the method 800 are the same as or similar to those of the method 100, with like reference numerals denoting like features. The methods 100 and 800 may be considered two variants of a common method. The method 800 is briefly described below.

At operation 802, the method 800 (FIG. 8) provides a semiconductor device 200 having a substrate 202 and a semiconductor layer 204 on a frontside of the substrate 202, such as shown in FIG. 9A. At operation 804, the method 800 forms a semiconductor layer stack 201 having semiconductor layers 210 and semiconductor layers 215, such as shown in FIG. 9B. At operation 806, the method 800 patterns the semiconductor layer stack 201 and the well 204 into fins 211, such as shown in FIG. 9C. The operations 802, 804, and 806 are the same as the operations 102, 106, and 108 of the method 100, respectively, with the exception that the ion-implanted layer 207 is not formed during the operations 802 through 806.

Figure 9D:
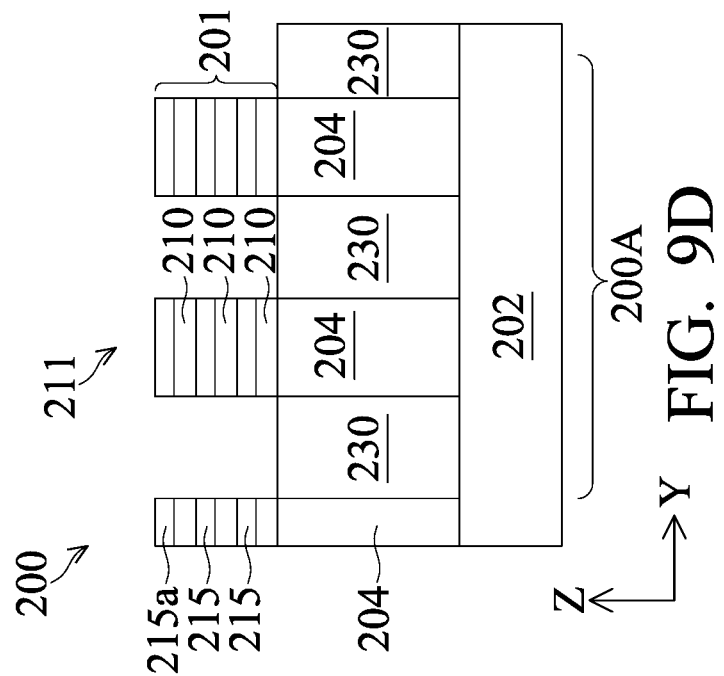
Figure 9C:
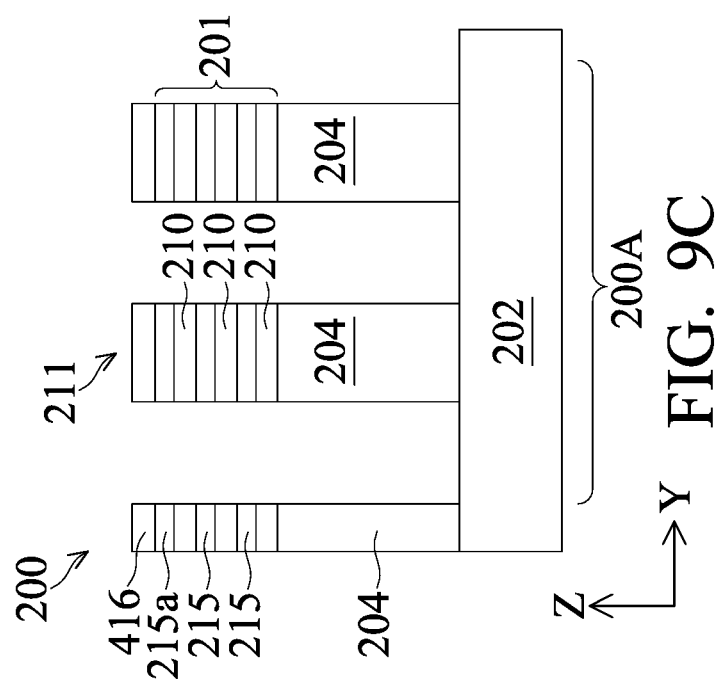

Then, at operation 808, the method 800 (FIG. 8) performs the operation 110 through 126 of the method 100, including forming an isolation structure (or isolation features) 230, such as shown in FIG. 9D, forming the S/D features 260, the gate stacks 240, and various features at the frontside of the device 200. Further, the operation 808 attaches the frontside of the device 200 to a carrier 370 and thins down the device 200 from its backside until the isolation structure 230 is exposed (see FIGS. 9E-2 and 9E-3).

Figures 1, 9E:
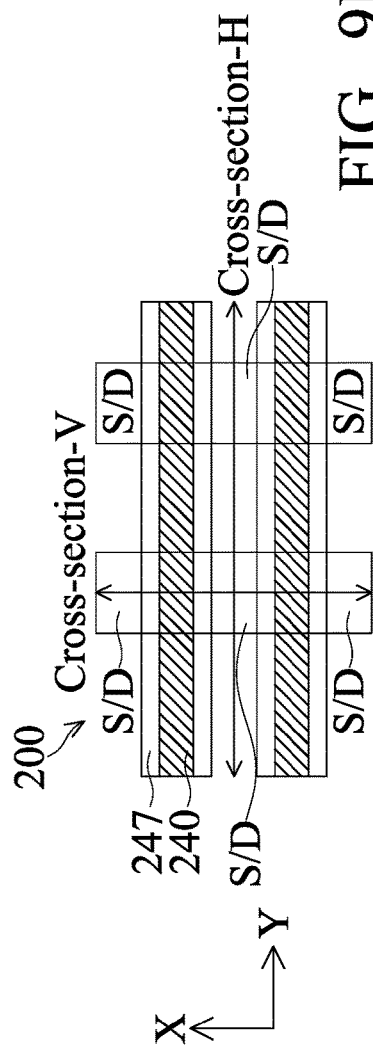
Figures 3, 9E:
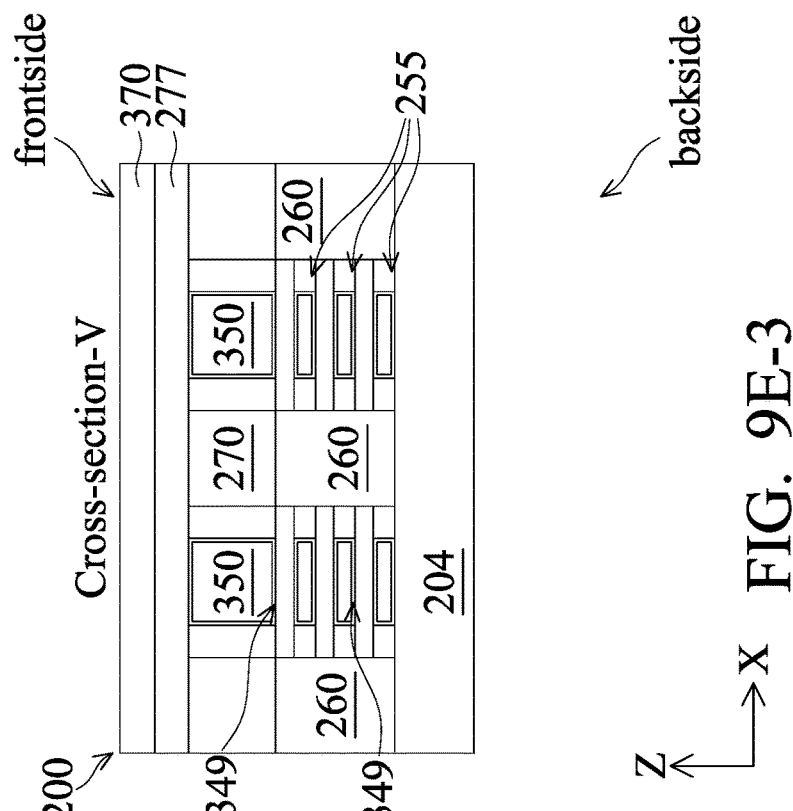
Figures 2, 9E:
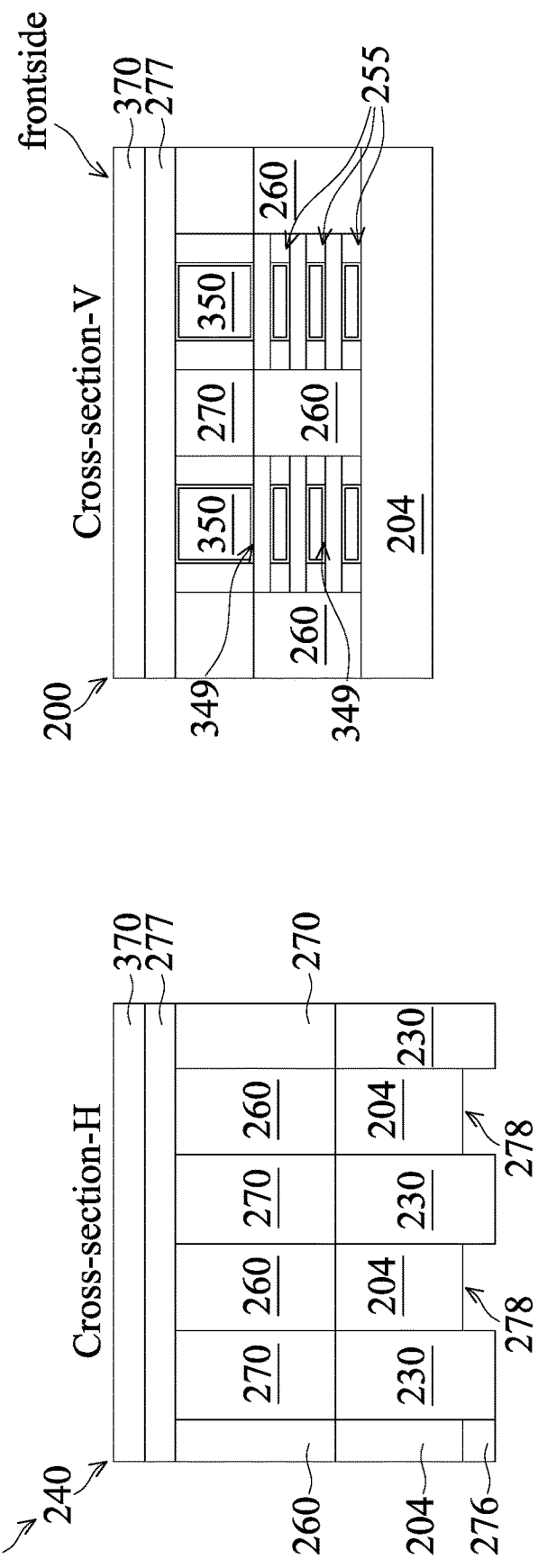

At operation 810, the method 800 (FIG. 8) etches the semiconductor layer 204 to form contact holes 278 from the backside of the device 200. The resultant structure is shown in FIGS. 9E-1, 9E-2, and 9E-3 according to an embodiment. FIG. 9E-1 is a top view of the device 200, in portion, and FIGS. 9E-2 and 9E-3 are cross-sectional views of the device 200, in portion, along the "Cross-section-H" line and the "Cross-section-V" line of the FIG. 9E-1, respectively. The operation 810 is the same as or similar to the operation 128.

At operation 812, the method 800 (FIG. 8) performs an ion implantation process 296 to the wells 204 through the contact holes 278, such as shown in FIGS. 9F-1, 9F-2, and 9F-3 according to an embodiment. FIG. 9F-1 is a top view of the device 200, in portion, and FIGS. 9F-2 and 9F-3 are cross-sectional views of the device 200, in portion, along the "Cross-section-H" line and the "Cross-section-V" line of the FIG. 9F-1, respectively. The ion implantation in the operation 812 is similar to the operation 104 with some differences noted below. First, the operation 812 forms a mask 290 having opening(s) 291 over the backside of the device 200. The opening(s) 291 exposes the device 200 in the region 200A and covers the rest of the device 200, such as those areas configured for GAA transistors. This aspect is the same as in the operation 104 but with the mask 290 formed at the backside of the device 200, unlike in the operation 104. Then, the operation 812 performs the ion implantation process 296 that implants ions into the semiconductor layer 204 at a predetermined depth, thereby forming the ion-implanted layer 207. The ion-implanted layer 207 is more heavily doped than the rest of the well 204. In the present embodiment, the ion-implanted layer 207 is at the bottom surface of the well 204 (i.e., where the contact holes 278 exposes). In some embodiments, the thickness of the ion-implanted layer 207 may be in a range of 10 nm to 30 nm.

In an embodiment, the ions implanted into the layer 207 are n-type ions (such as phosphorus, arsenic, other n-type dopant, or combinations thereof) for forming a PN diode 300 where S/D feature 260 (FIGS. 9F-2 and 9F-3) is doped with p-type ions. In another embodiment, the ions implanted into the layer 207 are p-type ions (such as boron, indium, other p-type dopant, or combinations thereof) for forming an NP diode 300 where S/D feature 260 (FIGS. 9F-2 and 9F-3) is doped with n-type ions. The implant energy is designed based on the ion species and the intended thickness of the ion-implanted layer 207, and the ion dose is designed to provide a heavily doped layer 207 for reducing sheet resistance when contacted by a backside via.

For example, the process 296 may implant phosphorus ions into the well 204 having silicon, with implant energy in a range of 1 keV to 5 keV and ion dose in a range of about 1E15 ions/cm$^2$ to about 8E15 ions/cm$^2$. This results in a thickness of the layer 207 in a range of about 10 nm to about 30 nm at the bottom surface of the well 204, and a dopant concentration in the layer 207 in a range of about 1E19 atoms/cm$^3$ to about 1E20 atoms/cm$^3$. For example, the process 292 may implant boron ions into the well 204 having silicon, with implant energy in a range of 1 keV to 3 keV and ion dose in a range of about 1E15 ions/cm$^2$ to about 8E15 ions/cm$^2$. This results in a thickness of the layer 207 in a range of about 10 nm to about 30 nm at the bottom surface of the well 204, and a dopant concentration in the layer 207 in a range of about 1E19 atoms/cm$^3$ to about 1E20 atoms/cm$^3$. It is noted that to achieve the same thickness in the layer 207 as in the operation 104, the operation 812 may apply a lower doping energy because the bottom surface of the well 204 is exposed in the contact holes 278. After the ion implantation process 296 finishes, the operation 812 removes the mask 290, for example, using resist stripping and/or other appropriate processes.

Figures 1, 2, 3, 9G:
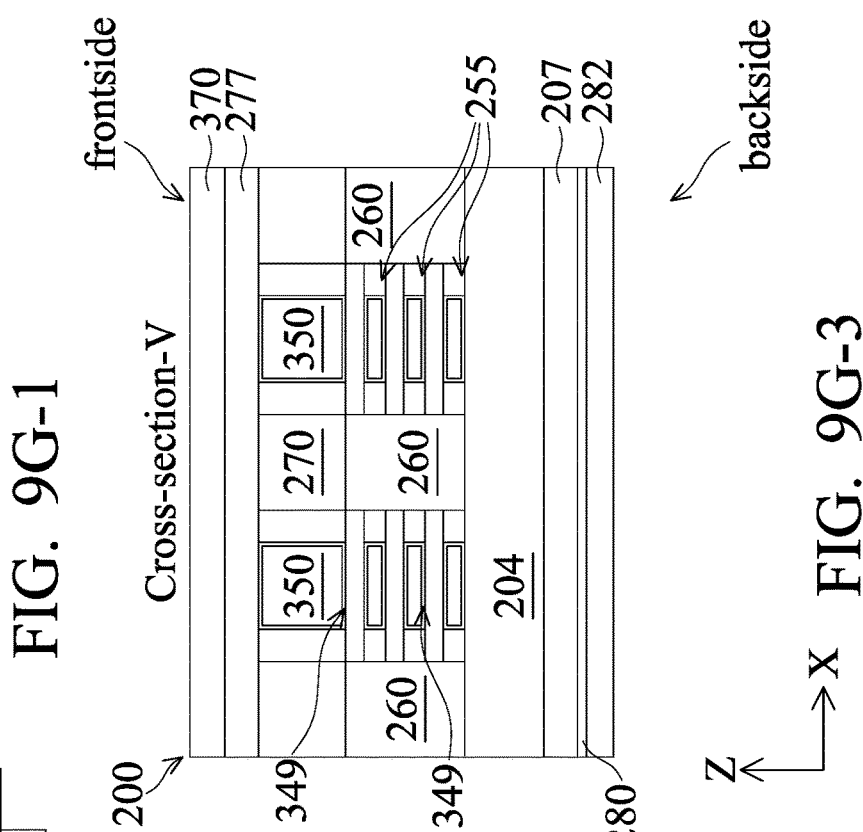

At operation 814, the method 800 (FIG. 8) forms a silicide feature 280 and a backside contact (or backside via) 282 in the contact hole 278, such as shown in FIGS. 9G-1, 9G-2, and 9G-3 according to an embodiment. FIG. 9G-1 is a top view of the device 200, in portion, and FIGS. 9G-2 and 9G-3 are cross-sectional views of the device 200, in portion, along the "Cross-section-H" line and the "Cross-section-V" line of the FIG. 9G-1, respectively. The operation 814 is the same as or similar to the operation 130. The silicide feature 280 is in direct contact with the ion-implanted layer 207 to reduce the sheet resistance of the backside contacts 282.

At operation 816, the method 800 (FIG. 8) forms one or more backside metal tracks 284. The resultant structure is shown in FIGS. 9H-1, 9H-2, and 9H-3 according to an embodiment. FIG. 9H-1 is a top view of the device 200, in portion, and FIGS. 9H-2 and 9H-3 are cross-sectional views of the device 200, in portion, along the "Cross-section-H" line and the "Cross-section-V" line of the FIG. 9H-1, respectively. Operation 816 may perform further fabrication. The operation 816 is the same as or similar to the operation 132.

Although not intended to be limiting, embodiments of the present disclosure provide one or more of the following advantages. For example, embodiments of the present disclosure form two-port diodes having a frontside port and a backside port. The frontside port has a heavily doped S/D feature for reducing sheet resistance between the S/D feature and a frontside contact. The backside port has a heavily doped semiconductor layer for reducing sheet resistance between the semiconductor layer and a backside contact. The heavily doped semiconductor layer may be formed using ion implantation or using epitaxy with in-situ or ex-situ doping. The process of forming the disclosed diodes is compatible with processes for GAA transistor or other type of transistors that utilize both frontside and backside metal tracks. Embodiments of the present disclosure can be readily integrated into existing semiconductor manufacturing processes.

In one example aspect, the present disclosure is directed to a method. The method includes providing a first semiconductor layer at a frontside of a structure; implanting first dopants of a first conductivity-type into the first semiconductor layer, resulting in a doped layer in the first semiconductor layer; forming a stack of semiconductor layers over the first semiconductor layer; patterning the stack of semiconductor layers and the first semiconductor layer into fins; forming an isolation structure adjacent to a lower portion of the fins; etching the stack of semiconductor layers to form a source/drain trench over the first semiconductor layer; forming a source/drain feature in the source/drain trench, wherein the source/drain feature is doped with second dopants of a second conductivity-type opposite to the first conductivity-type; forming a contact hole at a backside of the structure, wherein the contact hole exposes the doped layer in the first semiconductor layer; and forming a first contact structure in the contact hole.

In an embodiment, the method further includes forming a metal track below the first contact structure and electrically connected to the first contact structure. In another embodiment, the method further includes forming a second contact structure over the source/drain feature and electrically connected to the source/drain feature.

In some embodiments of the method, the implanting of the first dopants is performed after the forming of the isolation structure. In a further embodiment, the first dopants include phosphorus and are doped with a doping energy in a range of 60 keV to 65 keV and a dosage in a range of 1E15 ions/cm$^2$ to 8E15 ions/cm$^2$. In another further embodiment, the first dopants include boron and are doped with a doping energy in a range of 20 keV to 25 keV and a dosage in a range of 1E15 ions/cm$^2$ to 8E15 ions/cm$^2$.

In some embodiments of the method, the implanting of the first dopants is performed before the forming of the stack of semiconductor layers. In a further embodiment, the first dopants include phosphorus and are doped with a doping energy in a range of 35 keV to 45 keV and a dosage in a range of 5E14 ions/cm$^2$ to 5E15 ions/cm$^2$. In another further embodiment, the first dopants include boron and are doped with a doping energy in a range of 10 keV to 15 keV and a dosage in a range of 5E14 ions/cm$^2$ to 5E15 ions/cm$^2$.

In some embodiments of the method, the doped layer in the first semiconductor layer includes the first dopants at a dopant concentration in a range of 1E19 atoms/cm$^3$ to 1E20 atoms/cm$^3$. In another embodiment, the method further includes, before the implanting of the first dopants, forming a mask over the first semiconductor layer, wherein the mask exposes regions configured to form diodes and covers regions configured to form transistors, wherein the first dopants are implanted through the mask.

In another example aspect, the present disclosure is directed to a method. The method includes providing a first semiconductor layer at a frontside of a structure; forming a second semiconductor layer over the first semiconductor layer, wherein the second semiconductor layer is doped with first dopants of a first conductivity-type; forming a third semiconductor layer over the second semiconductor layer, wherein the second and the third semiconductor layers include different materials; forming a stack of semiconductor layers over the third semiconductor layer; patterning the stack of semiconductor layers, the third semiconductor layer, and the second semiconductor layer into fins; forming an isolation structure adjacent to a lower portion of the fins; etching the stack of semiconductor layers to form a source/drain trench over the third semiconductor layer; forming a source/drain feature in the source/drain trench, wherein the source/drain feature is doped with second dopants of a second conductivity-type opposite to the first conductivity-type; forming a contact hole at a backside of the structure, wherein the contact hole exposes the second semiconductor layer; and forming a first contact structure in the contact hole.

In an embodiment of the method, the second semiconductor layer includes silicon germanium and the third semiconductor layer includes silicon. In a further embodiment, the second semiconductor layer is doped with boron at a dopant concentration in a range of 1E20 atoms/cm$^3$ to 1E21 atoms/cm$^3$. In another further embodiment, the second semiconductor layer includes germanium at 15 atomic percent to 35 atomic percent.

In an embodiment, the method further includes implanting dopants into the third semiconductor layer before forming the stack of semiconductor layers.

In yet another example aspect, the present disclosure is directed to a method. The method includes providing a structure having a first semiconductor layer at a frontside of the structure, a source/drain feature over the first semiconductor layer, and an isolation structure adjacent to a lower portion of the first semiconductor layer; forming a contact hole at a backside of the structure, wherein the contact hole exposes a portion of the first semiconductor layer; implanting first dopants of a first conductivity-type into the portion of the first semiconductor layer, wherein the source/drain feature includes second dopants of a second conductivity-type opposite to the first conductivity-type; and forming a first contact structure in the contact hole.

In an embodiment, the method further includes, before the implanting of the first dopants, forming a mask at the backside of the structure, wherein the mask exposes regions configured to form diodes and covers regions configured to form transistors, wherein the first dopants are implanted through the mask.

In an embodiment of the method, the first dopants include phosphorus and are doped with a doping energy in a range of 1 keV to 5 keV and a dosage in a range of 1E15 ions/cm$^2$ to 8E15 ions/cm$^2$. In another embodiment, the first dopants include boron and are doped with a doping energy in a range of 1 keV to 3 keV and a dosage in a range of 1E15 ions/cm$^2$ to 8E15 ions/cm$^2$.

In yet another example aspect, the present disclosure is directed to a semiconductor structure. The semiconductor structure includes a first semiconductor layer having an upper portion over a lower portion, wherein the lower portion is more heavily doped with first dopants than the upper portion, the first dopants being of a first conductivity-type; a source/drain feature over the upper portion of the first semiconductor layer, wherein the source/drain feature includes second dopants of a second conductivity-type opposite to the first conductivity-type; and a first contact structure under the lower portion of the first semiconductor layer and electrically connected to the lower portion of the first semiconductor layer.

In an embodiment, the semiconductor structure further includes a silicide feature between the lower portion of the first semiconductor layer and the first contact structure. In another embodiment, the semiconductor structure further includes a metal layer under the first contact structure and electrically connected to the first contact structure. In yet another embodiment, the semiconductor structure further includes a second contact structure over the source/drain feature and electrically connected to the source/drain feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a first semiconductor layer at a frontside of a structure;
   implanting first dopants of a first conductivity-type into the first semiconductor layer, resulting in a doped layer in the first semiconductor layer;
   forming a stack of semiconductor layers over the first semiconductor layer;
   patterning the stack of semiconductor layers and the first semiconductor layer into fins;
   forming an isolation structure adjacent to a lower portion of the fins;
   etching the stack of semiconductor layers to form a source/drain trench over the first semiconductor layer;
   forming a source/drain feature in the source/drain trench, wherein the source/drain feature is doped with second dopants of a second conductivity-type opposite to the first conductivity-type;
   forming a contact hole at a backside of the structure, wherein the contact hole exposes the doped layer in the first semiconductor layer; and
   forming a first contact structure in the contact hole.

2. The method of claim 1, further comprising:
   forming a metal track below the first contact structure and electrically connected to the first contact structure.

3. The method of claim 1, further comprising:
   forming a second contact structure over the source/drain feature and electrically connected to the source/drain feature.

4. The method of claim 1, wherein the implanting of the first dopants is performed before the forming of the stack of semiconductor layers.

5. The method of claim 4, wherein the first dopants include phosphorus and are doped with a doping energy in a range of 35 keV to 45 keV and a dosage in a range of 5E14 ions/cm$^2$ to 5E15 ions/cm$^2$.

6. The method of claim 4, wherein the first dopants include boron and are doped with a doping energy in a range of 10 keV to 15 keV and a dosage in a range of 5E14 ions/cm$^2$ to 5E15 ions/cm$^2$.

7. The method of claim 1, wherein the doped layer in the first semiconductor layer includes the first dopants at a dopant concentration in a range of 1E19 atoms/cm$^3$ to 1E20 atoms/cm$^3$.

8. The method of claim 1, further comprising:
   before the implanting of the first dopants, forming a mask over the first semiconductor layer, wherein the mask exposes regions configured to form diodes and covers regions configured to form transistors, wherein the first dopants are implanted through the mask.

9. The method of claim 1, wherein the first contact structure is electrically coupled to the doped layer and is directly under the doped layer and the source/drain feature.

10. The method of claim 1, before the forming of the first contact structure, further comprising:
    forming a silicide layer in direct contact with the doped layer, wherein the first contact structure is formed in direct contact with the silicide layer.

11. The method of claim 1, wherein, after the forming of the contact hole, the first semiconductor layer has a first thickness, the doped layer is at a first depth below a top surface of the first semiconductor layer, and the first depth is in a range from (the first thickness−15 nm) to (the first thickness+15 nm).

12. A method, comprising:
    implanting first dopants of a first conductivity-type into a first semiconductor layer at a frontside of a structure, resulting in a doped layer in the first semiconductor layer;
    after the implanting of the first dopants, forming one or more second semiconductor layers over the first semiconductor layer;
    after forming the one or more second semiconductor layers over the first semiconductor layer, etching the one or more second semiconductor layers and the first semiconductor layer, thereby forming first trenches exposing the doped layer;
    forming an isolation structure in the first trenches;
    forming a contact hole at a backside of the structure by selectively etching the first semiconductor layer, thereby exposing the doped layer from the backside of the structure; and
    forming a first contact structure in the contact hole and electrically coupled to the doped layer.

13. The method of claim 12, after forming the isolation structure and before forming the contact hole, further comprising:
    etching the one or more second semiconductor layers to form a source/drain trench; and
    forming a source/drain feature in the source/drain trench, wherein the source/drain trench is directly above the contact hole.

14. The method of claim 13, wherein the source/drain feature is doped with second dopants of a second conductivity-type opposite to the first conductivity-type.

15. The method of claim 12, after forming the isolation structure and before forming the contact hole, further comprising:
    thinning down the structure from the backside of the structure until the isolation structure is exposed.

16. The method of claim 12, wherein the doped layer in the first semiconductor layer includes the first dopants at a dopant concentration in a range of 1E19 atoms/cm$^3$ to 1E20 atoms/cm$^3$.

17. A method, comprising:
    implanting first dopants of a first conductivity-type into a first semiconductor layer at a frontside of a structure, resulting in a doped layer in the first semiconductor layer;
    forming one or more second semiconductor layers over the first semiconductor layer;
    etching the one or more second semiconductor layers and the first semiconductor layer, thereby forming first trenches exposing the doped layer;
    forming an isolation structure in the first trenches;
    etching at least the one or more second semiconductor layers to form a source/drain trench;
    forming a source/drain feature in the source/drain trench, wherein the source/drain feature is doped with second dopants of a second conductivity-type opposite to the first conductivity-type;
    forming a contact hole at a backside of the structure directly under the source/drain feature, thereby exposing the doped layer from the backside of the structure; and
    forming a first contact structure in the contact hole and electrically coupled to the doped layer.

18. The method of claim 17, further comprising:
    forming a second contact structure directly over the source/drain feature and electrically connected to the source/drain feature.

19. The method of claim 17, wherein the first dopants include phosphorus or boron.

20. The method of claim 17, wherein after the forming of the contact hole, the first semiconductor layer has a first thickness, the doped layer is at a first depth below a top surface of the first semiconductor layer, and the first depth is within +/−15 nm of the first thickness.

\* \* \* \* \*